United States Patent
Lee et al.

(10) Patent No.: US 6,480,589 B1
(45) Date of Patent: Nov. 12, 2002

(54) CPE ALERT SIGNAL DETECTOR AND CALLER IDENTIFICATION DETECTOR USING PEAK DETECTION

(75) Inventors: Jeung-in Lee, Suwon; Young-ho Shin, Anyang; Il-joong Kim, Seoul; Chung-gil Yang, Seongnam; Yank-gyun Kim, Seoul, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/353,102

(22) Filed: Jul. 14, 1999

(30) Foreign Application Priority Data

Jul. 14, 1998 (KR) .............................. 98-28419
Nov. 17, 1998 (KR) .............................. 98-49217
Jan. 21, 1999 (KR) .............................. 99-1766
Mar. 4, 1999 (KR) .............................. 99-7119
Jun. 22, 1999 (KR) .............................. 99-23429

(51) Int. Cl.$^7$ .......................... H04M 1/56; H04M 15/06
(52) U.S. Cl. .......................... 379/142.04; 379/373.01; 379/386; 379/88.19; 379/88.21
(58) Field of Search .............................. 379/88.19, 88.2, 379/88.21, 93.23, 142.01, 142.04, 142.07, 142.08, 215.01, 386

(56) References Cited

U.S. PATENT DOCUMENTS

| | | | |
|---|---|---|---|
| 5,519,774 A | * | 5/1996 | Battista et al. |
| 5,649,002 A | | 7/1997 | Brady et al. |
| 5,781,621 A | | 7/1998 | Lim et al. |
| 5,783,967 A | | 7/1998 | Takaya |
| 5,836,009 A | | 11/1998 | Diamond et al. |
| 5,862,210 A | * | 1/1999 | Irie et al. |
| 5,862,212 A | * | 1/1999 | Mathews |
| 5,910,976 A | * | 6/1999 | Berthoud et al. |
| 5,970,128 A | | 10/1999 | Kim ............................ 379/142 |
| 5,987,075 A | * | 11/1999 | Abe et al. |
| 6,101,252 A | * | 8/2000 | Carddillo et al. |
| 6,122,353 A | * | 9/2000 | Brady et al. |
| 6,195,421 B1 | * | 2/2002 | Chen |

FOREIGN PATENT DOCUMENTS

KR 96-067476 12/1996

* cited by examiner

Primary Examiner—Duc Nguyen
(74) Attorney, Agent, or Firm—Skjerven Morrill LLP

(57) ABSTRACT

An amplitude modulation detector use peak detection. A CAS (Customer premise equipment Alert Signal) detection apparatus and a caller information detection apparatus use the peak detection and methods for CAS and the caller information detection. The CAS detection apparatus includes a mixing unit, an amplitude modulation detection unit, and a frequency discriminating unit. The mixing unit mixes two or more frequency components of the input signal to generate an amplitude modulated signal including a carrier and an envelope. The amplitude modulation detection unit measures the envelope. Also, the frequency discriminating unit detects whether the frequency of the envelope is in a predetermined range to discriminate whether the CAS is present. Thus, the existence of the CAS can be detected through a single path by mixing a dual tone CAS signal, and can be accurately detected by discriminating the frequency the envelope. Also, the amplitude detection unit capable of detecting the amplitude modulation signal of the CAS can be digitally implemented, so that the CAS detection apparatus can be implemented in a single chip without an external part, and the amplitude modulation detection unit can be applied to all the systems utilizing the amplitude modulation as well as the CAS detection apparatus.

44 Claims, 33 Drawing Sheets

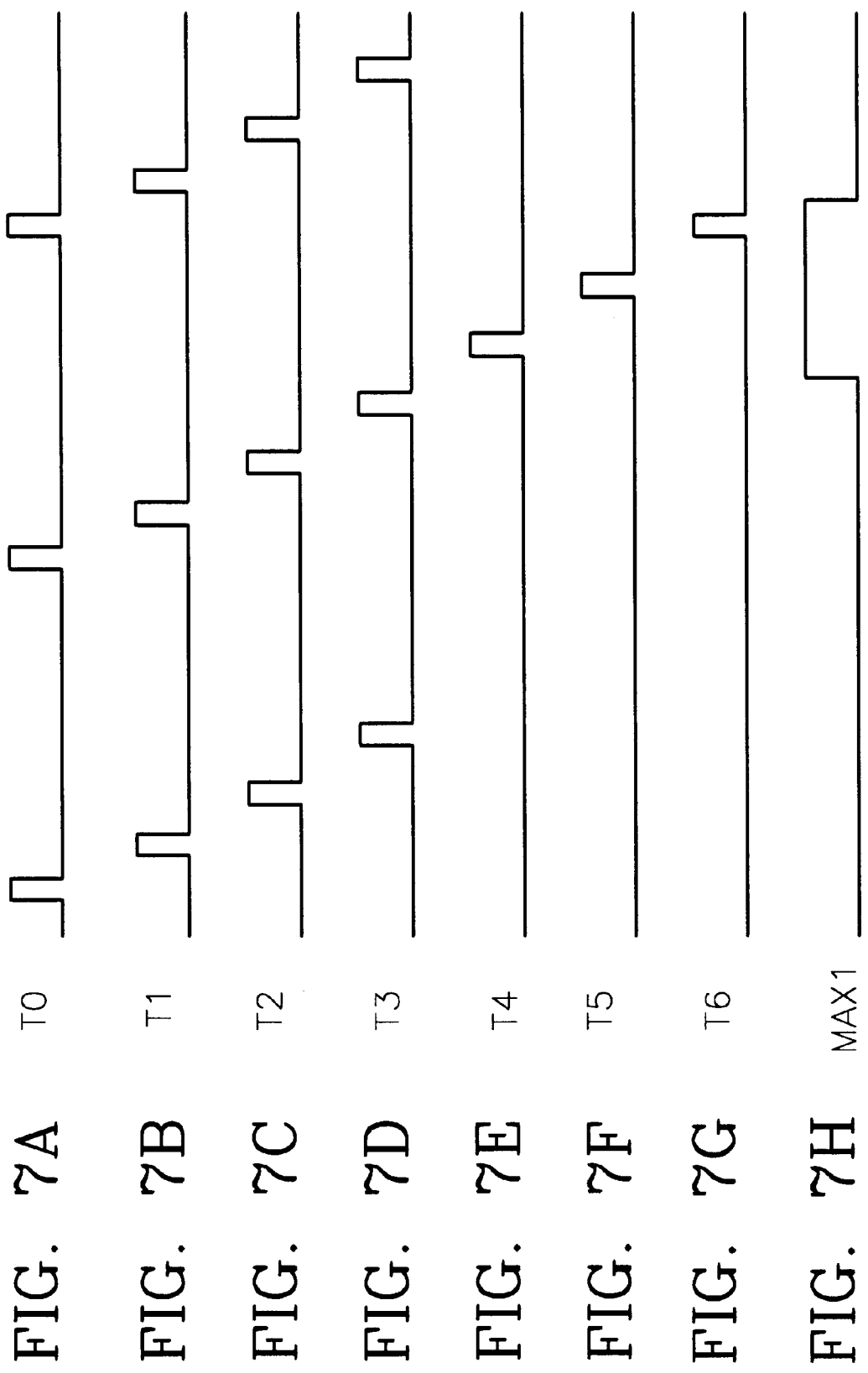

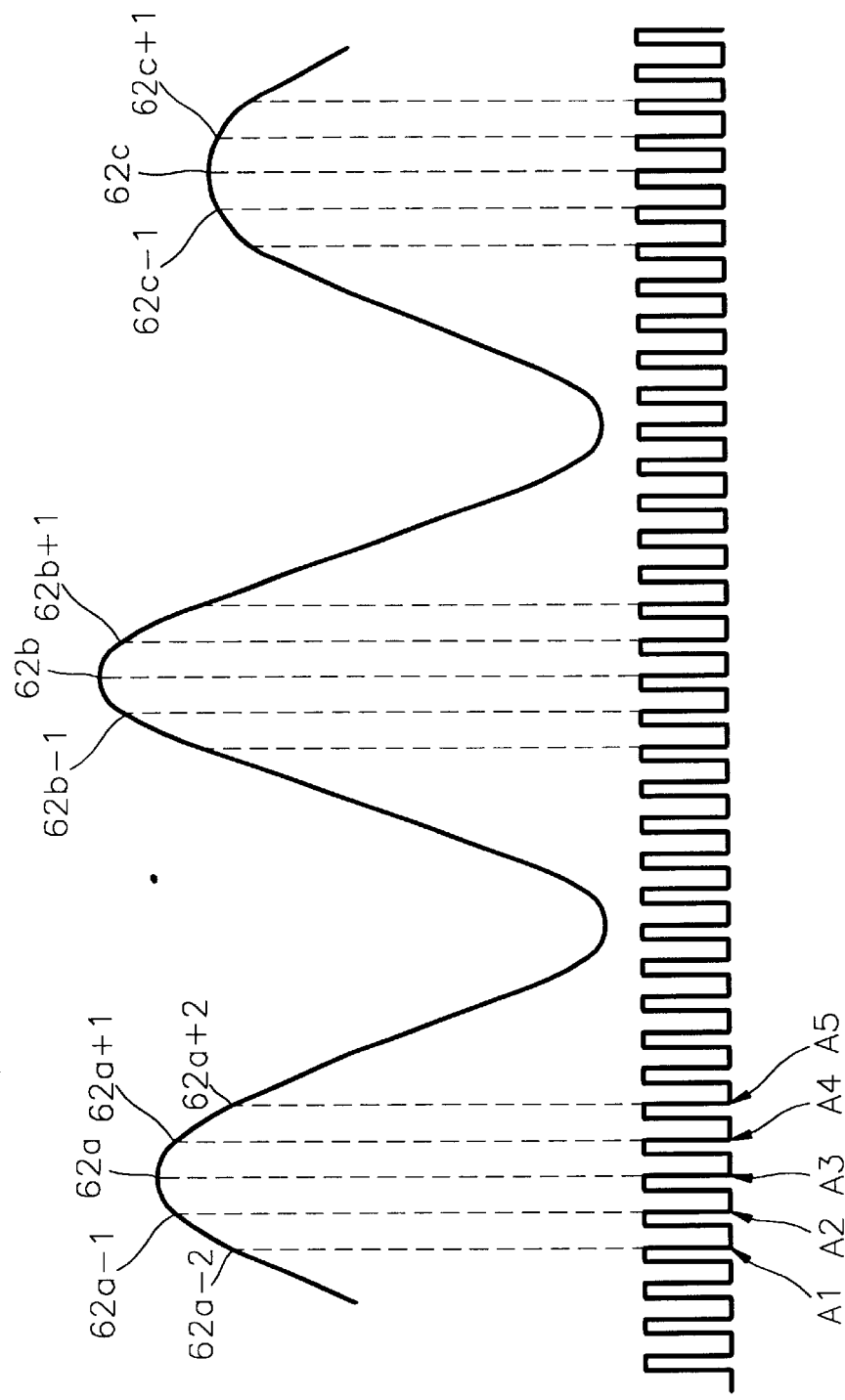

CPE ALERT SIGNAL DETECTOR AND CALLER IDENTIFICATION DETECTOR USING PEAK DETECTION

BACKGROUND OF THE INVENTION

1. Field of the Invention

The present invention relates to an amplitude modulation detector, an apparatus and method for detecting a CAS (Customer premise equipment Alert Signal), and an apparatus and method for detecting caller identification.

2. Description of the Related Art

In general, a caller ID system called "caller identification service" is a system for transferring information to customers through telephone lines. The information may include caller information such as a caller's telephone number or a caller's name, or general information regarding topics such as the weather or traffic. However, the use of telephone lines for voice communications may limit the transfer of an information signal. For example, in transferring a caller ID through a telephone line, identifying a CAS lying in the same frequency band as a voice signal can be difficult. Thus, telephone operation includes a general talk mode and an information reception mode, and a signal applied only in the information reception mode can be more easily identified as a CAS.

For the caller identification service, a CAS is used to switch between the general talk mode and the information reception mode. The CAS is a dual tone signal in which two signals with different frequency values, e.g., 2.13 KHz and 2.75 KHz, are mixed according to the system standard. When a transmitting site, i.e., a central office, intends to transmit information in the general talk mode, the transmitting site sends a CAS through a telephone line to a receiving site, before transmission of the information. Here, a CID/CIDCW (Calling Identity Delivery/Calling Identity Delivery on Call Waiting) receiver at the receiving site transmits to the central office a CAS acknowledgment signal that indicates detection of the CAS. The CID/CIDCW receiver can display the caller ID on customer premise equipment (CPE) in a network. The CID/CIDCW receiver is in the CPE. Here, the receiving site transmits the CAS acknowledge signal to the central office, when changing the general talk mode into the information receiving mode.

If a receiver is in an OFF-HOOK state, i.e., a user is calling another person, a voice signal of the user may be mixed with the CAS. Accordingly, the receiving site must detect the CAS from a mixed signal including the CAS and the voice signal.

FIG. 1 is a block diagram of a conventional CAS detection apparatus. The conventional CAS detection apparatus includes a first band-pass filter (BPF) 10, a second BPF 12, a first frequency discriminator 14, a second frequency discriminator 16, and a CAS discriminator 18. BPF 10 filters an input signal IN and passes signal components in a first frequency band, i.e., the 2.13-KHz band. BPF 10 passes signal components in a second frequency band, i.e., the 2.75-KHz band, from the input signal IN.

Frequency discriminators 14 and 16 receive the signals from BPFs 10 and 12, respectively, and determine whether the signals have respective frequencies 2.13 KHz and 2.75 KHz, which correspond to a CAS. If a CAS is in the input signal, the filtered signals from BPFs 10 and 12 have significant amplitudes for the frequency components having frequencies 2.13 KHz and 2.75 KHz. However, if the CAS is not present in the input signal and a voice signal is presents, the filtered signals typically have frequencies other than 2.13 KHz and 2.75 KHz or small amplitudes at frequencies 2.13 KHz and 2.75 KHz. CAS discriminator 18 receives the output signals of frequency discriminators 14 and 16, and generates a CAS detection signal CAS_DET if signals with the frequencies 2.13 KHz and 2.75 KHz are present.

The conventional CAS detection apparatus of FIG. 1 utilizes multiple paths to detect multiple tones and identify the presence of the CAS. The multiple paths increase circuit complexity. Also, if the voice portion of the input signal includes frequency components of frequencies 2.13 KHz and 2.75 KHz, the CAS detection apparatus may generate a false CAS detection.

FIG. 2 is a block diagram of another conventional CAS detection apparatus. The conventional CAS detection apparatus of FIG. 2 includes a first signal detector 100, a second signal detector 150, and a timing selector 180.

The first signal detector 100 detects a first frequency component of a CAS in input signal IN. The second signal detector 150 detects a second frequency component of the CAS. Here, detectors 100 and 150 indicate the presence of the first and second frequency components to timing selector 180. If the first and second frequency components remain for a predetermined time, timing selector 180 determines that the input signal contains a CAS and outputs a CAS detection signal CAS_DET.

In signal detector 100, a guard band filter 102 passes the first frequency component filtered from the input signal. A first AC-DC converter 112 converts the first frequency component to a DC signal having a voltage proportional to the amplitude of the first frequency component. A first threshold detector 114 detects whether the DC signal from AC-DC converter 112 is at a voltage higher than a first threshold value. To distinguish noise in the input signal IN, AC-DC converter 112 and threshold detector 114 preferably operate first to provide a control signal to a limiter 104 or a post limiter filter 106. If the voltage of the DC signal is above the first threshold value, limiter 104 amplifies the frequency component signal from the guard band filter 102 to a predetermined level. Post limiter filter 106 filters the amplified signal before another AC-DC converter 108 converts the amplified frequency component signal to another DC signal. A threshold detector 110 compares the voltage of the DC signal from converter 108 to a second threshold value. If the DC signal has a voltage higher than the second threshold value, the second threshold detector 110 sends to the timing selector 180, a signal indicating the presence of the first frequency component in input signal IN. A process detector 150 uses for detecting a second frequency signal in input signal IN is similar to the above. Timing selector 180 detects whether the detected first and second frequency signals remain for a predetermined time and asserts a CAS detection signal CAS_DET if they do.

One drawback of the conventional CAS detection apparatus of FIG. 2 is the use the analog circuitry to detect the frequencies and the levels of the input signal. The required analog circuitry is difficult to form in an integrate circuit. For example, the CAS detection apparatus of FIG. 2 requires external components such as a capacitor, for detecting the frequency and the level of the CAS. The capacitor must be external to an integrated circuit because the required capacitance for the CAS detection apparatus is large. Thus, the CAS detection apparatus is difficult to implement in a single chip.

FIG. 3 is a block diagram of still another conventional CAS detection apparatus. The conventional CAS detection apparatus of FIG. 3 includes a high tone filter 210, a low tone filter 220, first and second level comparators 215 and 225, a tone detector 240, and a guard time detector 280.

High tone filter 210 passes only the high frequency band of the CAS from input signal IN. Then, level comparator 215 compares the filtered signal with a first internal reference and applies a signal indicating the result of the comparison to the tone detector 240. Similarly, low tone filter 220 passes only the low frequency band of the CAS from input signal IN. Level comparator 225 compares the filtered signal with a second internal reference and applies a signal indicating the result of that comparison to tone detector 240. Tone detector 240 receives the result signals from level comparators 215 and 225 and determines whether each level is higher than a predetermined reference level. If the output signals of level comparators 215 and 225 are higher than the predetermined reference level, tone detector 240 determines that input signal IN contains a CAS. As described above, high tone filter 210 and low tone filter 220 detect the frequencies of the CAS, and level comparators 215 and 225 detect the levels of the CAS. If input signal IN is identified as containing a CAS, guard time detector 180 detects whether the CAS maintains for the required levels for a predetermined time and generates CAS detection signal CAS_DET if the CAS remains for the predetermined time.

In guard time detector 280, a NAND gate 282 performs a NAND operation on a tone detection signal Est output from tone detector 240 and the output signal of a comparator 285. NAND gate 282 applies a result signal to the gate of a PMOS transistor MP1. Also, a NOR gate 287 performs a NOR operation on tone detection signal Est from tone detector 240 and the output signal of comparator 285, and applies a result signal to the gate of an NMOS transistor MN1. Here, comparator 285 compares a threshold voltage $V_{TRH}$ to the drain voltage of PMOS transistor MP1 and NMOS transistor N1. Comparator 285 outputs signal CAS_DET at a high level, indicating detection of a CAS, when the drain voltage is higher than the threshold voltage $V_{TRH}$. For detecting the sustain time of the CAS, an external capacitor C1 and an external resistor R1 have a time constant that controls charging of the drain voltage so that the drain voltage only reaches the threshold voltage $V_{TRH}$ if signal Est remains asserted for the required time for the CAS. Accordingly, the CAS detection apparatus of FIG. 3 also requires an external component such as a capacitor that is difficult to implement in a single-chip CAS detection apparatus.

Similarly, a CID/CIDCW receiver of a receiving site detects a CAS and transmits a CAS acknowledge signal to acknowledge the CAS. The central office that receives the CAS acknowledge signal from the receiving site transmits information about the caller to the CID/CIDCW receiver at the receiving site. After the reception of information is completed, the receiving site changes its mode to the general talk mode. Here, the information about the caller transmitted from the central office is frequency shift keyed (FSK) data. The CID/CIDCW receivers of the CPE demodulates an FSK signal to detect the original information about the caller and displays the detected information in the CPE. Thus, the conventional apparatus for detecting information about a caller requires circuitry to detect a CAS and external components that are difficult to implement in a single-chip integrated circuit.

SUMMARY OF THE INVENTION

In accordance with an aspect of the invention, a CAS (Customer premise equipment Alert Signal) detection apparatus minimizes the number of paths required to detect tones of a CAS and detects the CAS without false detection due to a voice signal. Further, the CAS detection apparatus can be implemented in a single chip without needing external components.

A further aspect of the invention provides a novel amplitude modulation detector used in the CAS detection apparatus and in an apparatus detecting caller information.

An embodiment of the present invention further provides an apparatus for detecting information about a caller where use of a single chip without an external component reduces the size of the apparatus.

In accordance with one embodiment of the invention, a CAS detector includes a mixing unit, an amplitude modulation detection unit, and a frequency discriminating unit. The mixing unit mixes two or more frequency components filtered from the input signal to generate an amplitude modulated signal having a carrier and an envelope. The amplitude modulation detection unit measures the amplitude modulation, and the frequency discriminating unit detects whether the frequency of the envelope is in a predetermined range indicating presence of a CAS.

In accordance with another embodiment of the invention, a CAS detection apparatus for detecting a CAS from an input signal, includes a mixing unit, an amplitude modulation detection unit, a signal detection unit, and a CAS discrimination unit. The mixing unit mixes two or more frequency components filtered the input signal to generate an amplitude modulated signal having a carrier and an envelope. The amplitude modulation detection unit measures the amplitude modulation. The signal detection unit determines whether the frequency of the detected envelope is in a predetermined range indicating presence of the CAS and compares a voltage level of the envelope to a reference voltage to determine whether the level is characteristic of the CAS. The CAS discrimination unit receives the results from the signal detection unit and determines whether or not the CAS is present.

In accordance with still another embodiment of the invention, a CAS detection apparatus includes a mixing unit, a signal conversion unit, an amplitude modulation detection unit, a signal detection unit, and a CAS discrimination unit. The mixing unit mixes two or more frequency components filtered from an input signal to generate an amplitude modulated signal having a carrier and an envelope. The signal conversion unit automatically adjusts the gain of an output signal from the mixing unit to maintain the output signal in a range between a first threshold voltage and a second threshold voltage and converts the gain adjusted signal into a digital signal. The amplitude modulation detection unit analyzes the output signal from the signal conversion unit to identify the envelope. The signal detection unit determines whether the frequency of the envelope is in a range corresponding to the CAS and detects the difference between the maximum and minimum levels of the envelope to determine whether the component levels are characteristic of the CAS. The CAS discrimination unit receives the results of discriminating the frequency and voltage level by the signal detection unit and determines whether or not the CAS is present.

In accordance with another embodiment of the invention, an amplitude modulation detector for a CAS detection apparatus detects an amplitude modulated signal including a carrier and an envelope. The amplitude modulation detector includes a carrier peak detection unit and an envelope level detection unit. The carrier peak detection unit receives and shifts digital samples of the amplitude modulated signal in response to a clock signal and compares sets of digital samples to identify peaks of the carrier. The envelope level detection unit receives the digital samples for the identified carrier peaks in response to a second clock signal, and compares sets of peaks to identify extrema (i.e., maxima and/or minima) of the envelope.

In accordance with yet another embodiment of the invention, a CAS detection apparatus includes a mixing unit, a signal conversion unit, an amplitude modulation detection unit, a signal prediction unit, a signal detection unit, a CAS discrimination unit. The mixing unit filters the input signal into two or more frequency components, and mixes filtering results to generate an amplitude modulated signal including a carrier and an envelope. The signal conversion unit automatically controls a gain of an output signal of the mixing unit so that the output signal is in a first range between a first threshold voltage and a second threshold voltage, and converts the gain adjusted signal into a digital signal. The amplitude modulation detection unit detects the peaks of the carrier and envelope from the digital signal output from the signal conversion unit. The signal prediction unit detects a level of the amplitude modulated signal and occurrence periods and the number of peaks in the carrier and envelope to predict the presence of the CAS in the input signal, and outputs the prediction result as a CAS prediction signal. The signal detection unit determines whether a frequency of the envelope detected by the amplitude modulation detection unit is in a second range corresponding to the CAS, and detects a maximum/minimum level difference of the envelope to determine whether the maximum/minimum level corresponding to the CAS. The CAS discrimination unit determines whether the detection results from the signal detection unit remains for a predetermined period to determine whether the CAS is present.

In accordance with another embodiment of the invention, a CAS detection method includes: selecting two or more frequency components of an input signal and mixing the frequency components to generate an amplitude modulated signal; measuring an envelope of the amplitude modulated signal; and discriminating whether the frequency and voltage level of the envelope are in a range corresponding to the presence of the CAS.

Another CAS detection method includes: selecting two or more frequency components of an input signal and mixing the frequency components to generate an amplitude modulated signal; measuring an envelope of the amplitude modulated signal; predicting that the CAS is present if a carrier peak remains higher than a predetermined level for a predetermined period; discriminating whether the frequency and voltage level of the envelope are in a predetermined range if it is predicted that the CAS is present; and determining that the CAS is present if the frequency and level of the envelope satisfy the conditions.

Still another CAS detection method includes: filtering the input signal into two or more frequency components and mixing filtering results to generate an amplitude modulated signal; measuring a carrier and an envelope of the amplitude modulated signal; removing error peaks from peaks of the carrier and envelope, and predicting that the CAS is present if peaks in the carrier and envelope remain higher than a predetermined level for a predetermined period; if it is predicted that the CAS is present, determining whether a frequency and a voltage level of the envelope is in a predetermined range using the peaks of envelope from which the error peaks have been removed; and if it is determined that the frequency and the voltage level of the envelope is in the predetermined level, detecting a duration of the CAS to determine whether the CAS is present.

In accordance with another embodiment of the invention, a caller information detection includes a signal conversion unit, a peak detector, and a frequency shift keying (FSK) demodulation unit. The signal conversion unit filters the input signal to select two or more frequency components and converts the results into a digital signal. The peak detector detects peaks of the digital signal and assets a peak detection signal upon detecting a maximum or minimum in the digital signal. The frequency and number of maxima and minima indicate a MARK or SPACE signal and associated bit values. The FSK demodulation unit discriminates the occurrence number and interval of the maxima and minima to identify the MARK or SPACE signal and generate FSK data, detects the edge of the FSK data signal to generate clock signals for storing or transferring the FSK data.

In accordance with another embodiment of the invention, a caller information detection method includes: selecting two or more frequency components of an input signal and converting the results into a digital signal; detecting maxima and minima of the digital signal to identify a MARK signal or a SPACE signal and generate frequency shift keyed (FSK) data; detecting the edge of the FSK data signal to generate an FSK clock signal; generating a data clock signal in response to the FSK clock signal and the FSK data, the data clock signal being enabled in only an actual data interval; and transferring the FSK data in response to the data clock signal.

BRIEF DESCRIPTION OF THE DRAWINGS

The advantages of the present invention will become more apparent by describing embodiments thereof with reference to the attached drawings in which:

FIGS. 7A through 7H are timing diagrams of control signals for the AM detector of FIG. 6;

FIGS. 8A and 8B show waveforms illustrating the peak detection of the AM detector of FIG. 6;

FIG. 27, which includes parts labeled

FIG. 30, which includes parts labeled

FIGS. 32A through 32G show waveforms of signals in the caller information detection apparatus of FIG. 31; and FIG. 33, which includes parts labeled

DESCRIPTION OF THE PREFERRED EMBODIMENTS

Figure 1:
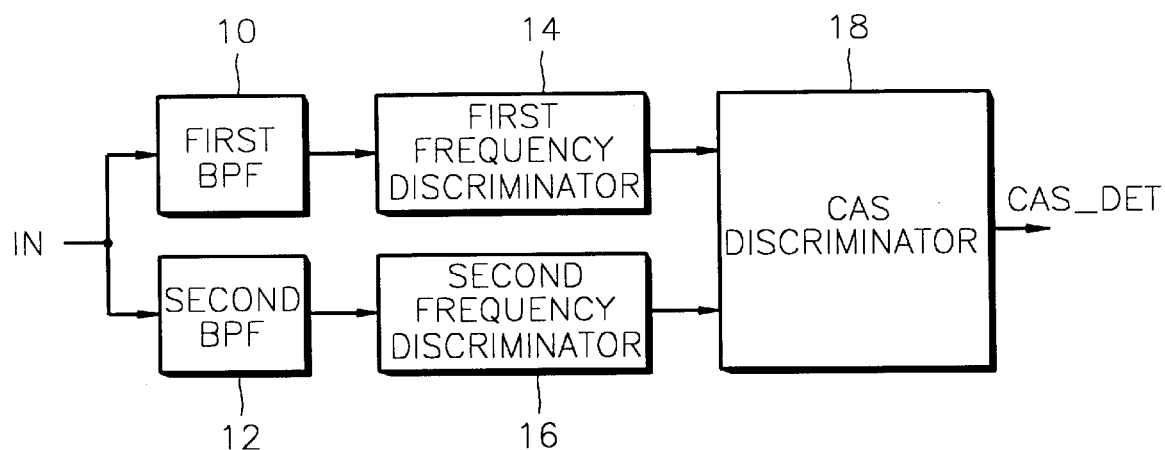
FIG. 1 is a block diagram of a conventional CAS (Customer premise equipment Alert Signal) detection apparatus.
Figure 2:
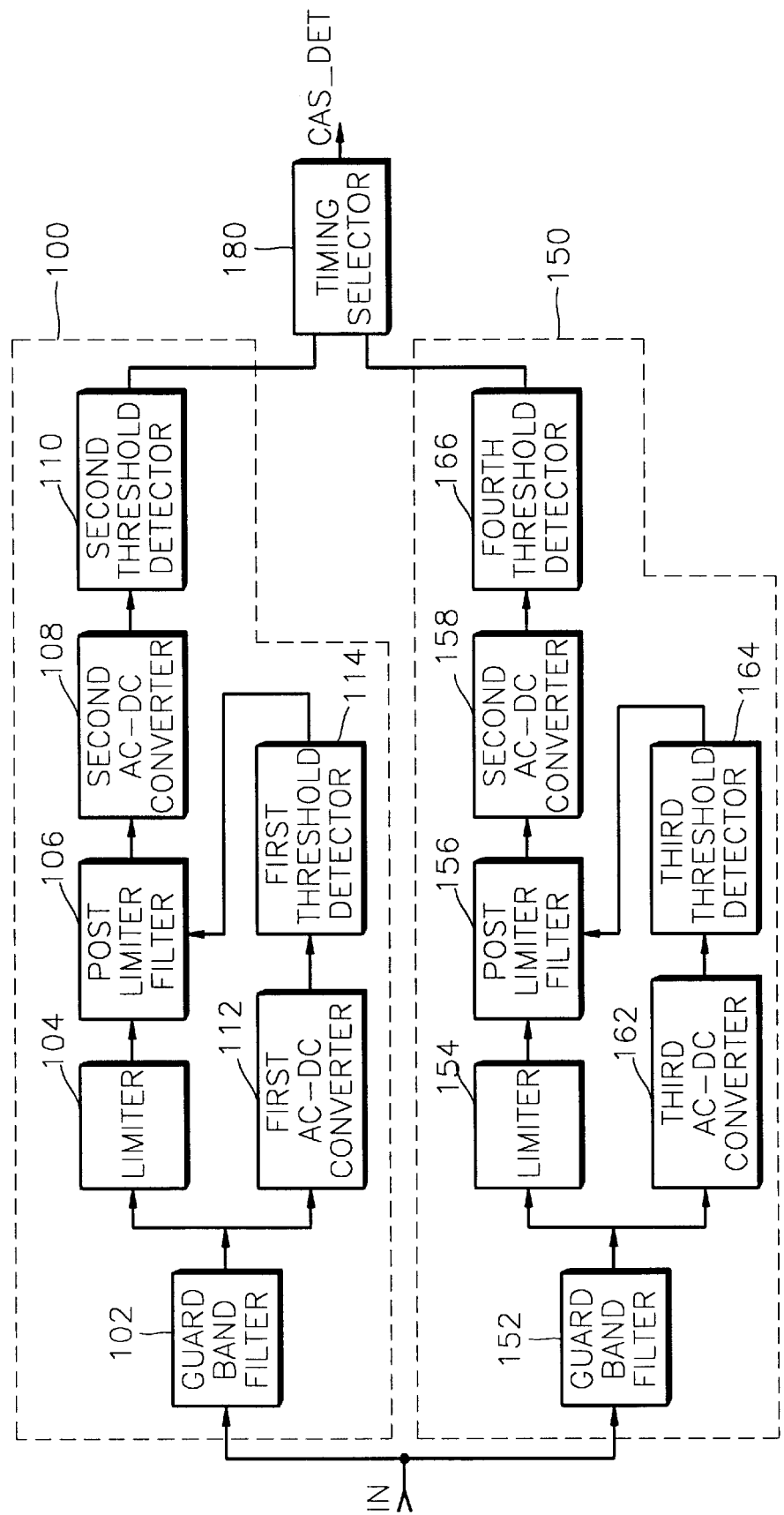
FIG. 2 is a block diagram of another conventional CAS detection apparatus.
Figure 3:
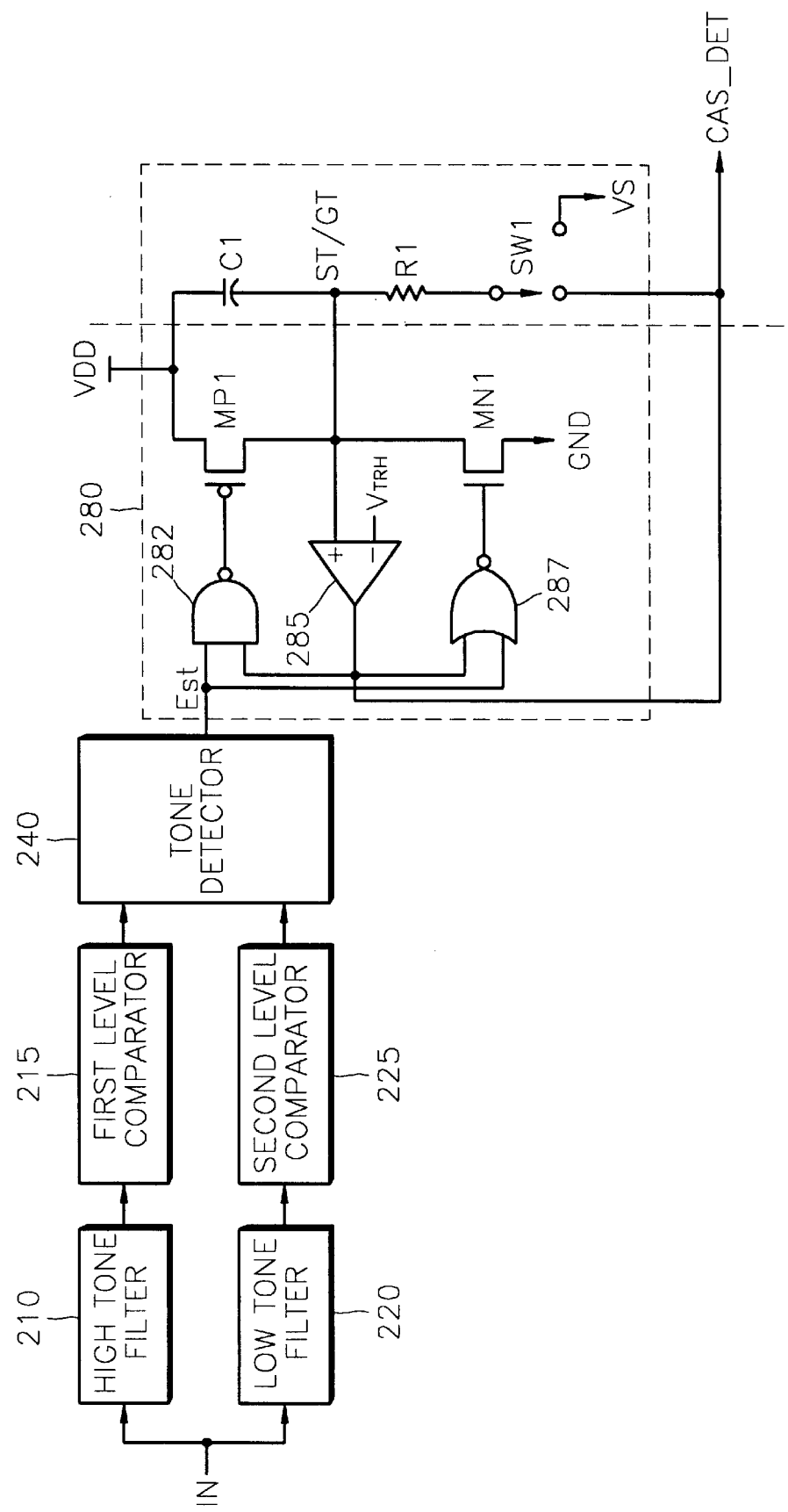
FIG. 3 is a block diagram of still another conventional CAS detection apparatus.
Figure 4:
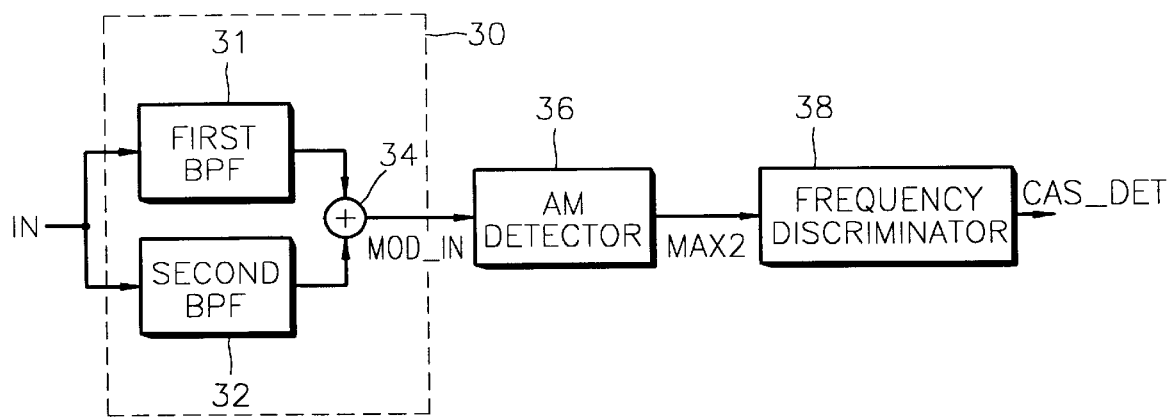
FIG. 4 is block diagram of a CAS detection apparatus according to an embodiment of the present invention.

Referring to FIG. 4, an apparatus of detecting a customer premise equipment alert signal (CAS) according to an embodiment of the present invention includes a mixing unit 30, an amplitude modulation (AM) detector 36, and a frequency discriminator 38. Mixing unit 30 includes a first band-pass filter (BPF) 31, a second BPF 32, and an adder 34. In operation, mixing unit 30 filters an input signal IN to select different frequency component signals, and mixes the filtered frequency component signals to generate an amplitude-modulated signal MOD_IN. The functions of BPFs 31 and 32 are the same of those of BPFs 10 and 12 of FIG. 1. BPFs 31 and 32 pass different frequency bands. As an example, BPFs 31 and 32 respectively pass a 2.13-KHz band and a 2.75-KHz band for detection of a conventional CAS. In the CAS detection apparatus, accurate detection of the CAS depends on the setting or choice of the frequency bands of BPFs 31 and 32. If the band width of filter 31 or 32 is wide, the probability of detecting the CAS increases, but the accuracy of the detection decreases, i.e., the possibility of false detection increases. On the other hand, if the band width of filter 31 or 32 is narrow, the detection accuracy is better, and a probability of false detection is low. However, the chance of detecting the CAS decreases.

Adder 34 mixes the signals from BPFs 31 and 32 and generates an amplitude-modulated signal MOD_IN. Here, a carrier of the amplitude-modulated signal MOD_IN has a frequency that is the sum of the frequencies of the signals form BPFs 31 and 32, and an envelope of the amplitude-modulated signal MOD_IN oscillates with a frequency that is the difference between the frequencies of the signals from BPFs 31 and 32.

AM detector 36 receives the amplitude-modulated signal MOD_IN and measures the envelope of the amplitude-modulated signal. Here, the resulting measurement is output as a maximum level detection signal MAX2 which is asserted each time the maximum level of the envelope occurs. The structure and operation of an exemplary embodiment of AM detector 36 are described in detail below with reference to FIG. 6. Maximum level detection signal MAX2 has a frequency matching the frequency of peaks in the envelope of amplitude-modulated signal MOD_IN.

Frequency discriminator 38 receives signal MAX2 detected from the amplitude-modulated signal MOD_IN and determines whether the frequency of signal MAX2 indicates the presence of the CAS. The structure and operation of an embodiment of frequency discriminator 38 are described in detail below with reference to FIG. 12.

Figure 5A:
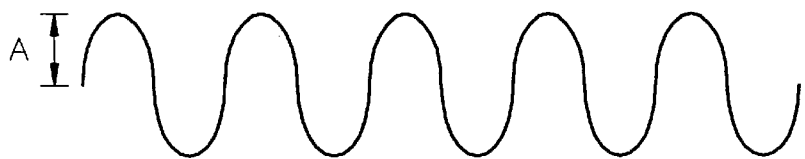
FIGS. 5A through 5E show waveforms of the signals related to a mixing unit of FIG. 4.
Figure 5B:
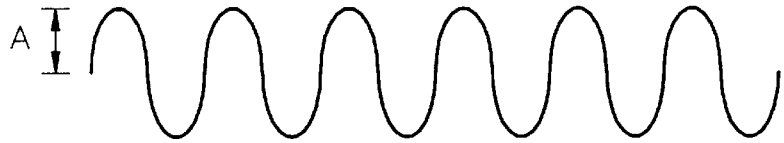
Figure 5C:
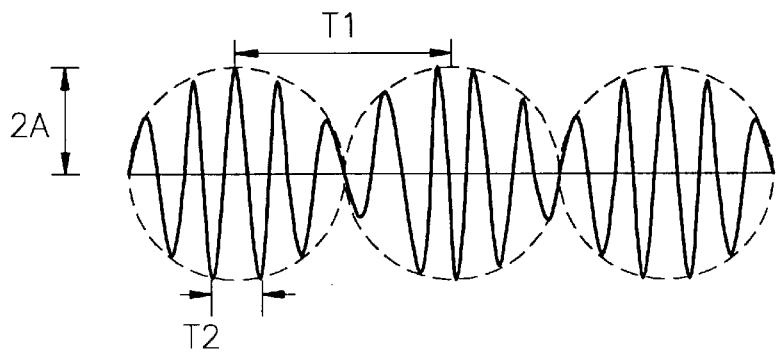
Figure 5D:
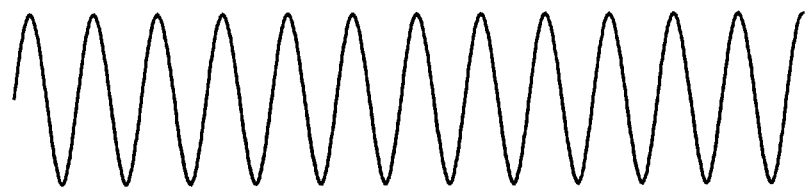
Figure 5E:
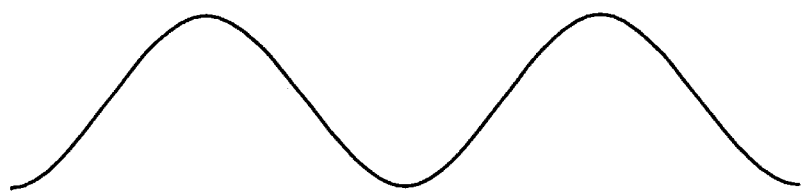

FIGS. 5A through 5E show waveforms of signals illustrating operation of mixing unit 30 of the CAS detection apparatus shown in FIG. 4. FIG. 5A represents a first frequency component signal output from BPF 31. FIG. 5B represents a second frequency component signal output from BPF 32. FIG. 5C represents the mixed signal MOD_IN output from adder 34. FIGS. 5D and 5E respectively represent the carrier and the envelope of mixed signal MOD_IN. Assuming that the output signal from BPF 31 is the sinusoidal signal of FIG. 5A and the output signal from BPF 32 is the sinusoidal signal of FIG. 5B, mixed signal MOD_IN, which is the sum of the signals of FIGS. 5A and 5B, is the signal of FIG, 5C. Equation 1 expresses the mathematical relation for the sum of sinusoids.

Equation 1:

$$\sin\alpha + \sin\beta = 2*\sin\left(\frac{\alpha+\beta}{2}\right)*\cos\left(\frac{\alpha-\beta}{2}\right)$$

where sin α and sin β respectively represent the signals of FIGS. 5A and 5B. For the frequencies 2.13 KHz and 2.75 KHz, the sum and the difference of the frequencies are 2.44 KHz and 310 Hz, respectively. Here, the frequency of 310 Hz is the original difference, but peaks in the waveform of FIG. 5C occur with a frequency of 620 Hz which is twice 310 Hz, and the CAS detection apparatus of FIG. 4 attempts to detect a signal MAX2 having a frequency of 620 Hz to determine whether the CAS presents.

Assuming that dual tone signals of 2.13 KHz and 2.75 KHz in the CAS have the form A sin(α+β) and B sin(α−β), where α+β is equal to 2.75 KHz and α−β is equal to 2.13 KHz, the mixture of the two tone signals can be expressed as Equation 2.

Equation 2:

$$A\sin(\alpha+\beta) + B\sin(\alpha-\beta) = (A+B)\sin\alpha * \cos\beta + (A-B)\cos\alpha * \sin\beta =$$

$$(A+B)\sin\alpha * \cos\beta + (A-B)\sin\left(\alpha+\frac{\pi}{2}\right)\cos\left(\beta-\frac{\pi}{2}\right) =$$

$$(A+B)\sin\alpha * \cos\beta - (A-B)\sin\left(\alpha+\frac{\pi}{2}\right)\cos\left(\beta+\frac{\pi}{2}\right)$$

In Equation 2, α is the carrier frequency (or 2.44 KHz) as shown in carrier signal of FIG. 5D, and β is the envelope frequency (or 310 Hz) as shown in envelope of FIG. 5E. The sum α+β is the frequency of the signal of FIG. 5A, and the difference α−β is the frequency of the signal of FIG. 5B. Thus, the carrier, which has a frequency equal to the sum of dual tone frequencies is (A+B)sin α, and the envelope, which has a frequency equal to the difference of the dual tone frequencies, is (A−B)cos β. Amplitudes A and B represent the peak voltage levels of two frequency component signals. If the two amplitudes A and B are equal as illustrated in FIGS. 5A and 5B, Equation 2 can be reexpressed as Equation 3.

Equation 3:

$$A\sin(\alpha+\beta) + B\sin(\alpha-\beta) =$$

$$(A+B)\sin\alpha * \cos\beta - (A-B)\sin\left(\alpha+\frac{\pi}{2}\right)\cos\left(\beta+\frac{\pi}{2}\right) = 2A\sin\alpha * \cos\beta$$

If the amplitudes of the signals of FIGS. 5A and 5B are both A, the amplitude of the mixed signal is 2A. Thus, the presence of the CAS can also be determined from the amplitude of mixed signal.

Figure 6:
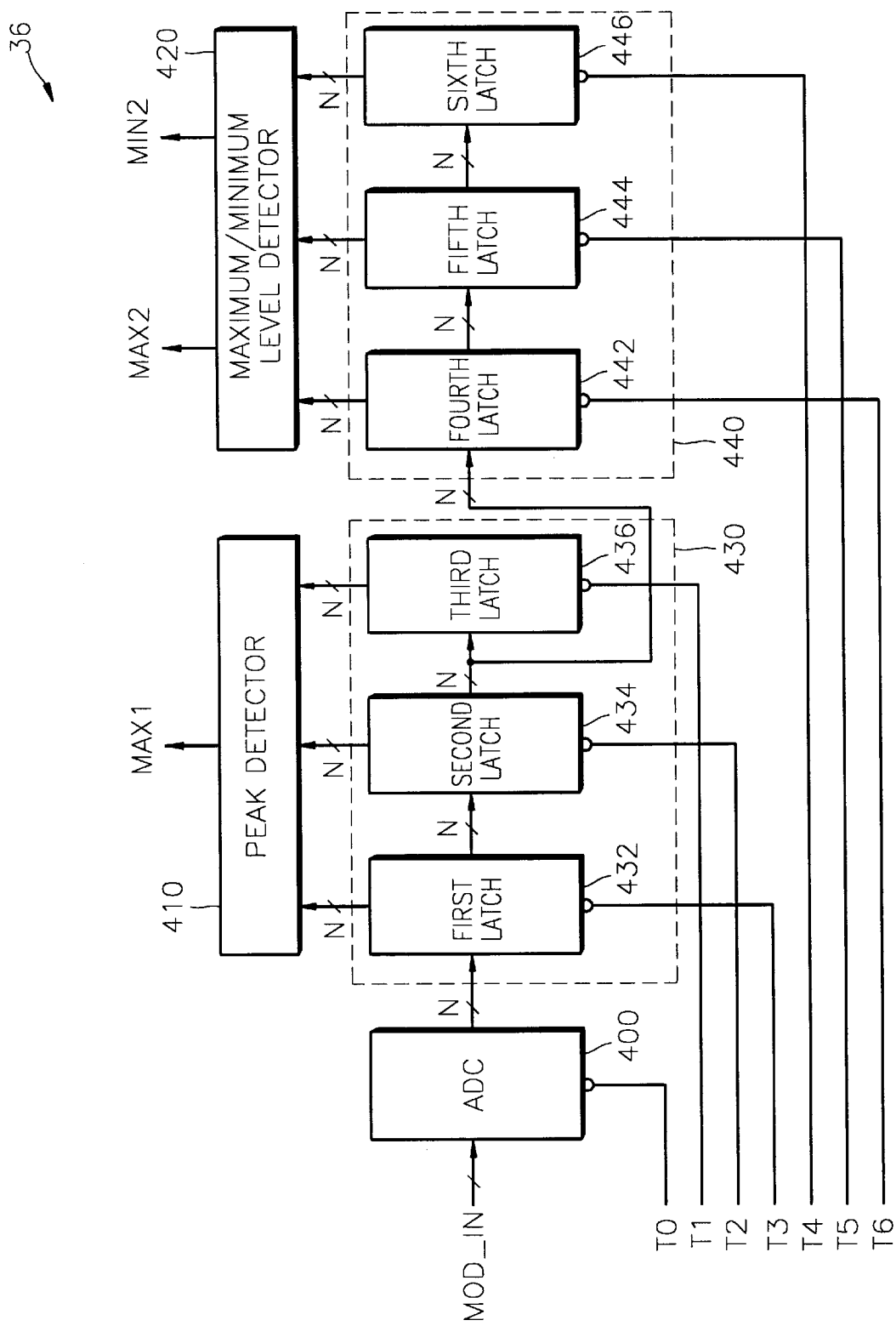
FIG. 6 is a block diagram of an amplitude modulation (AM) detector of FIG. 4.

FIG. 6 is a block diagram of an embodiment of AM detector 36 of FIG. 4. AM detector 36 includes an analog-to-digital converter (ADC) 400, a first shifting unit 430, a peak detector 410, a second shifting unit 440 and a maximum/minimum level detector 420. Each shifting unit 430 or 440 include a plurality of latches. For convenience in illustration, shifting unit 430 includes first, second, and third latches 432, 434 and 436, and shifting unit 440 includes fourth, fifth, and sixth latches 442, 444 and 446.

In AM detector 36, ADC 400 converts amplitude-modulated signal MOD_IN from adder 34 into an N-bit digital sample in response to a sample clock signal T0. As an example, ADC 400 can be implemented by an 8-bit ADC with a sampling rate of 30–40 μs.

Shifting unit 430 shifts each N-bit sample through latches 432, 434, and 436 in sequence and outputs the samples from latch 434 to the shifting unit 440 for peak detector 410. Here, the output ports of latches 432 and 434 connect to the input ports of the next latches 434 and 436 respectively. ADC 400 applies an N-bit sample to the input port of latch 432, and the N-bit sample is output from the first latch 432 to the input port of latch 434. Latch 434 outputs and applies the data sample to the input port of latch 436. For shifting unit 430, latch clock signals T3, T2 and T1 are the clock signals for the first, second, and third latches 432, 434, and 436, respectively.

Peak detector 410 receives the respective N-bit samples from latches 432, 434, and 436, compares the latched values, and generates a maximum peak detection signal MAX 1 indicating the comparison result. In particular, peak detector 410 asserts maximum peak detection signal MAX 1 when the N-bit sample from second latch 434 is the highest. Here, maximum peak detection signal MAX1 is asserted at each of the maximum or peak points of the carrier. Shifting unit 430 and peak detector 410 may be integrated into a single element and called a carrier peak detector.

Shifting unit 440 receives and latches the N-bit samples output from the shifting unit 430. In particular, shifting unit 440 latches samples identified as corresponding to peaks of the carrier. Shifting unit 440 outputs latched data to maximum/minimum level detector 420 in response to each latch clock signal. In shifting unit 440, N-bit samples from shifting unit 430 sequentially shift through each of latches 442, 444, and 446. Latch 442 receives the output of latch 434 when peak detector 410 detects that latch 424 contains a maximum or peak value of the carrier. Latch 442 applies its output signal to the input point of latch 444, and latch 444 applies its output signal to the input port of latch 446. Latch clock signals T6, T5, and T4 are the clock signals for latches 442, 444 and 446, respectively.

Maximum/minimum level detector 420 compares the N-bit samples output from latches 442, 444, and 446, and in response to the comparison result, generates a maximum level detection signal MAX2 and a minimum level detection signal MIN2 for the envelope. Here, the detected maximum or minimum level being in latch 444 represents the voltage level at the maximum or minimum of the peak points of signal MOD_IN. Maximum/minimum level detector 420 asserts the maximum level detection signal MAX2 when the N-bit sample in latch 444 is greater than the N-bit samples in latches 442 and 446, and asserts the minimum level detection signal MIN2 when the N-bit sample in latch 444 is less than the samples in latches 442 and 446. Shifting unit 440 and maximum/minimum level detector 420 may be integrated into a single element and called an envelope level detector.

Peak detector 410 and the maximum/minimum level detector 420 may be implemented in the same structure with different input or output signals. The operation thereof will be described later with reference to FIGS. 8 through 11.

AM detector 36 shown in FIG. 6 is a digital circuit that analyzes signal MOD_IN digitally, instead of using a diode and a capacitor. Known systems use a capacitor and diode to detect a signal and increase the capacitance of the capacitor when the carrier has a low frequency. As a result, such known systems require a large external capacitor. However, AM detector 36 analyzes or detects the envelope using the ADC and digital comparisons, so that AM detector 36 can be implemented with a single-chip integrated circuit.

FIGS. 7A to 7H are timing diagrams of control signals of AM detector 36. In detail, FIG. 7A represents enable or clock signal T0 for ADC 400, FIGS. 7B through 7G represent the latch clock signals T1 through T6, and FIG. 7H represents the maximum peak detection signal MAX1.

An external timing generator (not shown) generates enable signal T0 and latch clock signals T1 through T6 shown in FIGS. 7A through 7G. Enable signal T0 and latch clock signals T1 through T3 are asserted in sequence. Latch clock signals T4 through T6 are asserted in sequence after assertion of clock signal T3 but only when peak detection signal MAX1 is asserted (or at a logic high).

Operation of AM detector 36 is now described with reference to FIGS. 6 and 7A to 7H. Initially, amplitude modulated signal MOD_IN is input to ADC 400 and sampled when enable signal T0 of FIG. 7A enables ADC 400. ADC 400 converts the current amplitude of signal MOD_IN into an N-bit digital signal and holds that value until signal T0 again enables ADC 400. Then, when the timing generator asserts clock signal T1 of FIG. 7B, latch 436 latches and output signal of latch 434 and applies the latched signal to peak detector 410. When the timing generator asserts latch clock signal T2 of FIG. 7C, latch 434 latches the output signal from latch 432 and applies the latched signal to peak detector 410. When latch clock signal T3 of FIG. 7D is asserted, latch 432 latches the N-bit sample from ADC 400 and outputs the latched sample to peak detector 410.

Initially, the timing generator does not assert latch clock signals T4, T5, and T6 after asserting latch clock signal T3 because initially maximum peak detection signal MAX1 is not asserted. Peak detector 410 constantly compares three consecutive N-bit samples output from latches 432, 434, and 436. When the N-bit sample from latch 434 is greater than the samples from latches 432 and 436, peak detector 410 asserts peak detection signal MAX1 of FIG. 7H. Typically, several samples must cycle through shifting unit 430 before peak detector 410 asserts peak detection signal MAX1.

FIGS. 8A and 8B show waveforms for signals MOD_IN and T3 illustrating the peak detection of the AM detector of FIG. 6. FIG. 8A represents the carrier and FIG. 8B represents latch clock signal T3. FIGS. 8A and 8B are aligned to indicate samples of signal MOD_IN that latch 432 registers at times corresponding to edges of signal T3. Here, reference numbers 62a−1, 62a, 62a+1, 62b−1, 62b and 62b+1, 62c−1, 62c and 62c+1 indicates specific samples of the amplitude of signal MOD_IN. Particularly, samples 61a, 62b and 62c are at peaks of the carrier.

During each pulse in signal T3, latch 434 holds the sample that latch 432 register during a preceding pulse, and latch 436 holds the sample that latch 432 held two pulses before the current pulse. Accordingly, at time A3, latches 436, 434, and 432 hold samples 62a−2, 62a−1 and 62a. At the time A3, the sample output from latch 432 is the highest, and sample output from latch 436 is the lowest, so that peak detector 410 does not assert peak detection signal MAX1. However, at time A4, when latches 436, 434, and 432 respectively hold samples 62a−1, 62a, and 62a+1, sample 62a in latch 434 is highest. Thus, peak detector 410 detects a peak and asserts maximum peak detection signal MAX1. Here, peak detector 410 asserts peak detection signal MAX1 for a predetermined period. In a similar manner at time A5, latch 432 latches a sample 62a+2 from ADC 400, and latches 436 and 434 hold the previous samples 62a+1 and 62a. Thus, peak detector 410 inactivates the maximum peak detection signal MAX1 by time A5.

Figures 9A, 9B:
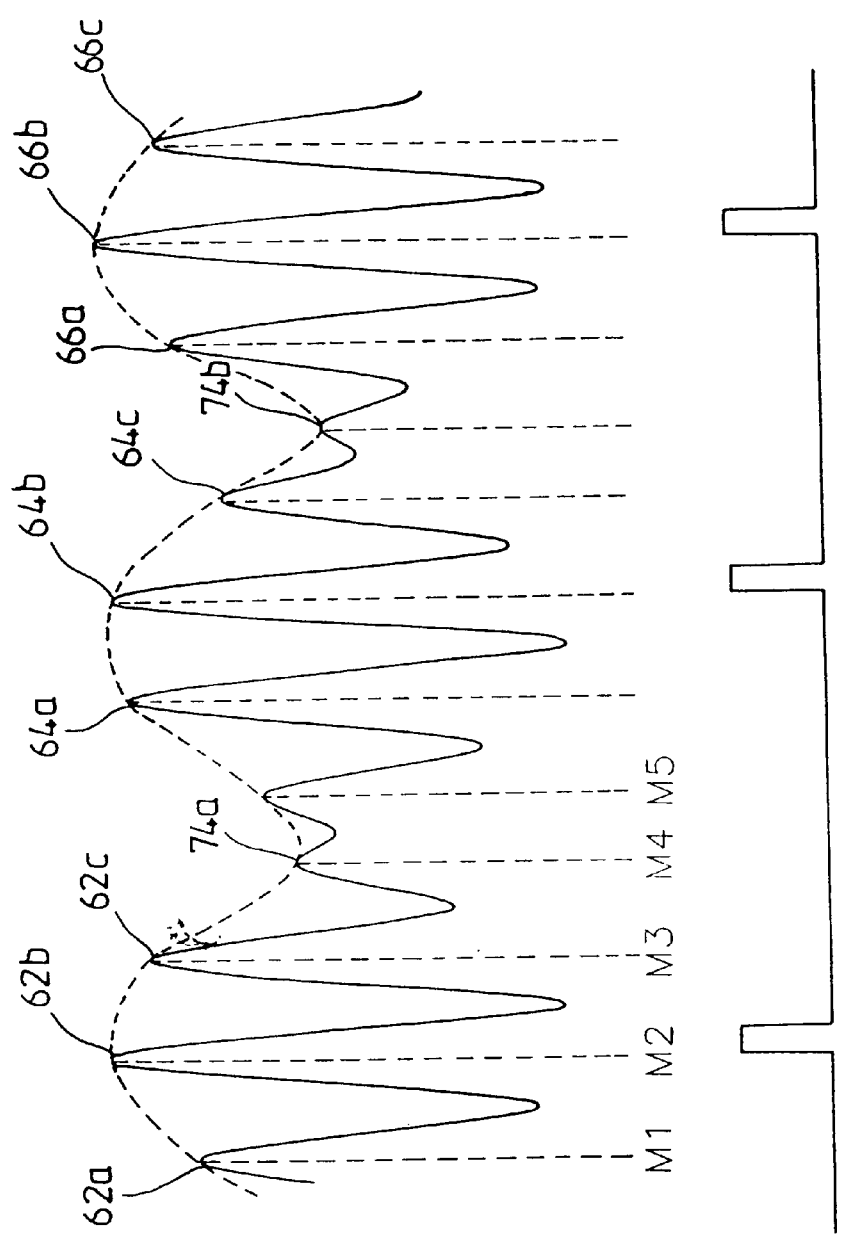
FIGS. 9A and 9B show waveforms illustrating the maximum level and envelope amplitude detection of the AM detector of FIG. 6.

FIGS. 9A and 9B show waveforms illustrating the maximum/minimum level detection of the AM detector of FIG. 6. FIG. 9A represents signal MOD_IN with the envelope following a path through the peaks in the carrier, and FIG. 9B represents maximum level detection signal MAX2.

During an interval where maximum peak detection signal MAX1 is asserted, latch clock signals T4 through T6 of FIGS. 7E and 7G are asserted to each latch 446, 444, and 442 of shifting unit 440. Latch 446 registers the sample from latch 444 and then outputs the sample to maximum/minimum level detector 420 in response to latch clock signal T4. Latch 444 registers the sample from latch 442 and then outputs the sample to maximum/minimum level detector 420 in response to latch clock signal T5. Latch 442 registers the sample from latch 434 and outputs the sample to maximum/minimum level detector 420 in response to latch clock signal T6. As described above, since signal MAX1 is asserted, the sample that latch, 442 receives from latch 434 is a peak, and previous peak samples shift from latch 442 to latch 444 and from latch 444 to latch 446. Maximum/minimum level detector 420 receives the N-bit samples from the latches 442, 444, and 446 and compares the received samples. Here, when the sample in latch 444 is the highest, maximum/minimum level detector 420 asserts maximum level detection signal MAX2. For example, referring to FIG. 9A, detector 420 asserts signal MAX2 when latches 442, 444, and 446 respectively store samples 62c, 62b and 62a. Here, the samples stored in latches 446, 444, and 442 respectively correspond to times M1, M2, and M3. Thus, detector 420 asserts maximum level detection signal MAX2 to mark the maximum peak of the envelope. When the samples in latches 446, 444, and 442 shift to so that latches 446, 444, and 442 respectively store samples 62b, 62c, and 74a, maximum/minimum level detector 420 does not assert maximum level detection signal MAX2. Referring to FIG. 9A, detector 420 asserts maximum level detection signal MAX2 at times corresponding to samples 62b, 64b, and 66b being in latch 444.

Maximum/minimum level detector 420 compares the samples from latches 442, 444 and 446 as described above, to detect the minimum peak levels, and also asserts minimum level detection signal MIN2 in response to the detection result. Unlike the maximum level detection, when the sample from latch 444 is the lowest, maximum/minimum level detector 420 identifies a minimum peak point of the envelope of AM signal MOD_IN. In FIG. 9A, reference numerals 74a and 74b represent the minimum level detection points.

By repeating the above processes, maximum/minimum level detector 420 can detect successively the maximum and minimum levels of the envelope, and the time between a maximum peak point and another maximum peak point is the period of the envelope (or as noted above half the period since one maximum peak corresponds to positive carrier and envelope values and the other maximum peak corresponds to negative carrier and envelope values). Thus, the maximum/minimum level detector can digitally detect the maxima and minima of the envelope without an extra or external circuit component. Also, the above described AM detector using digital peak detection according to the present invention can be applied to any systems that uses amplitude modulation and is not limited to CAS detection apparatuses.

Figure 10:
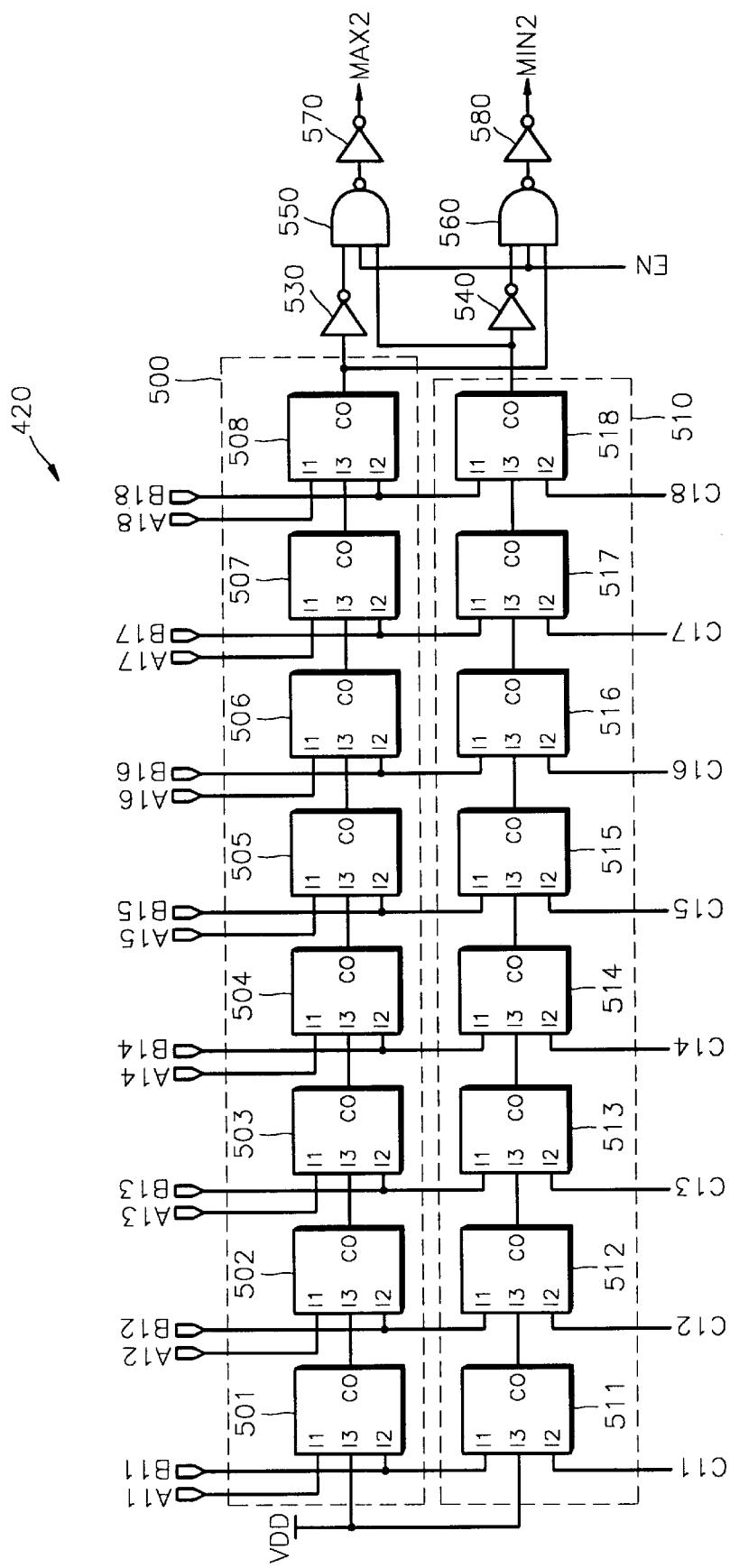
FIG. 10 is a circuit diagram of a peak detector and a maximum/minimum level detector of the AM detector shown in FIG. 6.

FIG. 10 is a circuit diagram of an embodiment of maximum/minimum level detector 420 of AM detector 36 of FIG. 6. Peak detector 410 and maximum/minimum level detector 420 may be implemented using the same structure. For convenience in explanation, only the structure of maximum/minimum level detector 420 is described.

As shown in FIG. 10, maximum/minimum level detector 420 includes a first comparison unit 500, a second comparison unit 510, inverters 530 and 540, NAND gates 550 and 560, and inverters 570 and 580. Comparison unit 500 includes serially connected comparators 501 through 508, and comparison unit 510 includes serially connected comparators 511 through 518.

Comparison unit 500 compares the digital values output from latches 442 and 444 of FIG. 6, and outputs the comparison result to inverter 530. Each of comparators 501 through 508 receives one bit via each of input ports I1 and I2. Latch 442 provides bits to input ports I1, and latch 444 provides bits to input ports I2. In order from the least significant bit to the most significant bit, bits A11 through A18 represent N-bit data from latch 442, and bits B11 through B18 represent N-bit data from latch 444. Each comparator 501 to 508 has an output terminal CO for a signal indicating greater than or not greater than and receives the comparison result of the preceding comparator via an input port I3. Power voltage VDD is applied to input port I3 of comparator 501.

Comparison unit 510 compares the samples output from latches 444 and 446 of FIG. 6, and outputs a comparison result. Comparators 511 through 518 receive the N-bit samples from latches 444 and 446 via input ports I1 and I2, and each comparator receives the comparison result of the preceding comparator via each input port I3. In order from the least significant bit to the most significant bit, bits C11 through C18 represent N-bit data from latch 446. Power voltage VDD is applied to the input port I3 of the first comparator 511 of comparison unit 510.

Inverter 530 inverts the output signal of comparison unit 500, and inverter 540 inverts the output signal of comparison unit 510. A NAND gate 550 performs a NAND operation on the output signal from inverter 530, an enable signal EN applied from an external timing controller (not shown), and the output signal of comparison unit 510. An inverter 570 inverts the output signal of NAND gate 550 to generate maximum level detection signal MAX2. NAND gate 560 performs a NAND operation on the output signal of inverter 540, enable signal EN, and the output signal of comparison unit 500. An inverter 508 inverts the output signal of NAND gate 560 to generate minimum level detection signal MIN2.

The output signal of comparator 508 is high when the N-bit data from latch 442 is greater than or equal to the N-bit data from latch 444. Also, when the N-bit data from latch 444 is greater than or equal to the N-bit data from latch 446, the output signal from comparator 518 is high. When the output signal from comparison unit 500 is high and the output signal of comparison unit 510 is low, the N-bit data from latch 444 is the lower than the N-bit data from each of latches 442 and 442, and the output signal from NAND gate 560 is low if enable signal EN is asserted (high). Thus, inverter 580, which receives the output signal from NAND gate 560, asserts minimum level detection signal MIN2.

When the output signal of comparison unit 500 is low and the output signal of the second comparison unit 510 is high, the N-bit data from latch 444 is greater than either N-bit data value from latches 442 and 446, and the output signal of NAND gate 550 is low if enable signal EN is asserted. Thus, inverter 570 asserts maximum level detection signal MAX2.

Figure 11:
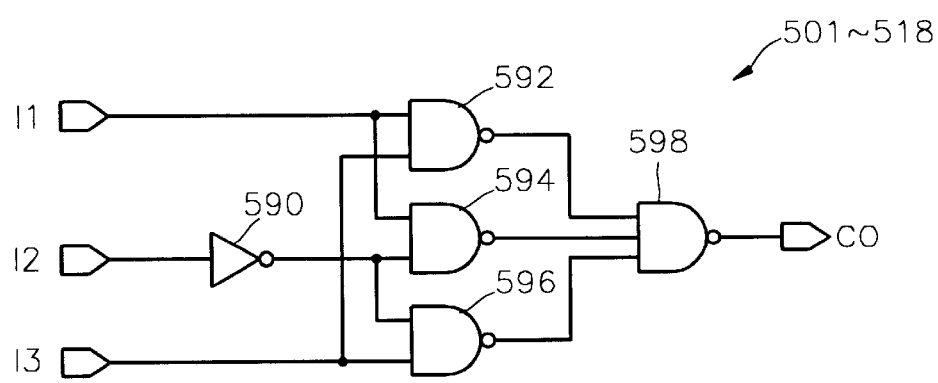
FIG. 11 is a circuit diagram of a comparator in FIG. 10.

FIG. 11 is a circuit diagram of one of the comparators 501 to 508 and 511 to 518 shown in FIG. 10. As shown in FIG. 11, the comparator includes an inverter 590 and four NAND gates 592, 594, 596, and 598. In operation, inverter 590 inverts second input signal I2. NAND gate 592 performs a NAND operation on first input signal I1 and third input signal I3, and NAND gate 594 performs a NAND operation on input signal I1 and the output signal of inverter 590. NAND gate 596 performs a NAND operation on the output signal of inverter 590 and input signal I3, and NAND gate 598 performs a NAND operation on the output signals of NAND gates 592, 594, and 596, to generate a comparison output signal CO.

Referring to FIGS. 6, 10, and 11, first input signal I1 is an output bit from latch 442 and second input signal I2 is an output bit from latch 444.

In a first case, the third input signal I3, which represents the comparison result from the preceding comparator, is high. Here, when first input signal I1 is high and second input signal I2 is low, all the outputs of the NAND gates 592, 594, and 596 go to low. Thus, output signal CO of NAND gate 598 is high. When both input signals I1 and I2 are high, the output signal from NAND gate 592 is low, and the output signals from NAND gates 594 and 596 are high. Thus, NAND gate 598 generates a high level for output signal CO. When first input signal I1 is low and second input signal I2 is high, all of the output signals of the NAND gates 592, 594, and 596 have a high voltage level, so that comparison output signal CO from NAND gate 598 is low. Thus, when the comparison output signal of the previous comparator (i.e., input signal I3) has a high voltage level, the comparison output signal CO is asserted (high) only when the output bit from latch 442 is equal to or greater than the bit from latch 444.

In a second case, third input signal I3 is low. In this case, when input signals I1 and I2 are high, all of the output signals of NAND gates 592, 594, and 596 are high. Thus, the comparison output signal CO from NAND gate 598 is low. When first input signal I1 is high and second input signal I2 is low, the output signals of NAND gates 592 and 596 are high, and the output signal of NAND gate 594 is low. Thus, the output signal of NAND gate 598 is high. When first input signal I1 is low and second input signal I2 is high, all of the output signals of NAND gates 592, 594, and 596 are high, and comparison output signal CO from NAND gate 598 is low. Accordingly, in the second case, where the comparison output signal from the previous comparator is low, comparison output signal CO is asserted high only when the bit from latch 442 is greater than the bit from latch 444.

Figure 12:
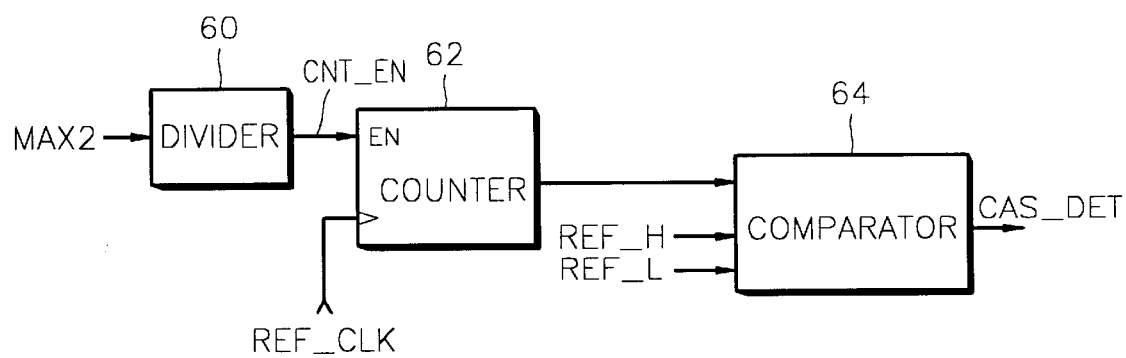
FIG. 12 is a block diagram of a frequency discriminator of the CAS detection apparatus shown in FIG. 4.

FIG. 12 is a block diagram of an embodiment of frequency discriminator 38 of the CAS detection apparatus shown in FIG. 4. As shown, frequency discriminator 38 includes a frequency divider 60, a counter 62, and a comparator 64.

Frequency divider 60 receives maximum level detection signal MAX2 from the AM detector 36, divides the frequency of the input signal by a predetermined constant, and outputs a count enable signal CNT_EN. Preferably, the frequency of count enable signal CNT_EN is half of that of maximum level detection signal MAX2.

Counter 62 counts periods of reference clock signals REF_CLK in response to count enable signal CNT_EN, and outputs the count as a multi-bit digital signal. Here, reference clock signal REF_CLK has a frequency higher than that of the envelope of AM signal.

Comparator 64 receives the count signal from counter 62, compares the count signal with a first reference signal REF_H and a second reference signal REF_L, and generates a CAS detection signal CAS_DET in response to the comparison result. Here, reference signals REF_H and REF_L respectively represent the upper and lower frequency limits for an envelope accepted as resulting from a CAS.

Figures 13A, 13B, 13C:
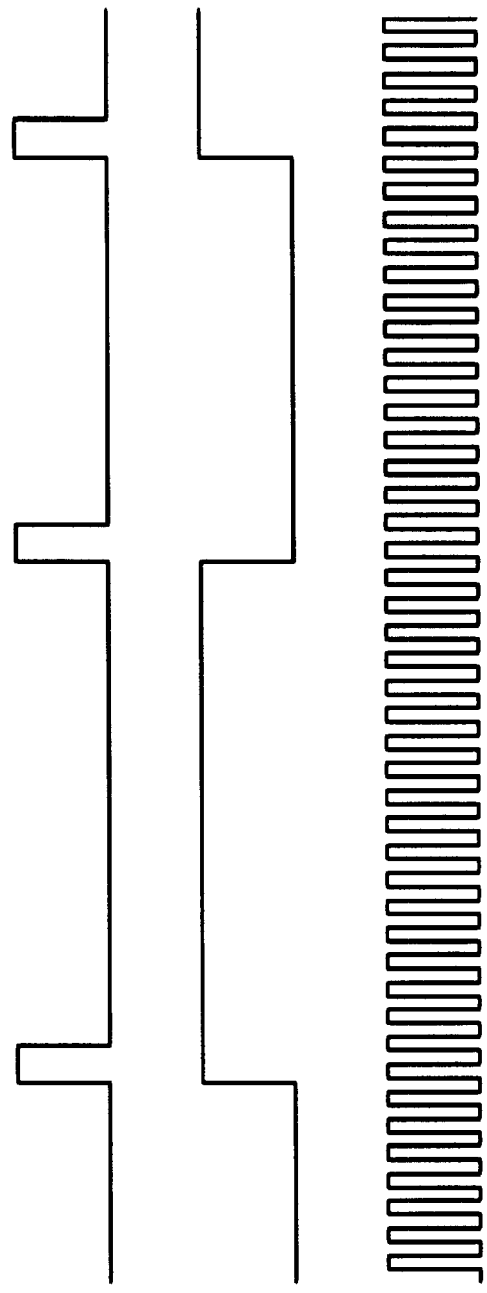
FIGS. 13A, 13B, and 13C show waveforms illustrating operation of the frequency discriminator shown in FIG. 12.

FIGS. 13A through 13C show waveforms illustrating the operation of the frequency discriminator 38 of FIG. 10. In particular, FIG. 13A represents maximum level detection signal MAX2, FIG. 13B represents count enable signal CNT_EN, and FIG. 13C represents reference clock signal REF_CLK. During operation of the frequency discriminator 38 maximum level detection signal MAX2 of FIG. 13A is for the envelope that AM detector 36 detects. Here, the frequency of maximum level detection signal MAX2 is 620 Hz for a CAS. Count enable signal CNT_EN, which is output from frequency divider 60 and shown in FIG. 13B, has a frequency that is half the frequency of signal MAX2 or 310 Hz and a pulse width of the high level interval of about 1.613 ms. Counter 62 counts periods of reference clock signal REF_CLK during the high level interval of count enable signal CNT_EN of FIG. 13B. If the count value is between the limits that reference signals REF_H and REF_L indicate, comparator 64 determines that the CAS is present and asserts the CAS detection signal CAS_DET to a logic high. For example, assuming that CAS is present when the number of count values is about K which indicates a frequency of 620 Hz for signal MAX2, reference signals REF_H and REF_L provide an acceptable margin for count values around count K. This range of the count values is predetermined and is the basis for determining the existence of the CAS. If the count value is greater than the upper limit that reference signal REF_H or less than the lower limit that second reference signal REF_L, comparator determines that the CAS is not present, and the CAS detection signal CAS_DET remains low.

Figure 14:
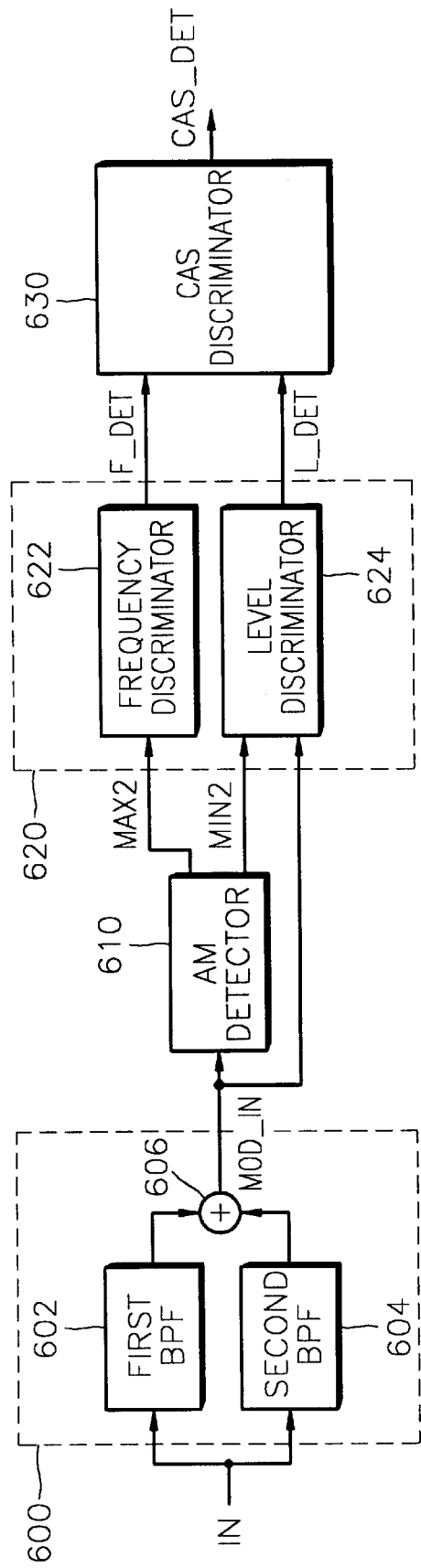
FIG. 14 is a block diagram of a CAS detection apparatus according to another embodiment of the present invention.

FIG. 14 is a block diagram of a CAS detection apparatus according to another embodiment of the present invention. The CAS detection apparatus includes a mixing unit 600, an AM detector 610, a signal detection unit 620, and a CAS discriminator 630. Here, mixing unit 600 includes a first band-pass filter 602, a second band-pass filter 604, and an adder 606. Signal detection unit 620 includes a frequency discriminator 622 and a level discriminator 624.

Mixing unit 600 of FIG. 14 filters an input signal IN to extract a first frequency component and a second frequency component of the input signal IN and then mixes the first and second frequency components to generate an AM signal MOD_IN including a carrier and an envelope.

AM detector 610 analyzes AM signal MOD_IN to determine the frequency of the envelope. AM detector 610 may be implemented with digital or in analog circuits. If AM detector 610 adopts digital circuitry, the peak detection method used in the AM detector of FIG. 4 can be applied.

Signal detection unit 620 determines whether the frequency of the envelope is within a predetermined range, to discriminate the frequency of the CAS. Also, signal detection unit 620 compares the voltage level of the envelope to a predetermined reference voltage level, thereby discriminating the levels of the components of the CAS. In detail, frequency discriminator 622 discriminates the frequency of the envelope to generate a frequency discrimination signal F_DET, and the level discriminator 624 discriminates the level or amplitude of the envelope to generate a level discrimination signal L_DET. Here, frequency discriminator 622 may be implemented with the same structure as shown in FIG. 12.

CAS discriminator 630 receives frequency discrimination signal F_DET and level discrimination signal L_DET output from signal detection unit 620 and determines whether the CAS is present. Preferably, CAS discriminator 630 is a logic gate such as an AND gate. If CAS discriminator 630 is an AND gate, CAS detection signal CAS_DET, which is output from CAS discriminator 630, is high when both input signals F_DET and L_DET are high to indicate that the envelope meets both the frequency and level requirements for a CAS.

The CAS detection apparatus of FIG. 14 differs from the CAS detection apparatus of FIG. 4 by further including level discriminator 624 that performs a level discrimination function. The level discrimination function gives the system of FIG. 14 has a lower probability of false CAS detection, which may otherwise result when an applied voice signal includes the same frequency components as the two tones of the CAS. In addition, the level difference between two tone signals of the CAS can be limited within 6 dB. That is, assuming that the dual tones of the CAS are $A\ sin(\alpha+\beta)$ and $B\ sin(\alpha-\beta)$, the mixing result of the dual tone signals can be expressed as in Equation 2 when the two tone signals have different levels. In Equation 2, the term $(A+B)sin\ \alpha\ cos\ \beta$ is dominant regardless of the levels of the dual tones. However, when the amplitudes A and B of the two tones are not the same, the term $(A-B)sin(\alpha+\pi/2)cos(\beta+\pi/2)$ causes a phase shift relative to a CAS having the same dual tone levels.

Figure 15A:
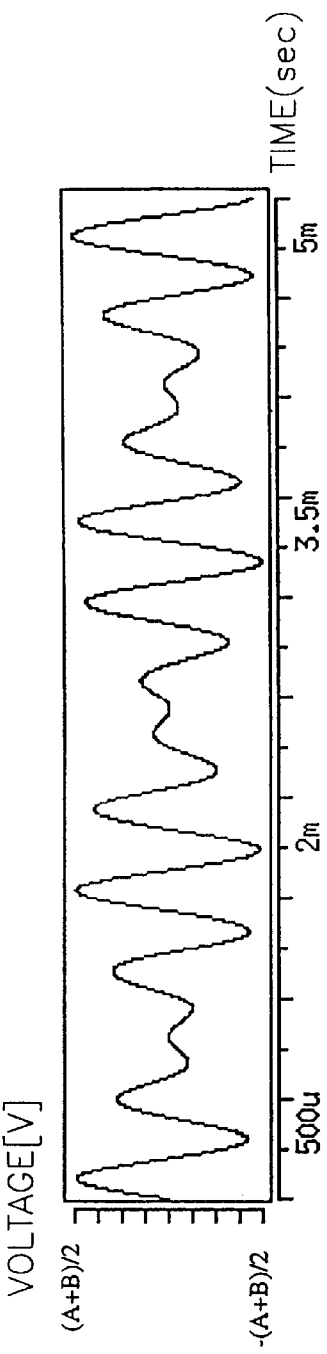
FIGS. 15A, 15B, and 15C show waveforms of a mixed signal when two tones of a CAS signal have different amplitudes.
Figure 15B:
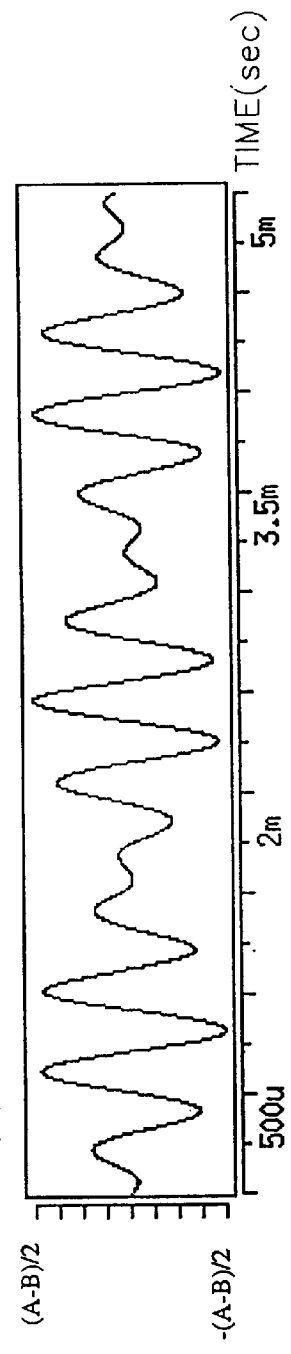
Figure 15C:
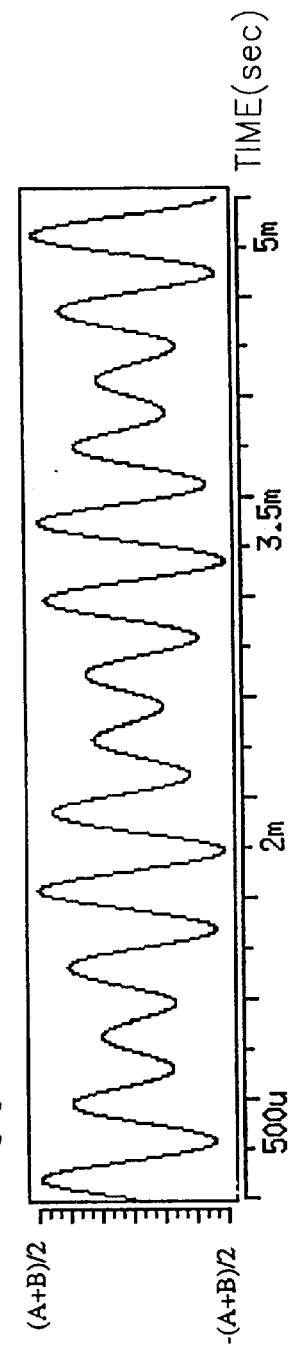

FIGS. 15A through 15C are waveforms of the mixed signal when two tones of the CAS have different combinations of voltages (i.e., amplitudes A and B). FIG. 15A represents the mixed signal when the two tone signals have a voltage ratio of 1:1. FIG. 15B represents the mixed signal when the two tone signals have a voltage ratio of 2:1, and FIG. 15C represents the mixed signal when the two tone signals have a voltage ratio of 4:1.

As shown in FIGS. 15B and 15C, when the levels of two signals are different, the phase is shifted relative to the case of having the same level. The level or amplitude of the envelope of mixed signal is lower because of subtraction between two terms as shown in Equation 2. Referring to FIG. 15A, if the amplitudes of two signals are the same, the level of the envelope of the mixing signal is the highest. Also, the larger the level difference of two signals is, the lower the level of the envelope is. Thus, the caller identification service standards limit the level difference between the two tones to be less than 6 dB. That is, if the input signal to the CAS detection apparatus contains a CAS, the level of the envelope must be in a predetermined range, and detecting the level of the envelope can determine or distinguish the presence of the CAS.

In FIG. 14, mixing unit 600, AM detector 610 and frequency discriminator 622 of the CAS detection apparatus may be implemented with the same structure as in FIG. 4. However, the CAS detection apparatus of FIG. 14 determines and distinguishes both the frequency and the level of the envelope for more accurate CAS detection.

Figure 16:
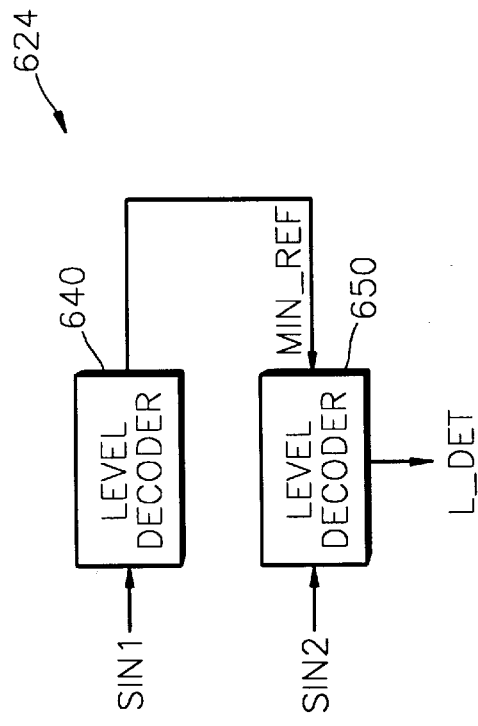
FIG. 16 is a block diagram of a level discriminator in the CAS detection apparatus of FIG. 14.

FIG. 16 is a block diagram of level discriminator 624 of the CAS detection apparatus shown in FIG. 14. Level discriminator 624 includes a level decoder 640 and a level comparator 650. Level decoder 640 receives amplitude-modulated signal MOD_IN via an input port SIN1 and sets a reference level MIN_REF according to the maximum level of signal MOD_IN. Preferably, reference level MIN_REF represents half of the maximum voltage level of the envelope. If the levels of dual tones differ by 6 dB, the minimum level of the envelope is ⅓ of the maximum level, and one half of the maximum level provides reference level MIN_REF with a detection margin. In the caller identification service, the level of input signal MOD_IN is not constant, and level detector 640 varies reference value MIN_REF according to the level of input signal MOD_IN.

Level comparator 650 receives via an input port SIN2 a signal representing the minimum level of the envelope as detected by AM detector 610, and level comparator 650 compares the minimum level of the envelope with reference level MIN_REF from level decoder 640 to discriminate the level of the envelope of signal MOD_IN. If the minimum level of the envelope is less than the reference level MIN_REF, level discriminator 624 determines that the CAS is present in input signal IN.

Figure 17:
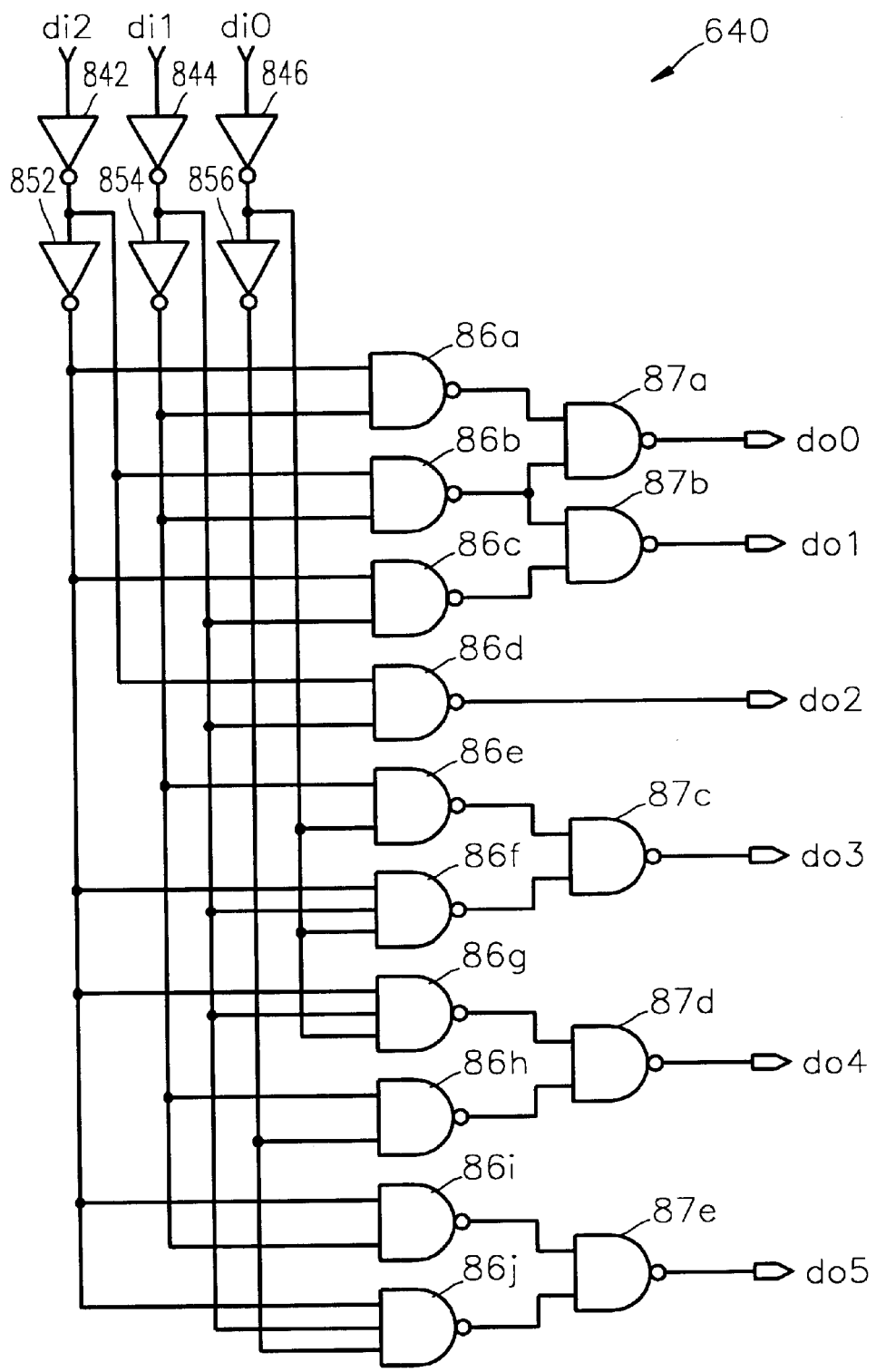
FIG. 17 is a circuit diagram of the level decoder in the level discriminator of FIG. 16.

FIG. 17 is a circuit diagram of level decoder 640 of level discriminator 624 of FIG. 14. Level decoder 640 includes: first inverters 842, 844 and 846; second inverters 852, 854 and 856 that invert the output signals of respective first inverters 842, 844 and 846; first NAND gates 86a through 86j that perform NAND operations on combinations of the output signals of first and second inverters 842, 844, 846, 852, 854, and 856; and second NAND gates 87a through 87e that perform NAND operations on combinations of output signals from first NAND gates 86a through 86j.

First inverters 842, 844, and 846 receive via respective input ports di0, di1 and di2 the upper three bits of a latched sample of the maximum level of signal MOD_IN. Inverters 842, 844, and 846 invert the input bits. According to the embodiment of FIG. 17, only upper three bits of the latched sample are input under assumption that the sample is an 8-bit signal. However, the number of bits of the input signal may be varied depending on the design of the circuit. Second inverters 852, 854, and 856 invert respective output signals of first inverters 842, 844, and 846, and first NAND gates 86a to 86j have input signals that are combinations of the signals from inverters 842, 844, 846, 852, 854, and 856.

In detail, NAND gate 86a performs a NAND operation on the output signals of inverters 852 and 854. NAND gate 86b performs a NAND operation on the output signals of the inverters 842 and 854. NAND gate 86c performs a NAND operation on the output signals of inverters 852 and 844. NAND gate 86d performs a NAND operation on the output signals of inverters 842 and 844. NAND gate 86e performs a NAND operation on the output signals of inverters 854 and 846. NAND gate 86f performs a NAND operation on the output signals of inverters 852, 844, and 846. NAND gate 86g performs a NAND operation on the output signals of inverters 852, 844, and 846. NAND gate 86h performs a NAND operation on the output signals of inverters 854 and 856. NAND gate 86i performs a NAND operation on the output signals of inverters 852 and 854, and NAND gate 86j performs a NAND operation on the output signals of inverters 852, 844, and 856.

NAND gate 87a performs a NAND operation on the output signals of NAND gates 86a and 86b to generate a first data bit do0. NAND gate 87b performs a NAND operation on the output signals of NAND gates 86b and 86c to generate a second data bit do1. The output signal from NAND gate 86 provides a third data bit do2. NAND gate 87c performs a NAND operation on the output signals of NAND gate 86e and 86f to generate a fourth data bit do3. NAND gate 87d performs a NAND operation on the output signals of NAND gates 86g and 86h to generate a fifth data bit do4, and NAND gate 87e performs a NAND operation on the output signals of NAND gates 86i and 86j to generate a sixth bit data do5.

According to the embodiment of FIG. 17, the decoding output consists of only the six least significant bits of the 8-bit data. However, the decoding output may vary depending on the design.

For the level decoder shown in FIG. 17, output bits do0 to do5 have different values corresponding to the levels of input data bits di0, di1 and di2. Here, the 6-bit output signal indicates the reference value for the comparison to the minimum peak levels of the envelope, and the 6-bit output signal has a value indicating a point having one half of the envelope's maximum amplitude as indicated by input bits di0 to di2.

Figure 18:
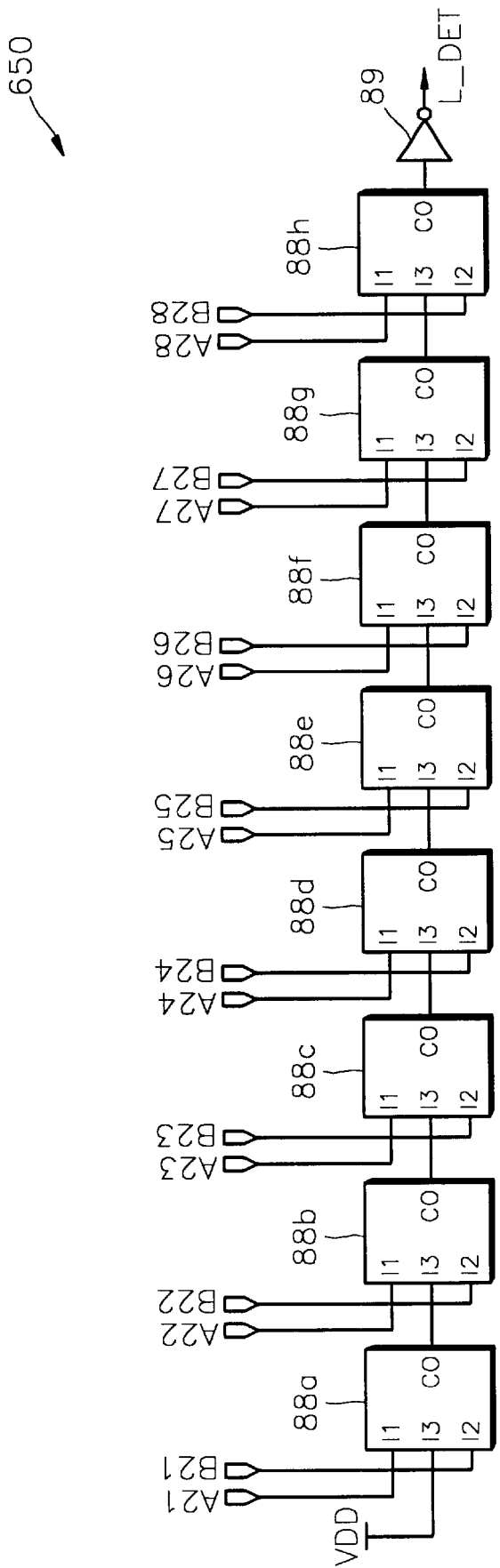
FIG. 18 is a circuit diagram of a level comparator in the level discriminator of FIG. 16.

FIG. 18 is a circuit diagram of level comparator 650 of level discriminator 624 of FIG. 14. Level comparator 650 includes serially connected comparators 88a through 88h and an inverter 89. The serially connected comparators 88a through 88h receive via first input ports I1 latch data A21 through A28 indicating a minimum peak level of the envelope, receive via second input ports I2 reference data B21 through B28 from level decoder 640, and receive via third input ports I3 the output signal CO of the previous comparator. Here, voltage VDD (representing a bit with value 1) is input via a third input port I3 to comparator 88a. Each comparator 81 through 88h may have the same structure as in FIG. 11.

Referring to FIG. 18, when the 8-bit digital data indicating the minimum peak level of the envelope has a lower level than the 8-bit reference level MIN_REF, level comparator 650 asserts a level detection signal L_DET (high). That is, when the N-bit signal input via second input ports I2 is less than the N-bit signal input via first input ports I1, the level detection signal L_DET becomes high. Thus, when the minimum peak level of the envelope is higher than the reference level, the output signal of comparator 88h is high, and the output signal of inverter 89 is low. On the other hand, if the minimum level of the envelope is greater than the reference level that bits B21 through B28 indicate, the output signal of comparator 88h is high, so that level detection signal L_DET from the inverter is deasserted (low).

Figure 19:
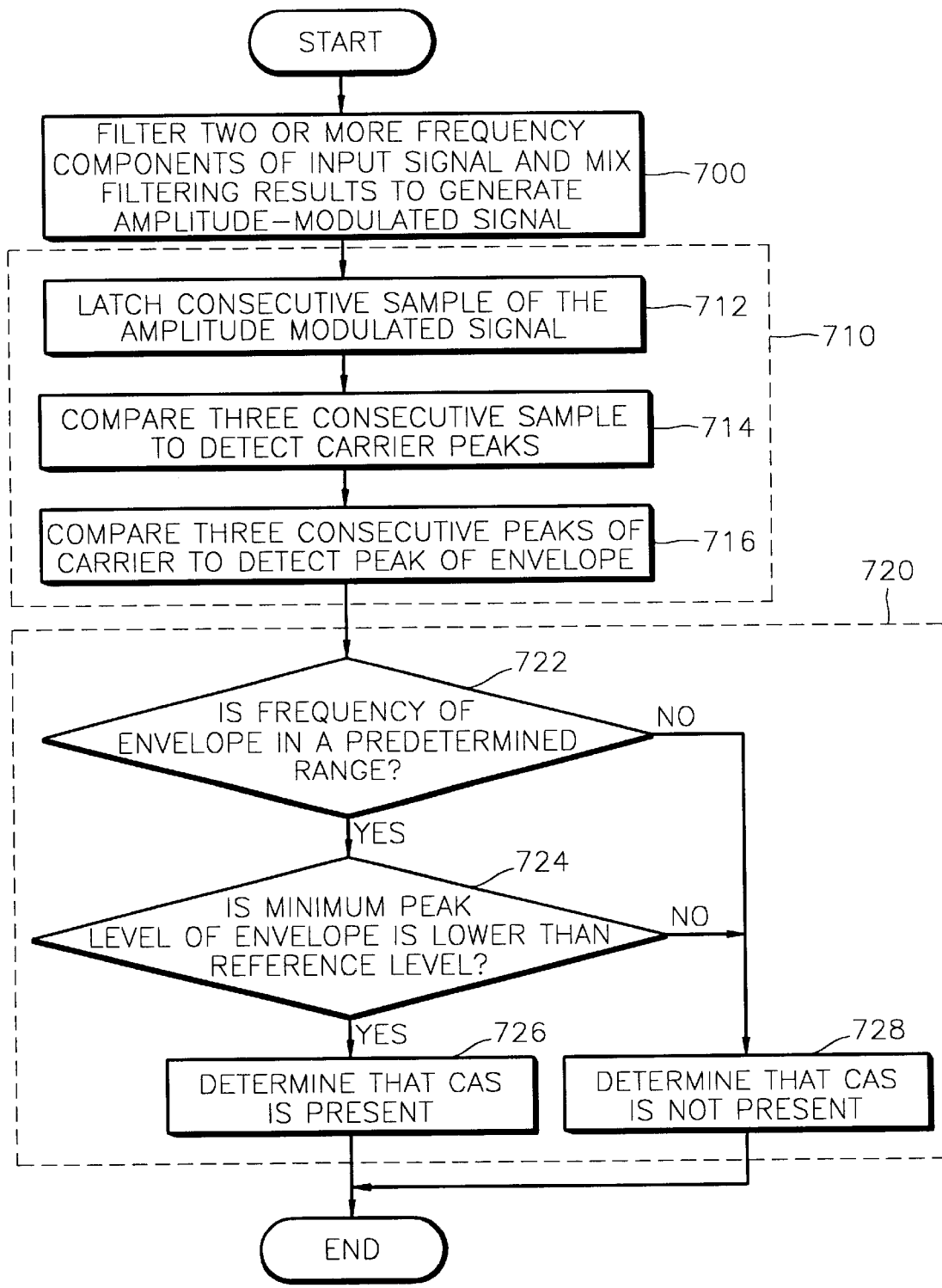
FIG. 19 is a flowchart illustrating a CAS detection method for the CAS detection apparatus of FIG. 14.

FIG. 19 is a flowchart illustrating a CAS detection method for the CAS detection apparatus of FIG. 14. The CAS detection method broadly includes the steps of filtering to extract two or more frequency components of the input signal and mixing the frequency components to generate an amplitude-modulated signal (step 700). The amplitude-modulated signal is detected or analyzed to obtain information regarding an envelope (step 710). Then, the CAS is detected if the frequency and voltage levels of the envelope are within predetermined ranges (step 720).

In detail, mixing unit 600 extracts two frequency components of an input signal IN that a central office applies via a telephone line, and mixes the frequency components to generate an amplitude-modulated signal MOD_IN (step 700). Here, input signal IN may include a voice signal mixed with a CAS, a voice signal alone, or a CAS alone. In step 700, amplitude-modulated signal MOD_IN includes a carrier with frequency about 2.44 KHz and an envelope with peaks at a frequency of about 620 Hz. AM detector 610 receives amplitude-modulated signal MOD_IN and latches a sequence of samples of signal MOD_IN (step 712). Each sample is input to peak detector 410 of AM detector 610, and peak detector 410 compares three samples in sequence to detect peak points of the carrier (step 714). If step 714 detects a peak point, step 716 compares three consecutive peak points of the carrier to detect a maximum or peak of the envelope (step 716). If step 716 detects a peak of the envelope, signal detection unit 620 and CAS discriminator 630 discriminate the frequency and the level of the envelope to determine whether the CAS is present (step 720). That is, frequency discriminator 622 receives maximum level detection signal MAX2 of the envelope to determine whether the frequency of the envelope is in a predetermined range (step 722). In particular, the frequency of maximum level detection signal MAX2 is the same as the frequency of maxima or minima of the envelope. Also, the frequency of maximum level detection signal MAX2 can be divided by two to generate a high level for a cycle and a low level for a next cycle of signal MAX2. Reference clock signal REF_CLK is counted only during the high level of the two-divided signal, and if the count value is between the upper reference limit H_REF and the lower reference limit L_REF, there is a high probability that the CAS is present. Otherwise, it is determined that the CAS is not present (step 728).

If the frequency of the envelope is in the predetermined range, it is determined whether the minimum level of the envelope is less than the reference level MIN_REF (step 724). As described above, level discriminator 624 compares a level decoding result, a reference level MIN_REF, and the level of the minimum peak point of the envelope. If the level of the minimum peak point is less than the reference level MIN_REF, it is determined that the CAS is present (step 726). Also, if the level of the minimum peak point is higher than or equal to the reference level in step 724, it is determined that the CAS is not present (step 728). That is, frequency discrimination signal F_DET from the frequency discriminator 622 of signal detection unit 620 and level discrimination signal L_DET output from level discriminator 624 are both required before CAS discriminator 630 asserts a CAS detection signal CAS_DET.

Figure 20:
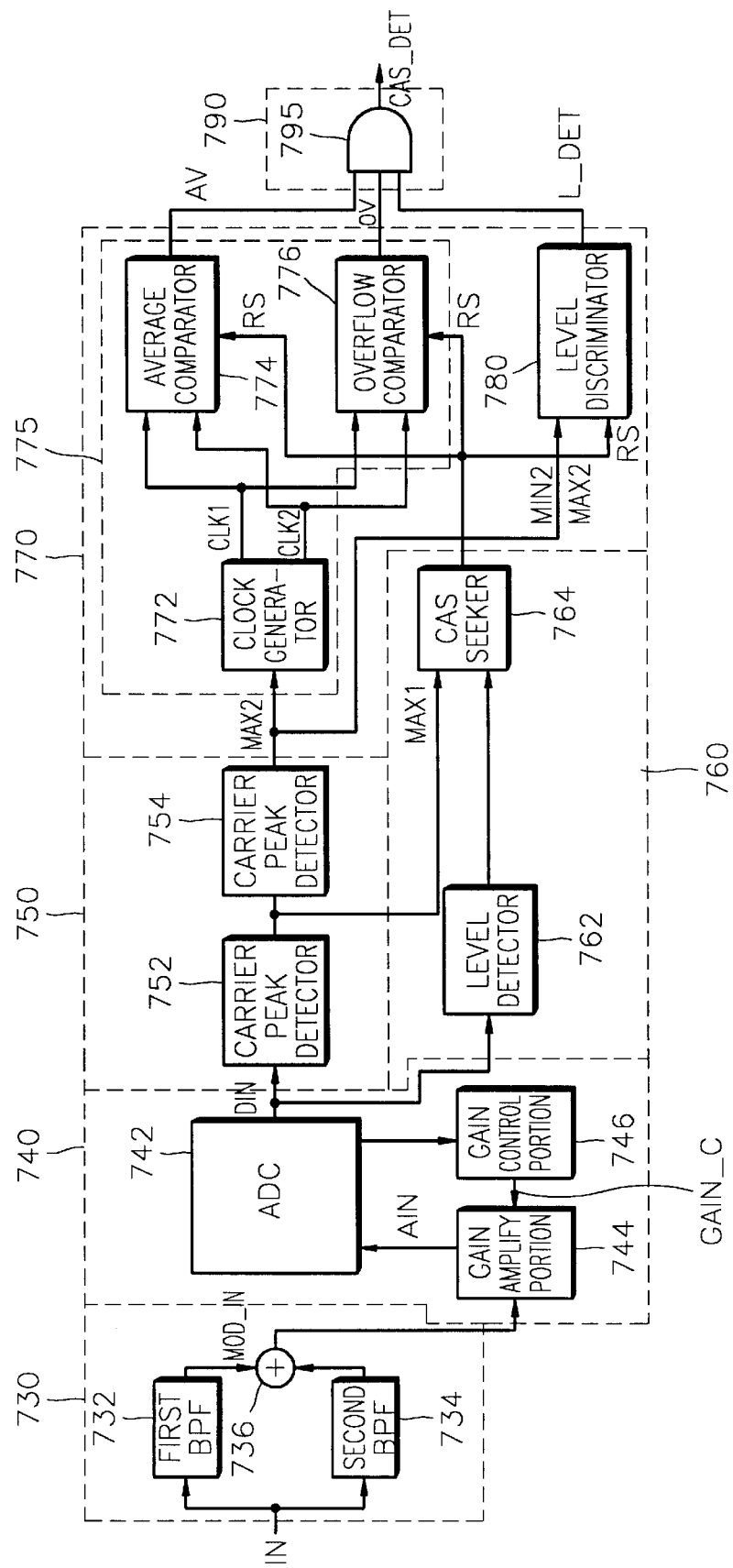
FIG. 20 is a block diagram of a CAS detection apparatus according to still another embodiment of the present invention.

FIG. 20 is a block diagram of a CAS detection apparatus according to still another embodiment of the present invention. The CAS detection apparatus of FIG. 20 includes a mixing unit 730, a signal converting unit 740, an AM detection unit 750, a signal prediction unit 760, a signal detection unit 770, and a CAS discriminator 790. Here, mixing unit 730 includes a first band-pass filter 732, a second band-pass filter 734, and an adder 736. Signal converting unit 740 includes an ADC 742, a gain amplifying portion 744, and a gain control portion 746. AM detection unit 750 includes a carrier peak detector 752 and an envelope level detector 754. Signal prediction unit 760 includes a level detector 762 and a CAS seeker 764. Signal detection unit 770 includes a frequency discriminator 775 and a level discriminator 780. Here, frequency discriminator 775 includes a clock generator 772, an average comparator 774, and an overflow comparator 776. Preferably, CAS discriminator 790 is an AND gate 795.

Mixing unit 730 of FIG. 20 filters an input signal IN to extract a first frequency component and a second frequency component and mixes the frequency components, to generate an amplitude-modulated signal MOD_IN having a carrier and an envelope.

Signal conversion unit 740 automatically adjusts the gain applied to signal MOD_IN from mixing unit 730 to maintain the amplitude of a gain adjusted signal AIN in a range between an upper threshold voltage VTH1 and a lower threshold voltage VTH2. Signal conversion unit 740 also converts gain adjusted signal AIN into a digital signal DIN. Specifically, gain amplifying portion 744 generates analog signal AIN by amplifying amplitude-modulated signal MOD_IN in response to a gain control signal GAIN_C. ADC 742 converts signal AIN into digital signal DIN. Here, digital signal DIN is applied to AM detection unit 750 and gain control portion 746. Gain control portion 746 receives signal DIN from ADC 742 and generates gain control signal GAIN_C that controls the gain for signal MOD_IN of mixing unit 730. The structure of signal conversion unit 740 is further described below with reference to FIGS. 21 through 23.

AM detection unit 750 receives gain adjusted digital signal DIN from signal conversion unit 740 for digital analysis of the envelope of signal MOD_IN. Here, AM detection unit 750 is a digital circuit and can be similar or identical to the AM detector of FIG. 6. In particular, carrier peak detector 752 of AM detection unit 750 can include peak detector 410 and shifting unit 420 of FIG. 6, and envelope level detector 754 can include maximum/minimum level detector 420 and shifting unit 440.

Signal prediction unit 760 determines whether the level of the gain adjusted digital signal DIN is higher than a threshold level and measures the time for which the carrier remains at sufficient levels to suggest the presence of the CAS in signal IN. In detail, level detector 762 detects whether the peak level of digital signal DIN is higher than the threshold level. CAS seeker 764 detects the peak of the carrier for a predetermined period in response to the detection result of level detector 762, and predicts from the detection result whether the CAS is present. In particular, when peak detection signal MAX1 is asserted at a constant frequency for 5 ms, CAS seeker 764 predicts that the CAS is present. Preferably, ten consecutive peaks of the carrier occurring at a frequency of 2440 Hz indicate a component at least similar to the CAS. Here, the output signal of CAS seeker 764 acts as a reset signal RS that initializes average comparator 774 and overflow comparator 776 of the frequency discriminator 775 and level discriminator 780.

Signal detection unit 770 determines whether or not the frequency of the envelope detected by AM detection unit 750 is in a predetermined range associated with a CAS. Signal detection unit 770 also determines whether or not the level difference between maximum and minimum levels of the envelope is in a predetermined range associated with a CAS. In particular, clock generator 772 receives maximum level detection signal MAX2, which marks peaks of the envelope, and divides the frequency of signal MAX2 by a predetermined divisor to generate a first clock signal CLK1. Clock generator 772 also divides an external clock signal by a predetermined divisor to generate a second clock signal CLK2. Average comparator 774, which resets in response to reset signal RS from CAS seeker 764, counts periods of second clock signal CLK2 while first clock signal CLK1 remains at a fixed voltage (e.g., high) and calculates the average of the counts for several periods of first clock signal CLK1. Average comparator 774 determines whether the count average is between a first reference value REF1 and a second reference value REF2 that are boundaries of the frequency range characteristic of the CAS. If the average frequency is in the frequency range, average comparator assert a signal AV.

Overflow comparator 776, which is also reset in response to reset signal RS, counts periods of second clock signal CLK2 that occur while first clock signal CLK1 enables counting but after the count for a period has reach a predetermined limit. Overflow comparator 776 determines whether the total overflow for a set of periods is less than or equal to a third reference value REF3. If the overflow is less than the third reference value REF3, overflow comparator 776 asserts a signal OV to indicate that the overflow is below an acceptable level.

Level discriminator 780, which is reset in response to reset signal RS, calculates the difference between maximum peak MAX2 and minimum peak MIN2 and determines whether the difference between the maximum and minimum peaks is less than or equal to a fourth reference value REF4. Level discriminator 780 asserts a level discrimination signal L_DET to indicate the level difference suggests the presence of a CAS. Level discriminator 780 can be implemented in the same manner as level discriminator 624 of FIG. 14. The operation of the frequency discriminator and the level discriminator are further described below with reference to FIGS. 25 and 26.

CAS discriminator 790 receives average signal AV from average comparator 774, overflow signal OV from overflow comparator 776, and level discrimination signal L_DET from level discriminator 780, and if all of signals AV, OV, and L_DET are asserted (high), CAS discriminator 790 asserts a CAS detection signal CAS_DET. In FIG. 20, CAS discriminator 790 of FIG. 20 is an AND gate 795. However, CAS discriminator 790 can be other combinations of other logic gates.

As described above, the CAS detection apparatus of FIG. 20 performs automatic gain control and CAS prediction that the CAS detection apparatus of FIG. 14 does not perform. The automatic gain control of the CAS detection apparatus of FIG. 20 keeps the signal output from ADC 742 within a known range to enhance the process efficiency in the following blocks. Also, the CAS detection apparatus of FIG. 20 simultaneously detects the CAS using the average and dispersion of the envelope frequency, the difference between the maximum and minimum levels, and duration of CAS occurrence to make CAS detection more accurate.

Figure 21:
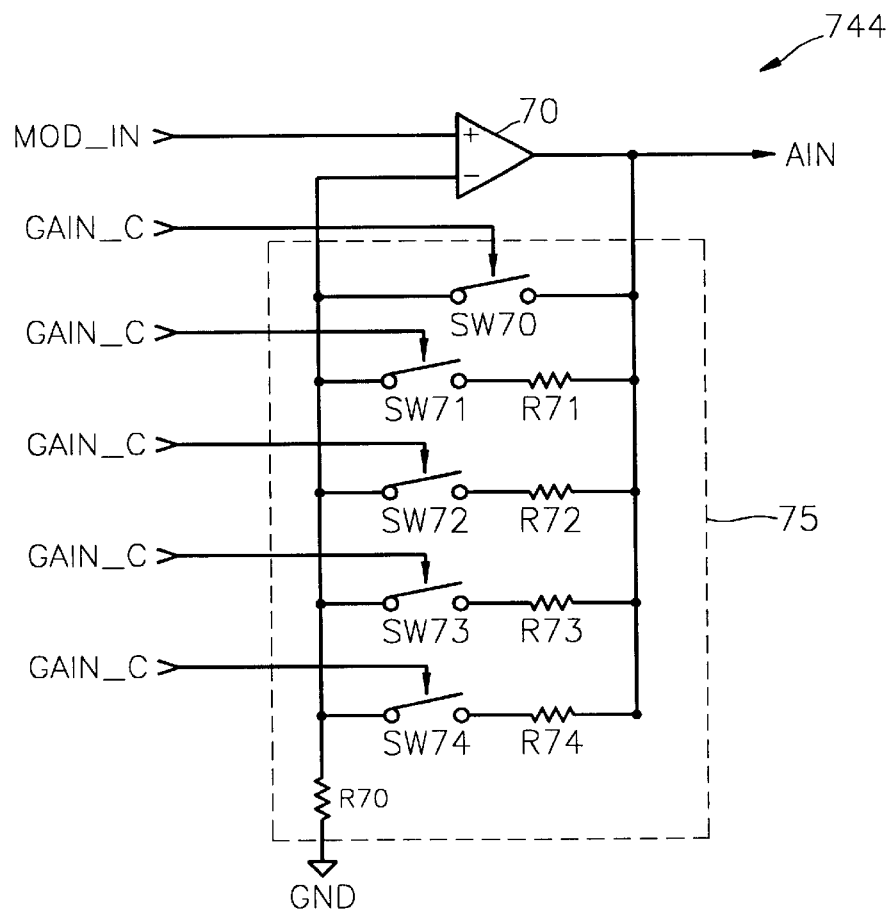
FIG. 21 is a circuit diagram of a gain amplifying portion in the CAS detection apparatus of FIG. 20.

FIG. 21 is a circuit diagram of an embodiment of gain amplifying portion 744 of the signal conversion unit 740 of FIG. 20. Gain amplifying portion 744 includes an amplifier 70 and a variable resistance portion 75. Here, variable resistance portion 75 includes switches SW70 through SW74 and resistors R70 through R74. Mixing unit 730 applies signal MOD_IN to a positive (+) input port of amplifier 70, and a negative (−) input port of amplifier 70 connects to first ends of switches SW70 through SW74 in variable resistance portion 75. Resistors R71 to R74 are between an output port of amplifier 70 and the other ends of switches SW71 through SW74, respectively. Resistor R70 is between the negative input port (−) of amplifier 70 and a ground GND. Resistors R71 through R74 can be implemented with different resistances. According to the embodiment of FIG. 21, gain control signal GAIN_C is a 5-bit signal where each bit controls the state of a corresponding one of switches SW70 to SW74. More generally, signal GAIN_C can be an N-bit signal.

In gain amplifying portion 744, resistances of resistors R70 to R74 are selected to provide a variety different feedback resistances for amplifier 70 in response to the 5-bit gain control signal GAIN_C, and the output level of the amplifier 70 is depends on the feedback resistance that signal GAIN_C selects.

In variable resistance portion 75, switches SW70 through SW74 switch on or off in response to gain control signal GAIN_C, and the feedback resistance depends on which of the switches SW70 to SW74 are on. Thus, the feedback resistance between the negative (−) input port and the output port of amplifier 70 can be varied to change the voltage gain of amplifier 70. As a result, the gain of output signal AIN also changes. For example, assuming that gain control signal GAIN_C from the gain control portion 746 represents the 5-bit value 00010b, the feedback resistance is the sum of the resistance of resistors R70 and R71. A 5-bit gain control signal can automatically select from among the different output gains for amplifier 70.

The CAS detection apparatus of FIG. 20 sets gain amplifying portion 744 to a gain selected according to the amplitude of signal AIN. Gain amplifying portion 744 of the present invention controls the gain according to each interval of the dynamic range of ADC 742. When the output gain of amplifier 70 is adjusted, gain adjusted signal AIN is applied to ADC 742, converted into digital signal DIN and then applied to AM detection unit 750.

Figure 22:
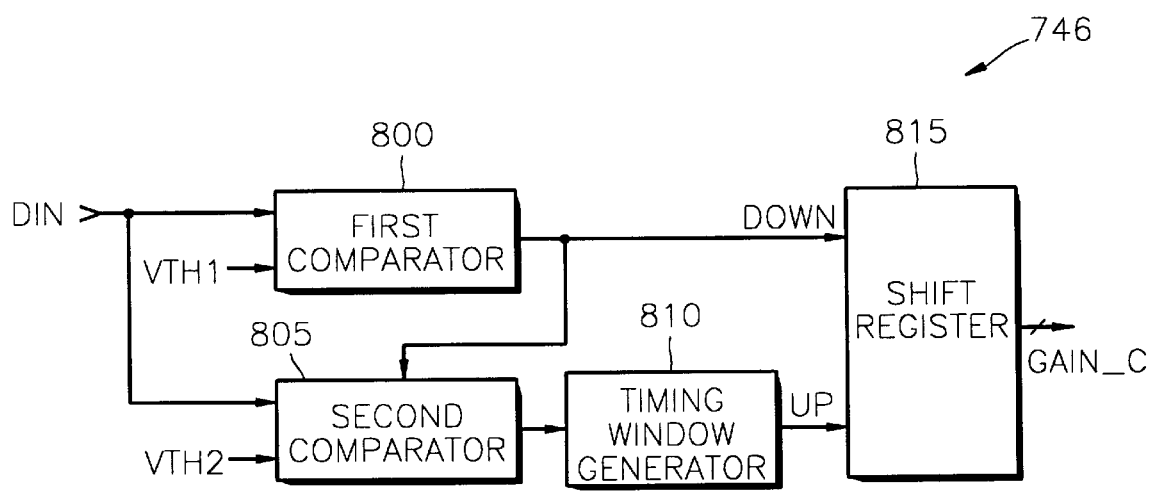
FIG. 22 is a block diagram of a gain control portion of the CAS detection apparatus of FIG. 20.

FIG. 22 is a block diagram of gain control portion 746 of the CAS detection apparatus shown in FIG. 20. Gain control portion 746 includes a first comparator 800, a second comparator 805, a timing window generator 810, and a shift register 815. Comparator 800 receives digital signal DIN from ADC 742, compares signal DIN to a first threshold value VTH1, and generates a gain decrease signal DOWN in response to the comparison result. In particular, if signal DIN represents a value greater than threshold value VTH1, comparator 800 asserts signal DOWN to indicate that gain should be decreased.

Comparator 805 receives signal DIN from ADC 742, compares signal DIN to a second threshold value VTH2, and outputs the comparison result to timing window generator 810. In particular, comparator 805 asserts signal to indicate signal DIN represents a value less than threshold value VTH2. Timing window generator 810 detects the output signal of comparator 805 only if signal DIN indicates an AM signal is present. If the AM signal is present and has an amplitude less than second threshold value VTH2, timing window generator 810 generates a gain increase signal UP. To determine that the amplitude is less than threshold value VTH2, timing window generator waits for a period greater than about one period of the envelope and asserts gain increase signal UP only if signal DIN remains less than threshold value during the entire wait.

Shift register 815 shifts a stored value to the right or left in response to gain decrease signal DOWN and gain increase signal UP and outputs the result as gain control signal GAIN_C.

Figure 23:
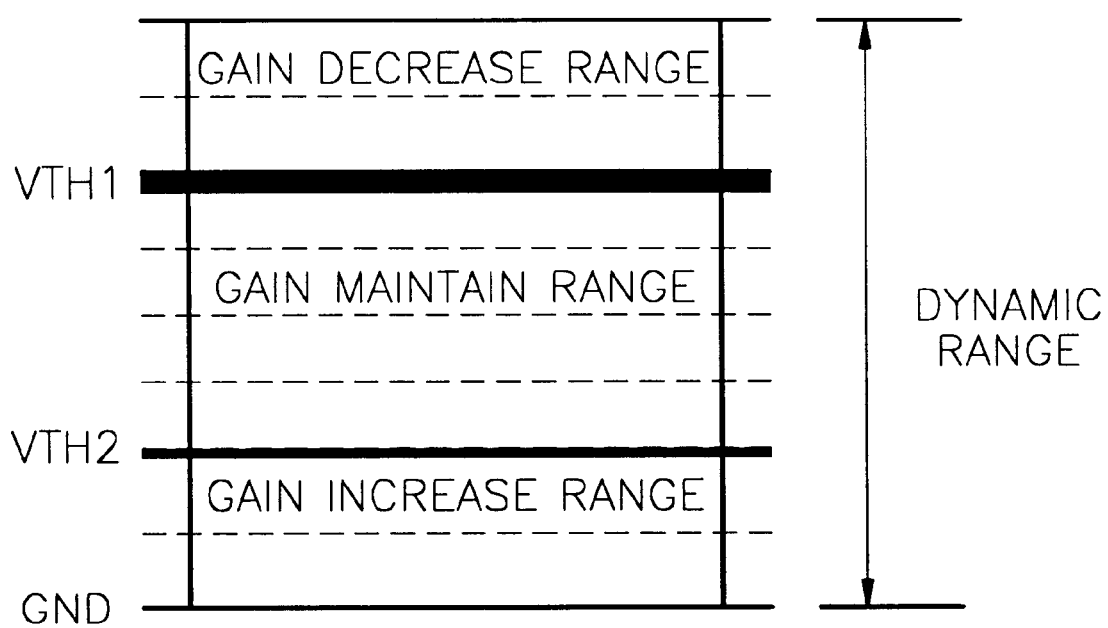
FIG. 23 is a diagram showing the dynamic range of the gain control portion of FIG. 22.

FIG. 23 is a diagram showing the dynamic range of input voltages to ADC 742 of FIG. 20. As shown in FIG. 23, a gain increase range is between ground GND and a threshold voltage VTH2. A gain maintain range is between second threshold voltage VTH2 and a threshold voltage VTH1, and a gain decrease range is above first threshold voltage VTH1. When the voltage of signal MOD_IN of the mixing unit 730 is too low or high, gain control portion 744 automatically limits or boosts the voltage of signal AIN to keep the voltage of signal AIN in the gain maintain range of FIG. 23. Accordingly signal conversion unit 740 of the CAS detection apparatus of FIG. 20 keeps signal AIN in the proper voltage range for the input of ADC 742. Thus, in the CAS detection apparatus of FIG. 20 where analog and digital signals are mixed, the dynamic range of the signal processed in a block such as ADC 742 may be restricted for proper operation.

Alternatively, the gain can be automatically controlled in an analog manner. For example, in an AC to DC conversion, current of an input signal is controlled and fed back to rectify the AC signal, and the rectified signal is compared to a predetermined constant-voltage by converting the difference in voltage into a current. Here, the current acts as a control current for control of the output gain. Implementing an automatic gain control circuit as above is useful when all the signal processing is performed on analog signals. However, in the case using both analog and digital signals, analog automatic gain control greatly increases the size of the circuit. Thus, FIGS. 21 and 23 illustrate a more efficient automatic gain control circuit using the given ADC 742. Thus, a desirable aspect of the present invention is that the gain is digitally controlled.

In view of FIG. 23, the automatic gain control operation of the signal conversion unit 740 can be further described with reference to FIGS. 21 through 23. In particular, gain control signal GAIN_C controls the gain of gain amplify portion 744 which receives signal MOD_IN from mixing unit 730 of FIG. 20, and gain control portion 746 sets signal GAIN_C and the gain according to the digital output of ADC 742. Here, setting signal GAIN_C is related to the gain control ranges of FIG. 23. For example, if the gain maintain range is narrow, the performance of the gain control portion 746 is enhanced if gain amplify unit 744 has a large number of different gain states. On the other hand, if the gain maintain interval is wide, the number of the gain states of gain amplifying portion 744 can be smaller. Thus, when implement gain control portion 746, consideration of the dynamic range of ADC 742 and the gain maintain interval is important.

In FIG. 22, first threshold value VTH1 is set to three times second threshold value VTH2 to provide a dynamic range of 40 dB, and the number of gain states of gain amplifying portion 744 is five, i.e., 5-bit gain control signal GAIN_C [4:0] selects one of five gains for gain amplifying portion 744. Here, each bit of gain control signal GAIN_C turns on a corresponding switch in resistance change portion 75.

Thus, the feedback resistance of amplifier 70 depends on the resistances of one or more resistors connected to the on-switches. For example, if a sine wave is input to amplifier 70, ADC 742 converts the sine wave into digital samples at an interval that a sampling clock determines. Comparator 800 generates a gain decrease signal DOWN when the sine wave is near a peak that causes data signal DIN to represent a voltage higher than the first threshold voltage VTH1. In response to the gain decrease signal DOWN, shift register 815 shifts a stored value to decrease the value of gain control signal GAIN_C. The shift value is output as gain control signal GAIN_C of gain amplifying portion 744 which responds by reducing the amplification of signal MOD_IN.

On the other hand, when signal DIN represents a voltage lower than the second threshold voltage VTH2, signal AIN input to ADC 742 may be near a minimum of the sine wave, or the amplitude of signal AIN may be too low. Thus, the gain does not immediately increase when the second comparator 805 detects a sample below value VTH2. Instead, timing window generator 810 monitors the output of second comparator 805 for a predetermined period. Preferably, the predetermined period is equal to one cycle of the envelope of signal MOD_IN from mixing unit 730. Also, the predetermined period is a period during which the signal processed in ADC 742 is present. Thus, if a sample DIN higher than second threshold value VTH2 does not appear during the predetermined monitoring period, the original signal AIN is regarded as too low, and timing window generator 810 generates gain increase signal UP. Here, shift register 815 shifts the current data so that when the shifted value of gain control signal GAIN_C is applied, gain amplifying portion 744 increases the gain. However, if a sample DIN with a value higher than the second threshold value VTH2 appears during the predetermined period, timing window generator 810 determines that asserting the gain increase signal UP is not necessary.

Figures 24A, 24B, 24C:
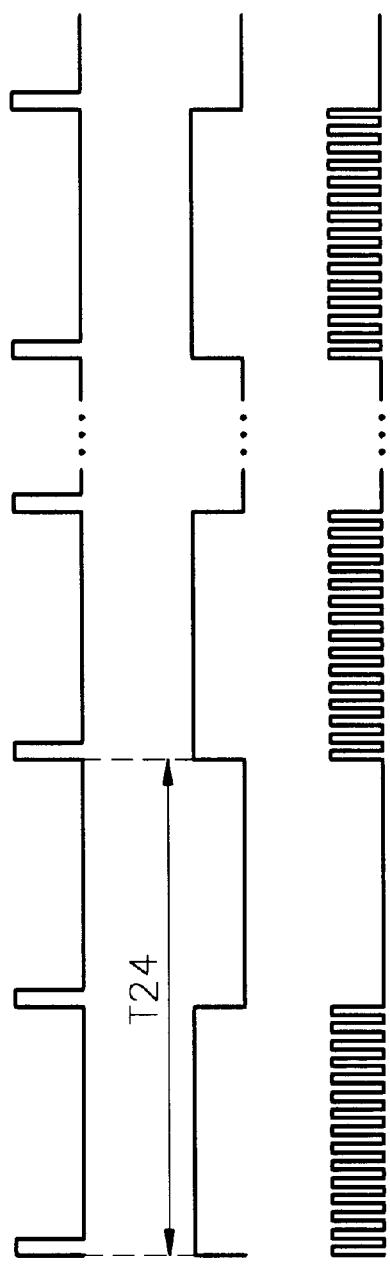
FIGS. 24A, 24B, and 24C show waveforms of the output signals from a clock generator in the CAS detection apparatus of FIG. 20.

FIGS. 24A and 24C are timing diagrams illustrating the operation of clock generator 772 of FIG. 20. FIG. 24A represents a maximum level detection signal MAX2 for an envelope detected by AM detection unit 750, FIG. 24B represents a first clock signal CLK1, and FIG. 24C represents second clock signal CLK2. First clock signal CLK1 and second clock signal CLK2 are similar to count enable signal CNT_EN and reference clock REF_CK of FIG. 13, respectively.

Maximum level detection signal MAX2 of FIG. 24A is a 620 Hz signal for a CAS, and first clock signal CLK1 of FIG. 24B has a frequency that is half the frequency of maximum level detection signal MAX2. First clock signal CLK1 remains high for 1.613 ms, which is one period of detection signal MAX2. A period T24 of first clock signal CLK1 is 2*1.623 ms or about 3.246 ms. Second clock signal CLK2 derived from an external oscillator signal and has a frequency that is a predetermined ratio of the frequency of the external oscillator. For FIG. 24C, the external oscillator signal has a frequency of 3.58 MHz, and the period of second clock signal CLK2 is 35.75 µs. Second clock signal CLK2 is enabled and counted only during the intervals when first clock signal CLK1 is high. Clock signals CLK1 and CLK2 are applied to average comparator 774 and overflow comparator 776 of frequency discriminator 775 and used to discriminate the frequency of the CAS.

Average comparator 774 and overflow comparator 776 of FIG. 20 include counters, and the frequency of the CAS is discriminated by calculating the average period of the envelope and the dispersion by the overflow.

Average comparator 774 resets in response to reset signal RS output from CAS seeker 764. To measure the period of the envelope, second clock signal CLK2 is counted for a predetermined number of periods of signal MAX2 which occur when clock signal CLK1 is high. An average count per period is calculated, and a determination is made as to whether the average count converges to a count corresponding the frequency of the envelope resulting from a CAS. If the average converges a count corresponding to 620 Hz for signal MAX2, the CAS is identified. Referring to FIG. 24, maximum level detection signal MAX2 has a constant frequency of 620 Hz for a CAS, and the count of second clock signals CLK2 is about 45.1 during each interval when first clock signal CLK1 is high. However, due to noise, the count of second clock signal CLK2 can be larger or smaller than 45.1 in any particular cycle. However, the average should nearly converge on 45.1 (the count corresponding to frequency 620 Hz) if CAS is present in the input signal. One specific embodiment counts pulses of second clock signals CLK2 during nineteen half periods of first clock signal CLK1 are generated. Thus, the total time required for determining the average is about 60 ms, and the total count of periods of second clock signals CLK2 is 857 for an average 45.1 per period of signal MAX2. With this target total count, upper and lower limits for the total count can be set to provide suitable error margins. Preferably, the lower limit in a total count number corresponding to a CAS is about 760, and the upper limit is about 959.

Figure 25:
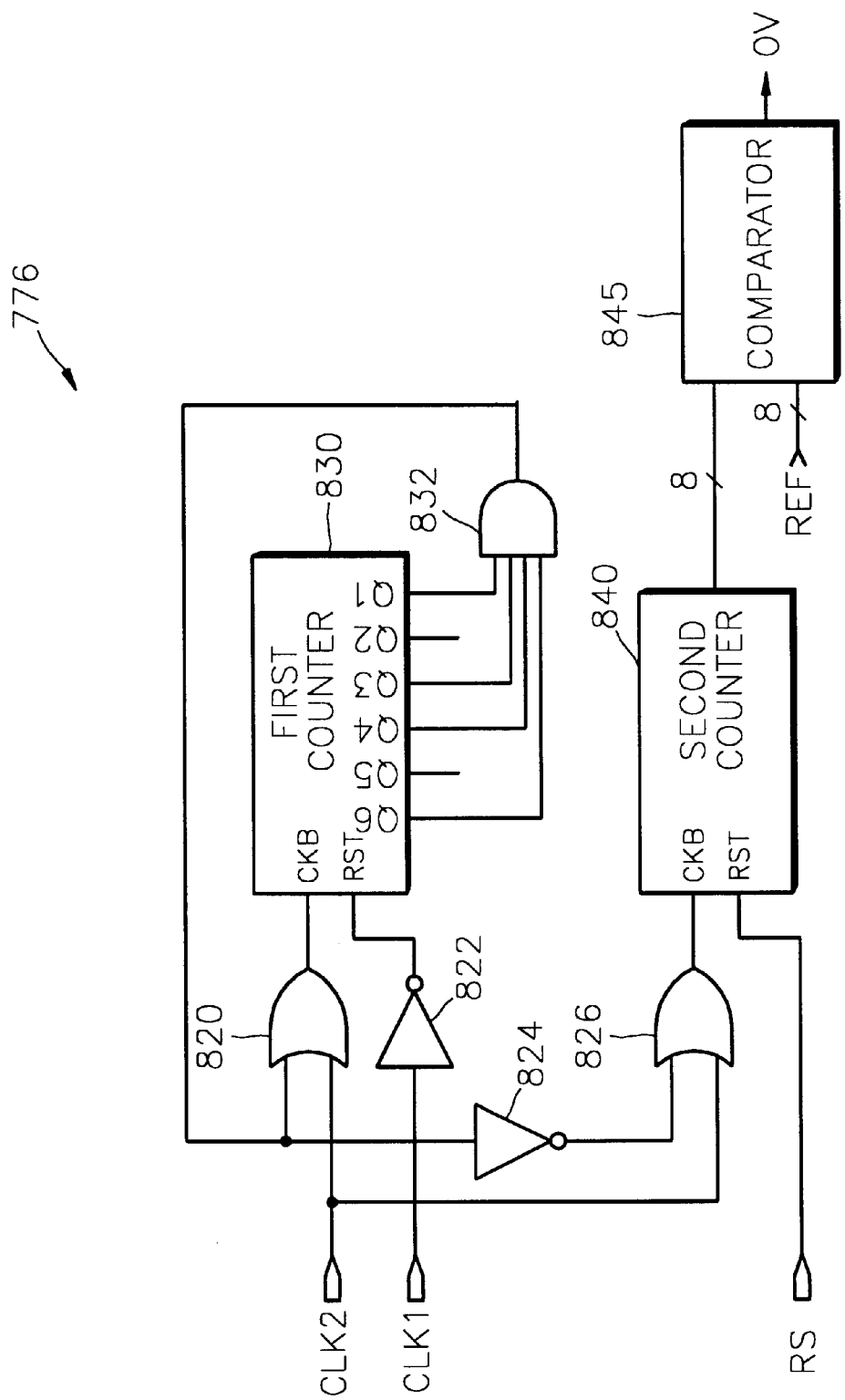
FIG. 25 is a circuit diagram of an overflow comparator of the CAS detection apparatus of FIG. 20.

FIG. 25 is a circuit diagram of overflow comparator 776 of the frequency discriminator 775 shown in FIG. 20. As shown in FIG. 25, overflow comparator 776 includes a first OR gate 820, first and second inverters 822 and 824, a second OR gate 826, first and second counters 830 and 840, an AND gate 832, and a comparator 845. When the count during an interval when first clock signal CLK1 is high exceeds the predetermined limit, overflow comparator 776 accumulates the overflow. This allows overflow comparator 776 to calculate the dispersion in the period of the envelope and determine whether CAS is mixed with noise. Here, calculating the dispersion of the envelope can detect noise that happens to cause the total count to converge on the count corresponding to 620 KHz.

OR gate 820 of FIG. 25 performs an OR operation on second clock signal CLK2 from clock generator 772 and the output signal of AND gate 832, to generate a clock signal CKB for counter 830. Inverter 822 inverts the first clock signal CLK1 to generate a reset signal RST for counter 830. Thus, counter 830 resets in response to first clock signal CLK1 and counts periods of count clock signal CKB from OR gate 820 during a period of signal MAX2 before being reset again. Specific bits from the count of counter 830 are applied to AND gate 832. The output signal from AND gate 832 remains low until the count from counter 830 reaches a predetermined value. When the output signal from AND gate 832 is high, the output signal from OR gate 820 remains high and stops counter from counting further. Inverter 824 inverts the output signal from AND gate 832.

OR gate 826 performs an OR operation on the output signal of inverter 832 and clock signal CLK2, to generate a count clock signal CKB for counter 840. Clock signal CKB only begins oscillating after the count from counter 830 reaches the count that causes the output signal from AND gate 832 to be high. Counter 840 resets in response to reset signal RS from CAS seeker 764 and counts pulses in the output signal of OR gate 826 to generate a multi-bit count. Comparator 845 compares the count from counter 840 to a reference value REF and generates an overflow detection signal OV to indicate whether the output count from counter 840 is less than or equal to reference value REF.

More specifically, counter 830 of overflow comparator 776 starts counting clock signal CLK2 when clock signal CLK1 enables counter 830. In FIG. 25, the count from counter 830 has six bits Q1 through Q6. If the count result of the first counter 830 reaches a predetermined value, preferably 45 (101101), the output signal of AND gate 832 becomes high. The value 45 is a reference for the target count during an interval when clock signal CLK1 is high. Counter 840, which is reset in response to the reset signal RS from the CAS seeker 764, starts to count clock signal CLK2 after the count of counter 830 reaches 45. Counter 840 accumulates counts the overflow pulses of clock signal CLK2 for several periods of signal MAX2. Comparator 845 compares the accumulated count from counter 840 with reference value REF and asserts overflow detection signal OV if the count value is equal to or less than reference value REF. Accordingly, the frequency of the CAS is discriminated by calculating the dispersion with the overflow, and thus the presence of the CAS is more accurately detected. In the CAS detection apparatus according to the present invention, a smaller overflow or count from counter 840 indicates a purer CAS.

The frequency discriminator 775 of FIG. 20 may be implemented with the same structure as in FIG. 13.

Figure 26:
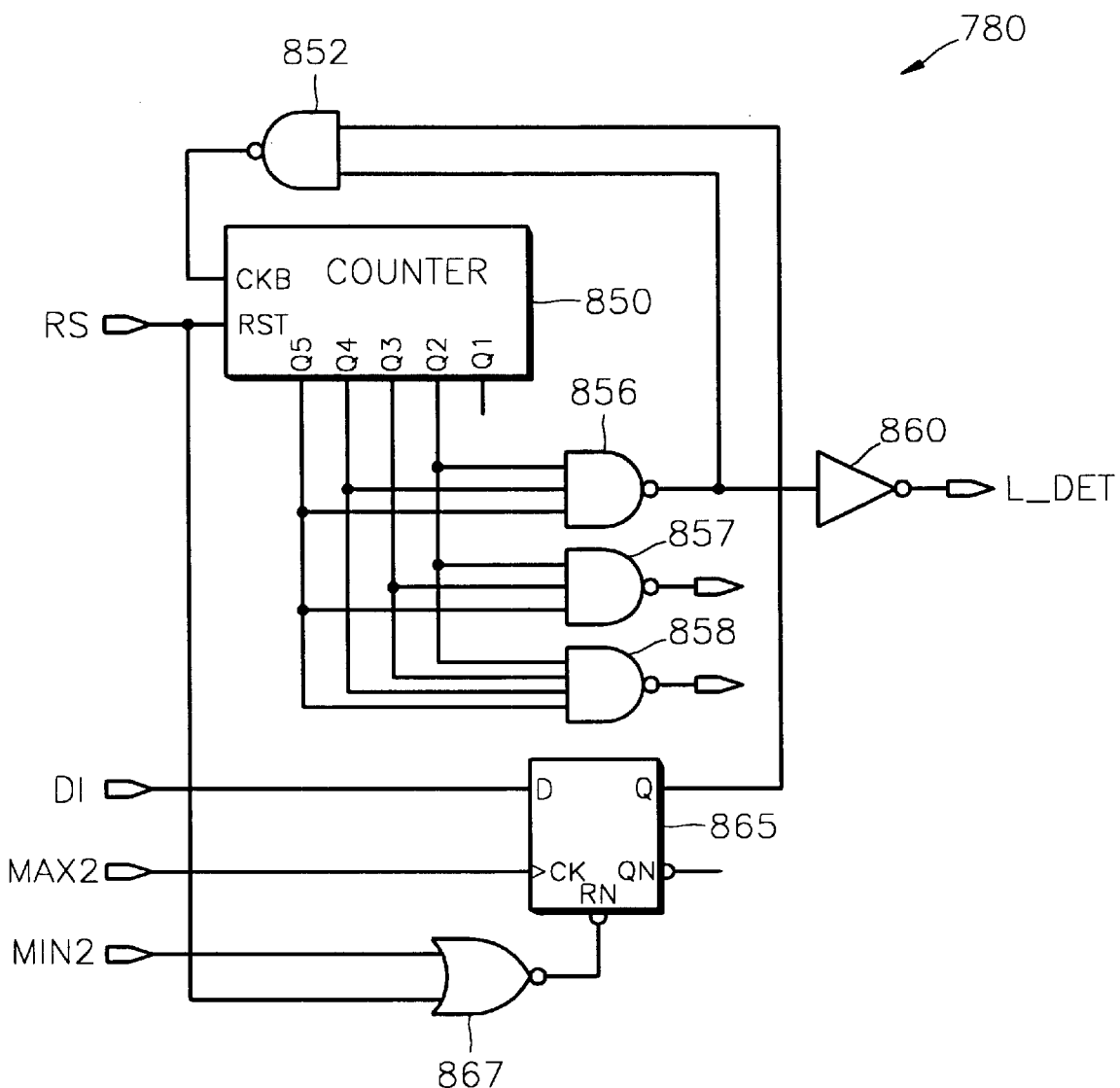
FIG. 26 is a circuit diagram of a level discriminator in the CAS detection apparatus of FIG. 20.

FIG. 26 is a circuit diagram of an embodiment of level discriminator 780. In FIG. 26, level discriminator 780 includes a counter 850, NAND gates 852, 856, 857, and 858, a flip-flop 865, a NOR gate 867, and an inverter 860. The level discriminator 780 of FIG. 26 is implemented for a specific case of a constant reference value. However, level discriminator 780 may use a reference value that varies according to the maximum peak level of the carrier as in FIG. 16.

Counter 850 of FIG. 26 resets in response to reset signal RS and starts to count pulses from the output signal of NAND gate 852 as a count clock signal. Here, the count is output as a multi-bit data signal. Selected bits of the count from counter 850 can be applied one of NAND gates 856, 857, and 858 depending on the desired design. NAND gates 856, 857, and 858 receive different bits output from counter 850, and each of NAND gate 856, 857, and 858 switches from a high output signal to a low output signal when counter 850 reaches a corresponding count. As explained further below, output accuracy can be different depending on which of NAND gates 856, 857, and 858 is selected for use. Flip-flop 865 receives a signal DI via a data input, and receives maximum level detection signal MAX2 from AM detection unit 750 as a clock signal CK. Here, signal DI is high when the minimum peak level of the envelope is smaller than the half of the maximum peak level. Thus, flip-flop 865 receives as a clock signal maximum level detection signal MAX2 for an envelope to generate an output signal Q. NOR gate 867 performs a NOR operation on reset signal RS and minimum level detection signal MIN2 and applies the result as a reset signal RN of flip-flop 865. Output signal Q from flip-flop 865 is applied to NAND gate 852, which generates clock signal CKB for counter 850. NAND gate 852 performs a NAND operation on signal Q and the output signal of NAND gate 856. The output signal of NAND gate 856 is also inverted by inverter 860 to generated maximum/minimum level difference detection signal L_DET, which acts as the level discrimination signal L_DET of FIG. 14.

When CAS seeker 764 asserts reset signal RS, counter 852 and flip-flop 865 reset. Flip-flop 865 generates the high level of output signal Q at the falling edge of maximum peak MAX2 when data signal DI is a logic high (i.e., when the minimum peak level of the envelope is smaller than the half of the maximum peak level). Counter 850 counts the low-to-high transitions in signal Q. Thus, level discriminator 780 increases the count in counter 850 each time the minimum peak occurs as indicated by signal MIN2 resetting flip-flop 865 and is smaller than the half of the maximum peak of the envelope as indicated by signal DI being high. When the count value is equal to or greater than a reference value corresponding to the bits of the count coupled to NAND gate 856, inverter asserts maximum/minimum level difference detection signal L_DET to logic high. Level discriminator 780 continues to detect the minimum peaks smaller than the reference level for about 60 ms during the CAS detection. Here, the detection period corresponds to 19 periods of clock signal CLK1. When the count of the minimum peaks is greater than or equal to the reference value, the input signal is detected as including a CAS.

As described above, the CAS detection apparatus of FIG. 20 indicates the presence of CAS when all or the three conditions are satisfied. The three conditions includes the average of the count values for the envelope period or frequency being in the acceptable range, the dispersion of the envelope frequency calculated from the overflow being less than a required threshold, and the maximum/minimum level difference being greater than a required difference. When signals AV, OV, and L_DET indicate all the three conditions are satisfied, CAS discriminator 790 generates a logic high CAS detection signal CAS_DET.

Figure 27A:
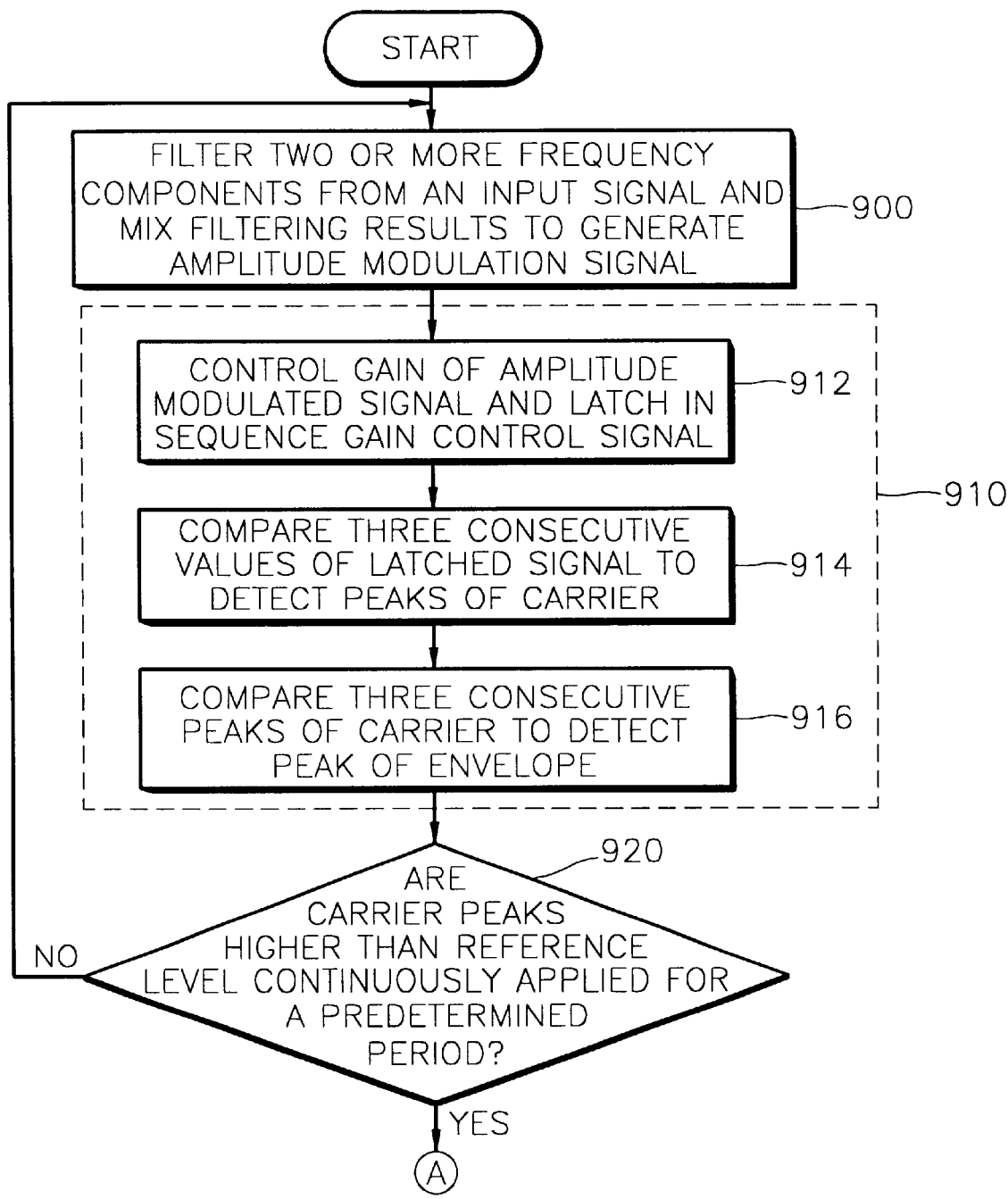
FIG. 27A and FIG. 27B, is a flowchart illustrating a CAS detection method for the CAS detection apparatus of FIG. 20.
Figure 27B:
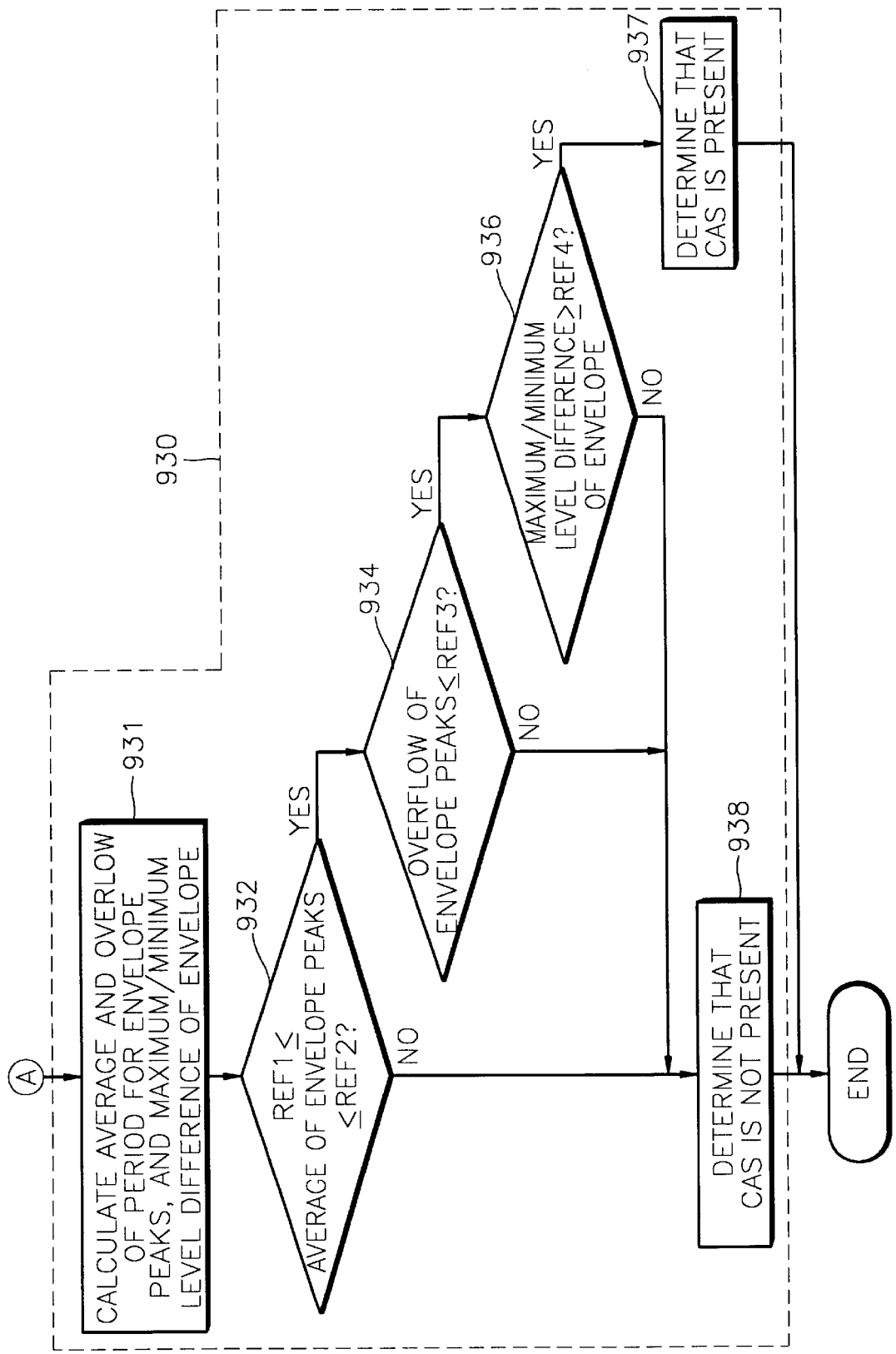

FIG. 27, which divided into parts labeled FIG. 27A and FIG. 27B, is a flowchart illustrating a detection method for the CAS detection apparatus of FIG. 20. The method broadly includes the steps of filtering an input signal to extract and mix two or more frequency components that together form an amplitude-modulated signal (step 900); analyzing the amplitude-modulated signal to measure the envelope (step 910); detecting whether peaks of the carrier, which are higher than a predetermined voltage, are applied continuously for a predetermined period, to predict whether the CAS is present (step 920); and discriminating the frequency and the level of the CAS from the envelope measurements to determine whether the CAS is present (step 930).

In detail, mixing unit 730 filters different two frequency components from an input signal IN received via a telephone line from a central office, and mixes the frequency components to generate an amplitude-modulated signal MOD_IN (step 900). In the step 900, the amplitude-modulated signal MOD_IN includes a carrier having frequency 2.44 KHz (the sum of the frequencies of dual tones for the CAS) and an envelope causing maximum peaks to reoccur at a frequency of about 620 Hz which is according to the difference between the frequencies of the tones. Amplitude-modulated signal MOD_IN is input to signal conversion unit 740, and gain control portion 746 automatically adjusts the amplification of signal MOD_IN to keep an analog gain controlled signal AIN in a proper voltage range. ADC 742 converts gain controlled signal AIN into a digital signal DIN and applies digital signal DIN to AM detection unit 750. AM detection unit 750 receives digital signal DIN, and latches a sequence of values of digital signal DIN in response to a latch clock signal (step 912). Here, the latched sequence of values is input to carrier peak detector 752 of AM detection unit 750, and carrier peak detector 752 compares the latched values to detect a peak in the carrier (step 914).

When the peak of the carrier is detected in the step 914, envelope peak detector 754 compares three consecutive peaks of the carrier to detect a peak of the envelope (step 916).

Signal prediction unit 760 determines whether the peaks of the carrier are continuously higher than a predetermined level for a predetermined interval (step 920). Here, the predetermined interval is about 5 ms, and preferably corresponds to the interval during which about ten peaks of the carrier occur. Also, the maximum level detection signal MAX2 of the envelope which step 920 detects is used to generate a first clock signal CLK1. When the peaks of the carrier are continuously applied for a predetermined period, step 920 predicts that the CAS is present. In response, CAS seeker 764 generates reset signal RS to reset average comparator 774, overflow comparator 776, and level discriminator 780, which are implemented with counters; and then average comparator 774, overflow comparator 776 and level discriminator 780 starts to count. In particular, when step 920 predicts the existence of the CAS, average comparator 744 and overflow comparator 776 calculate the average and the overflow of periods of the envelope, and level discriminator 780 calculates the difference between the maximum and minimum peak levels of the envelope (step 930).

More specifically, average comparator 774 counts second clock signals CLK2 when clock signal CLK1 is high during a predetermined period, and calculates the average of the count values for each interval when clock signal CLK1 is high. Here, average comparator 774 detects whether the calculated average is between a first reference value (REF1) and a second reference value REF2 (step 932). If the average is between the first reference value REF1 and the second reference value REF2, step 934 determines whether the overflow of the envelope is less than or equal to a third reference value REF3. If the average of the envelope is not between the first and second reference values REF1 and REF2, step 938 determines that the CAS is not present in the input signal. Also, when the accumulated overflow of measured periods of the envelope is less than or equal to third reference value REF3, step 936 determines whether the maximum/minimum level difference of the envelope is larger than or equal to a fourth reference value REF4. If the overflow of the envelope is larger than the third reference value REF3, step 938 determines that the CAS is not present in the input signal.

If the maximum/minimum level difference of the envelope is larger than or equal to fourth reference value REF4, step 937 determines that the CAS is mixed with the input signal. Here, detecting the CAS requires around 75 ms, and the overall process requires about 80 ms with 5 ms required to predict the CAS in CAS seeker 764 and 75 ms for the actual CAS detection. About 10 ms of the 75 ms, depending on the sampling rate of ADC 742, is for gain control portion 746 in signal conversion unit 740 to internally control gain.

Figure 28:
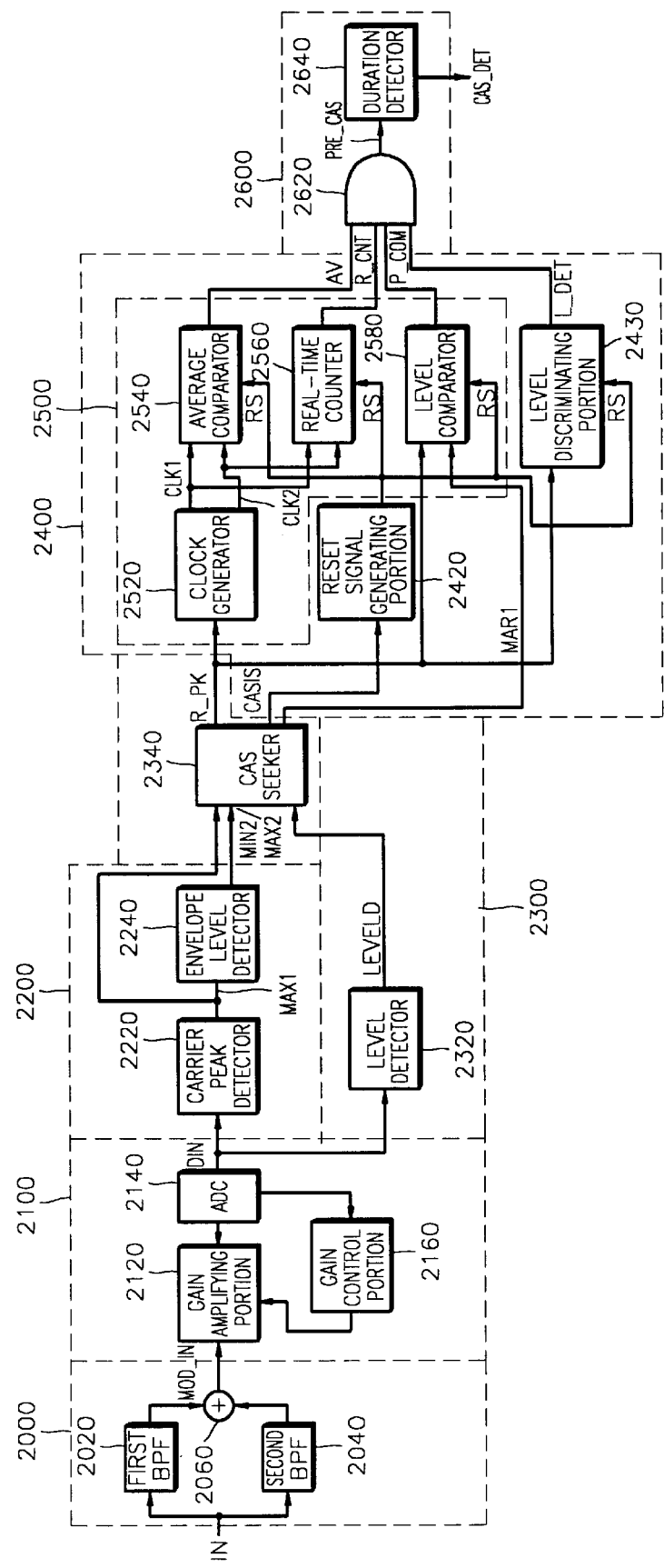
FIG. 28 is a block diagram of a CAS detection apparatus according to yet still another embodiment of the present invention.

FIG. 28 is a block diagram of a CAS detection apparatus according to yet still another embodiment of the present invention. The CAS detection apparatus includes a mixing unit 2000, a signal conversion unit 2100, an AM detection unit 2200, a signal prediction unit 2300, a signal detection unit 2400, and a CAS discrimination unit 2600. Here, mixing unit 2000 includes a first band-pass filter (BPF) 2020, a second BPF 2040, and an adder 2060. Signal conversion unit 2100 includes an ADC 2140, a gain amplifying portion 2120 and a gain control portion 2160. AM detection unit 2200 includes a carrier peak detector 2220 and an envelope level detector 2240. Here, mixing unit 2000, signal conversion unit 2100 and AM detection unit 2200 performs the same function as those of FIG. 20, thus explanation thereof is omitted.

Signal prediction unit 2300 includes a level detector 2320 and a CAS seeker 2340. Also, signal prediction unit 2300 determines whether the gain adjusted digital signal DIN has a voltage higher than a threshold value, and measures occurrence periods and the number of peaks in the carrier and envelope to suggest the presence of the CAS in signal IN. In detail, signal prediction unit 2300 receives a peak detection signals MAX1 output by carrier peak detector 2220 and a maximum level detection signal MAX2 output by envelop level detector 2240 to set the margin corresponding to prediction intervals for each of peak detection, and predicts whether the CAS is present if the number of peaks detected in each margin is greater than a predetermined number.

In detail, level detector 2320 detects whether the peak of digital signal DIN has a voltage higher than the threshold voltage and outputs a level detection signal LEVELD. CAS seeker 2340 detects the peaks of the carrier and envelope for a predetermined period in response to the level detection signal LEVELD output by level detector 2320, and generates a CAS prediction signal CASIS in response to the detection result. Here, the detection result with respect to the number of peaks of the carrier in the predetermined margin is set as a first condition, and the number of peaks of the envelope in the predetermined margin is set as a second condition. Thus, when both the first and second conditions are satisfied, it is predicted that the CAS is present, resulting in the CAS prediction signal CASIS being enabled.

Also, CAS seeker 2340 of signal prediction unit 2200 indicates only maximum peaks of the carrier and envelope, which belong to the predetermined margin, as real peaks, thereby preventing generation of peaks due to errors. The peak among the maximum peaks of the envelopes, from which error has been removed, is defined as a real peak R_PK. Here, the error component may originated from high frequency noises. The real peak R_PK of the envelope is input to a clock generator 2520 of signal detection unit 2400 to determine the frequency and level of the envelope associated with a CAS. CAS seeker 2340 is described below with reference to FIG. 29.

Signal detection unit 2400 of FIG. 28 includes a reset signal generating portion 2420, a frequency discriminating portion 2500, and a level discriminating portion 2430. Frequency discriminating portion 2500 includes a clock generator 2520, an average comparator 2540, a real-time counter 2560 and a peak comparator 2580. Signal detection unit 2400 determines the frequency and level of the envelope associated with a CAS, in response to the real maximum peak of the envelope R_PK and CAS prediction signal CASIS which are output from CAS seeker 2340, and outputs the result. The determination as to the frequency of a CAS is performed by calculating the absolute frequency and a relative frequency to the real maximum peak of the envelope R_PK, and by calculating frequency tolerance. In detail, reset signal generating portion 2420 generates a reset signal RS that resets frequency discriminating portion 2400 and level discriminating portion 2430, in response to the CAS prediction signal CASIS from CAS seeker 2340. Frequency discriminating portion 2500 generates first and second clock signals, in response to the real maximum peak of the envelope R_PK and CAS prediction signal CASIS which are output from CAS seeker 2340, and identifies the CAS frequency from the average frequency, the absolute frequency for the real-time detection, and the tolerance due to noises. Level discriminating portion 2430 discriminates the level of CAS by determining a maximum/minimum level difference of the envelope. Level discriminating portion 2430 performs the same function as that of the level discriminator of FIG. 20, thus detailed explanation thereof is omitted.

In the frequency discriminating portion 2500, clock generator 2520 divides the frequency of real maximum peak signal R_PK of the envelope from CAS seeker 2340 by a predetermined divisor to generate a first clock signal CLK1. Clock generator 2520 also divides an external clock signal by a predetermined divisor to generate a second clock signal CLK2. Clock signals CLK1 and CLK2 correspond to the signals of the same name used in the embodiment of FIG. 20.

Average comparator 2540 resets in response to reset signal RS from reset signal generating portion 2420, counts second clock signal CLK2 while the first clock signal CLK1 remains high during a predetermined period and calculates the average of counts for each period of first clock signal CLK1, to determine whether or not the frequency of envelope converges to an appropriate frequency. The predetermined period for which the counting of second clock signal CLK2 is performed, approximately corresponds to the time during 36 intervals of 1.623 ms during which first clock signal CLK1 is high. Accordingly, the predetermined period totals to approximately 58 ms. The average comparator 2540 performs the same function, discriminating a relative frequency of the envelope, as that of average comparator 774 of FIG. 20.

Real-time counter 2560 resets in response to reset signal RS. Real-time counter 2560 counts second clock signal CLK2 for each interval when the first clock signal CLK1 remains high, for the predetermined period required for accurately detecting a CAS from the point in time at which the CAS prediction signal CASIS is enabled to logic "high", resulting in a total count value during the predetermined time for detecting a CAS, which is a measure for discriminating the absolute frequency of the envelope. That is, real-time counter 2560 counts the period required for CAS detection from the point in time at which the CAS prediction signal CASIS is enabled, and determines whether the total count of second clock signal CLK2 during the period required for real CAS detection is in a predetermined range. If the total count for the predetermined period is between two reference values, real-time counter 2560 generates a logic high output signal R_CNT indicating the input signal includes a CAS.

Peak comparator 2580 resets in response to reset signal RS and counts the real peak signals R_PK of the envelop in the margin MAR1 set by the CAS seeker 2340 during the predetermined period for CAS detection. The peak comparator 2580 determines frequency tolerance of CAS from the count value. The peak comparator 2580 increments the count value each time when the maximum peak R_PK of the envelope enters the predetermined margin MAR1. If the count value for the predetermined period is greater than a reference value, it is more likely that the CAS is present in the input signal, so that a logic high output signal P_COM is generated. Even if CAS seeker 2340 removes the high frequency noises, the peak interval should be constant as a CAS. Thus, peak comparator 2580 can completely remove fake peaks due to voice noises. As described above, peak comparator 2580 calculates the tolerance in frequency of the envelope and generates a logic high output signal P_COM if the tolerance is in a predetermined range.

In the case where a customer is on the telephone, that is, where CAS is detected while voices are present on a telephone line, talk-off or talk-down may occur due to noise. In general, voice signals have a level higher than that of the CAS. Talk-off is a phenomenon where voice signals or noise are misrecognized as a CAS, and talk-down is a phenomenon where detection of CAS that is present, is impossible due to voice noises. However, because the output interval of the peaks of the voice noises is different from that of the peaks of the envelope of the CAS, the CAS can be identified from the voice noises by counting the peak intervals.

The structure and operation of level discriminating portion 2430 are the same as in FIG. 20, thus explanation thereof is omitted.

CAS discrimination unit 2600 of FIG. 28 includes an AND gate 2620 and a duration detector 2640. AND gate 2620 performs an AND operation on the signal AV from average comparator 2540 of signal detection unit 2400, signal R_CNT from real-time counter 2560, signal P_COM from peak comparator 2580, and signal L_DET from level discriminating portion 2430, to generate a preliminary CAS detection signal PRE_CAS. Duration detector 2640 detects the duration for which the preliminary CAS detection signal PRE_CAS exists, and generates a real CAS detection signal CAS_DET.

Figure 29:
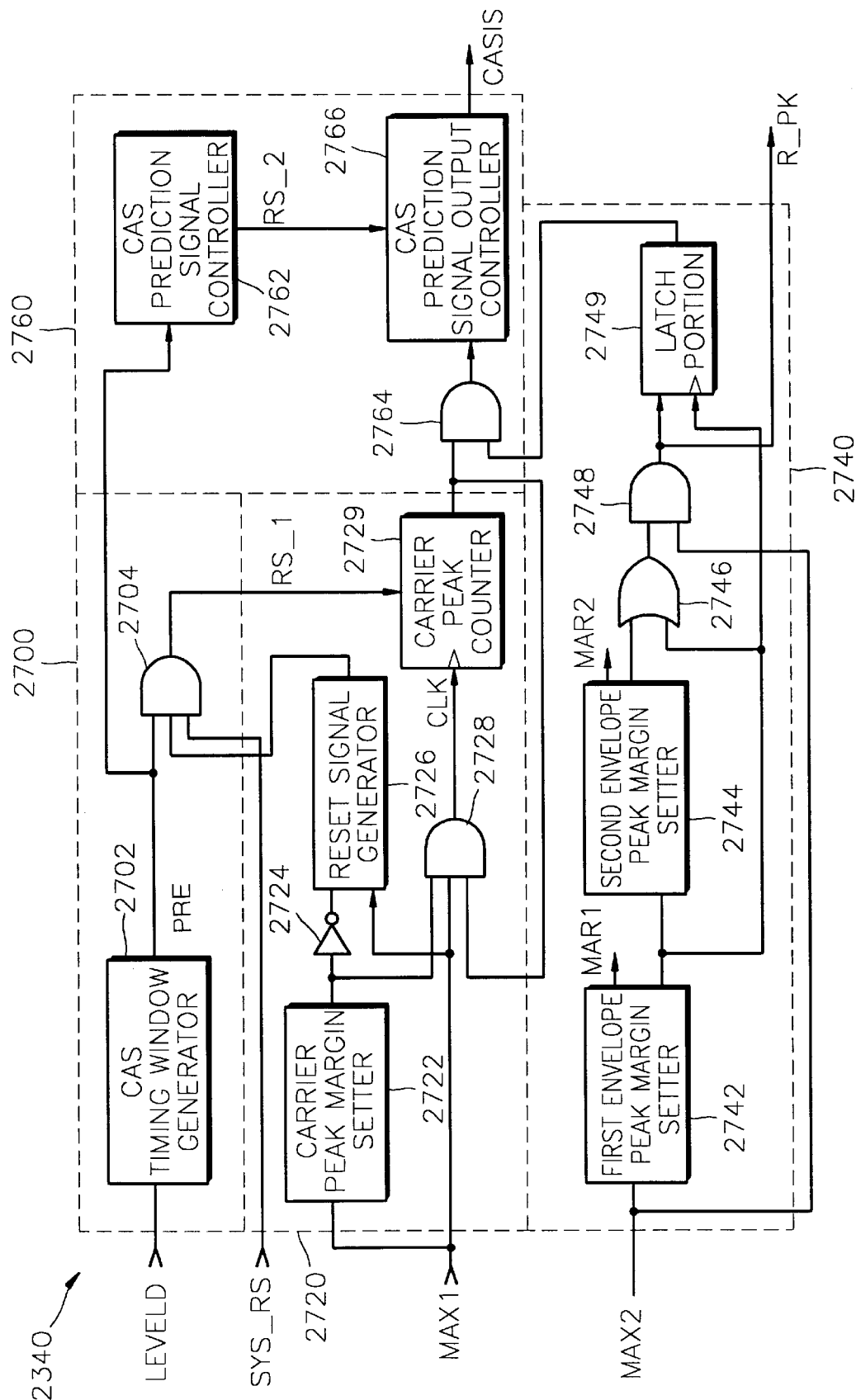
FIG. 29 is a block diagram of a CAS seeker in the CAS detection apparatus of FIG. 28.

FIG. 29 is a block diagram of the CAS seeker 2340 in the CAS detection apparatus of FIG. 28. In the embodiment of FIG. 29, CAS seeker 2340 includes a CAS interval prediction portion 2700, a first condition set portion 2720, a second condition set portion 2740 and a CAS prediction signal generation portion 2760.

CAS interval prediction portion 2700 of FIG. 29 includes a CAS timing window generator 2702 and an AND gate 2704. CAS interval prediction portion 2700 receives the level detection signal LEVELD from level detector 2320, predicts the input signal as including a CAS if the level detection signal LEVELD remains for a predetermined period, and generates a reset signal that resets the CAS prediction signal CASIS. The predetermined period corresponds to approximately 1.7 ms.

In CAS interval prediction portion 2700, CAS timing window generator 2702 generates a logic high interval prediction signal PRE if the level detection signal LEVELD remains for a predetermined period. AND gate 2794 performs an AND-operation on the signal from the CAS timing window generator 2702, a system reset signal SYS_RS and a reset signal from first condition set portion 2720, to generate a reset signal RS_1 that is for resetting a carrier peak counter 2729 of the first condition set portion 2720.

First condition set portion 2720 includes a carrier peak margin setter 2722, an inverter 2724, a reset signal generator 2726, an AND gate 2728 and a carrier peak counter 2729. First condition set portion 2720 counts the carrier peaks only in the predetermined carrier peak margin to set a first condition for CAS prediction. The first condition is that a predetermined number of consecutive peaks of the carrier, and preferably eight peaks, enter the predetermined margin.

Carrier peak margin setter 2722 of first condition set portion 2720 sets the margin in an interval where the maximum peak detection signal MAX1 of the carrier from AM detection unit 2200 is most likely detected. Preferably, the peak detection margin of the carrier is set to approximately 331~428 µs by taking allowance into account based on the period of 409.84 µs corresponding to the frequency of 2,440 Hz of the carrier. Only the maximum peak MAX1 of the carrier which enters the margin, is output via the carrier peak margin set portion 2722. Inverter 2724 inverts the signal from carrier peak margin set portion 2722 and reset signal generator 2726 generates the reset signal that resets carrier peak counter 2729 in response to the output of inverter 2724. Reset signal generator 2726 generates the reset signal when two maximum peak detection signals MAX1 of the carrier do not enter the margin. The generated reset signal is applied to a second input port of AND gate 2704. AND gate 2728 performs an AND-operation on the maximum peak from the carrier peak margin set portion 2722, the maximum peak detection signal MAX1 of the carrier from AM detection unit 2200, and the output from carrier peak counter 2729, to generate a clock signal CLK of carrier peak counter 2729. Carrier peak counter 2729 resets in response to reset signal RS_1 and increments the count value in response to the output signal from AND gate 2728. The output from carrier peak counter 2729 is fed back to a third input port of AND gate 2728. Carrier peak counter 2729 resets when the level detection signal LEVELD becomes low, which occurs in the case where digital signal DIN has a voltage lower than a predetermined voltage level, or the system reset signal SYS_RS or the reset signal from reset signal generator 2726 is generated.

Second condition set portion 2740 includes a first envelope peak margin setter 2742, a second envelope peak margin setter 2744, an OR gate 2746, an AND gate 2748, and a latch portion 2749. Second condition set portion 2740 sets a second condition for CAS detection by counting only the peaks of the envelope which enter a predetermined envelope peak margin. The second condition is that a predetermined number of consecutive peaks of the envelope, preferably three peaks of the envelope, enters the predetermined margin.

First envelope peak margin setter 2742 of the second condition set portion 2740 sets a first margin MAR1 in an interval where the peaks of the envelop, that is, the maximum level detection signal MAX2 of the envelope from AM detection unit 2200 is most likely detected. Preferably, the peak detection margin of the envelope is set to approximately 1.33~1.48 ms or 1.74~1.91 ms based on the period of 1.614 ms corresponding to the frequency of 620 Hz of the envelope. Second envelope peak margin setter 2744 sets a second margin with respect to the peaks of the envelope. The second margin is set to be over the first margin, and the peaks of the envelopes which occur in the interval over the first margin, are considered as a normal real peak even if noises exist in the interval. OR gate 2746 performs an OR-operation on the peaks of the envelops output via first envelope peak margin set portion 2742 and second envelope peak margin set portion 2744, and outputs the result. AND gate 2748 performs an AND-operation on the output from OR gate 2746 and the peak of the envelope MAX2 from the AM detection unit 2200, and outputs the result. The peak of the envelope MAX2 which occurs in the interval before the first margin MAR1, is considered as an error peak, so it is removed in the AND gate 2748, and the peaks detected in the first margin interval MAR1 and a second margin MAR2 are output as a real peak R_PK. Latch portion 2746 includes three latches, and outputs a logic high signal when three consecutive peaks of the envelop R_PK from AND gate 2748 are latched.

The reason why the peak detection margin with respect to the carrier and the envelope is used, is as follows. When a voice signal and a CAS are mixed in an input signal or only voice signal is input, if the CAS is relatively smaller than the voice signal, the voice signal can be considered as noises, so that discrimination of the CAS from the voice signal is difficult. In this case, the margin is utilized in order to efficiently detect the CAS. In other words, if the CAS has a voltage lower than that of voice noises, the peaks of the input signal can change, appearing as error data. That is, the voltage of the voice signal on a telephone line is higher than that of the CAS, so that peak information can be extracted from a distorted CAS.

In the case of periodic functions having sine waves, such as a CAS, peaks are arranged at a constant interval. In the case where the CAS is distorted due to noises, the peaks can be arranged at a constant interval while it shows jittering. However, in non-periodic functions such as noises, peaks cannot be arranged at a constant interval. Thus, in the case where a voice signal and a CAS are mixed or only voice signal exists on a telephone line, first and second condition set portions 2720 and 2740 can detect CAS using the characteristics of the periodic and non-periodic functions.

The CAS prediction signal generation portion 2760 includes an AND gate 2764, a CAS prediction signal controller 2762 and a CAS prediction signal output portion 2766. CAS prediction signal generation portion 2760 receives the interval prediction signal PRE from CAS interval prediction portion 2700, and conditions set by first and second condition set portions 2720 and 2740, and generates a CAS prediction signal CASIS if all the three conditions are satisfied.

AND gate 2764 of CAS prediction signal generation portion 2760 performs an AND-operation on the output from carrier peak counter 2729 and the output from latch portion 2749 and outputs the result. That is, if the first condition that the count value on consecutive peaks of the carrier by carrier peak counter 2729 reaches a predetermined value, and the second condition that three peaks of the envelope P_PK are latched by latch portion 2749, are satisfied, AND gate 2764 outputs a logic high signal. Also, CAS prediction signal output portion 2766 generates CAS prediction signal CASIS in response to the output of AND gate 2764. CAS prediction signal controller 2762 generates a reset signal RS_2 that disables the CAS prediction signal CASIS, in response to the result of the CAS interval prediction. That is, if CAS prediction signal controller 2762 determines that a signal having a voltage higher than a predetermined voltage is not applied any more, using the interval prediction signal PRE from the CAS timing window generator 2702, CAS prediction signal controller 2762 outputs the reset signal RS_2 that disables the CAS prediction signal CASIS.

In the operation of CAS seeker 2340 of FIG. 29, when the level detection signal LEVELD is applied from level detector 2320, the CAS timing window generator 2702 determines whether an input signal exists for a predetermined period, to generate the CAS interval prediction signal PRE. The first and second condition set portions 2720 and 2740 receive the maximum peak MAX1 of the carrier and the maximum peak MAX2 of the envelope, which are output from the AM detection unit 2200, respectively, and output the peaks in each margin as real peaks. That is, if the carrier peak counter 2729 of the first condition set portion 2720 counts 8 consecutive peaks in the predetermined carrier peak margin interval, it is considered that the first condition is satisfied. However, if two peaks of the carrier MAX1 do not enter the margin interval, the carrier peak counter 2729 resets. Also, if three consecutive peaks of the envelop MAX2 are detected between the first and second margin intervals MAR1 and MAR2, the second condition set portion 2740 determines that the second condition is satisfied. If both the first and second conditions are satisfied, the input signal is predicted as including a CAS. If the input signal remains at a predetermined voltage and both the first and second conditions are satisfied, the CAS prediction signal output portion 2766 generates a logic high CAS prediction signal CASIS. If the reset signal RS_2 is applied from the CAS prediction signal controller 2762 after the logic high CAS prediction signal CASIS is enabled, the CAS prediction signal CASIS is disabled.

Figure 30A:
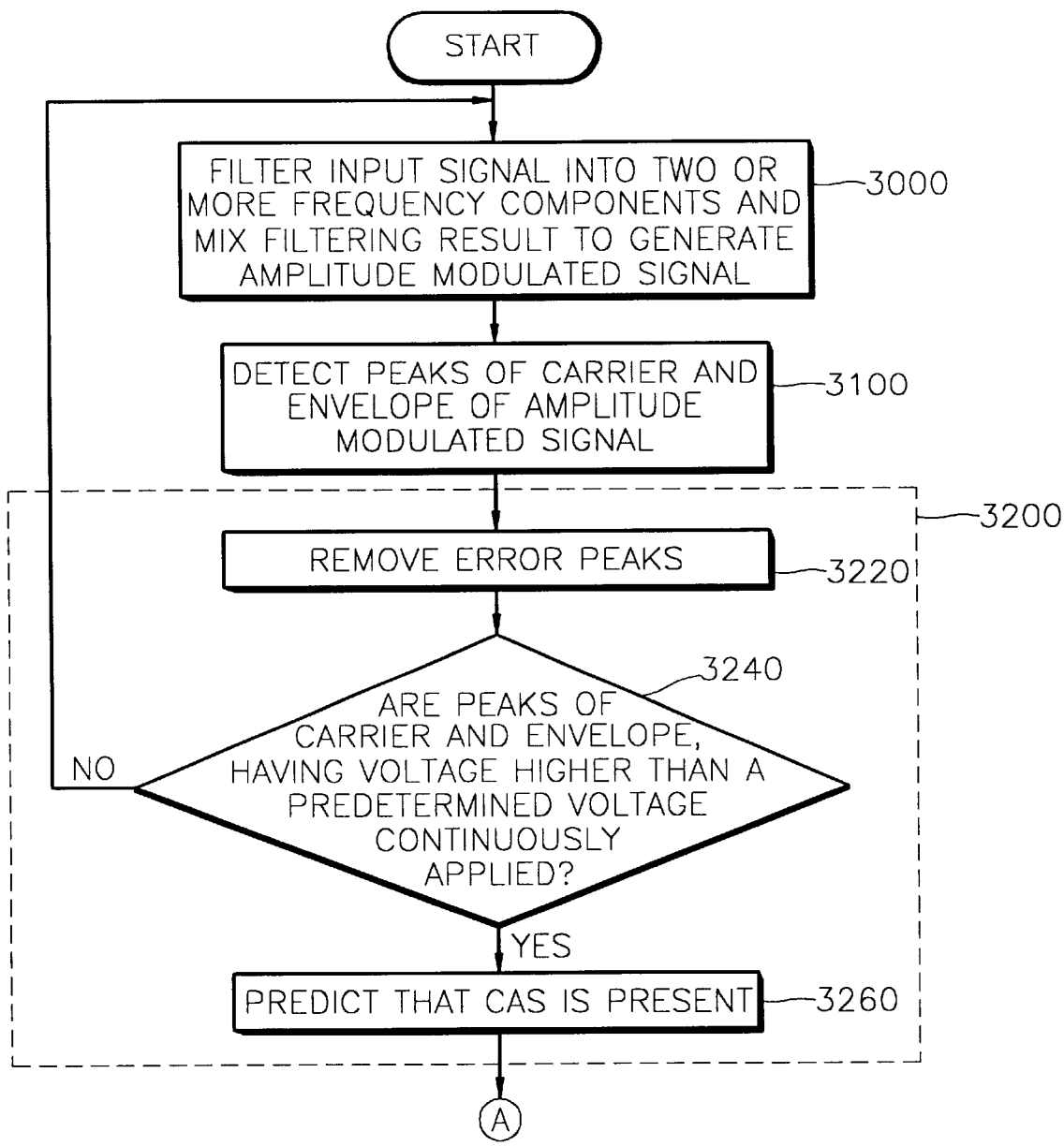
FIG. 30A and FIG. 30B, is a flowchart illustrating a CAS detection method for the CAS detection apparatus of FIG. 28.
Figure 30B:
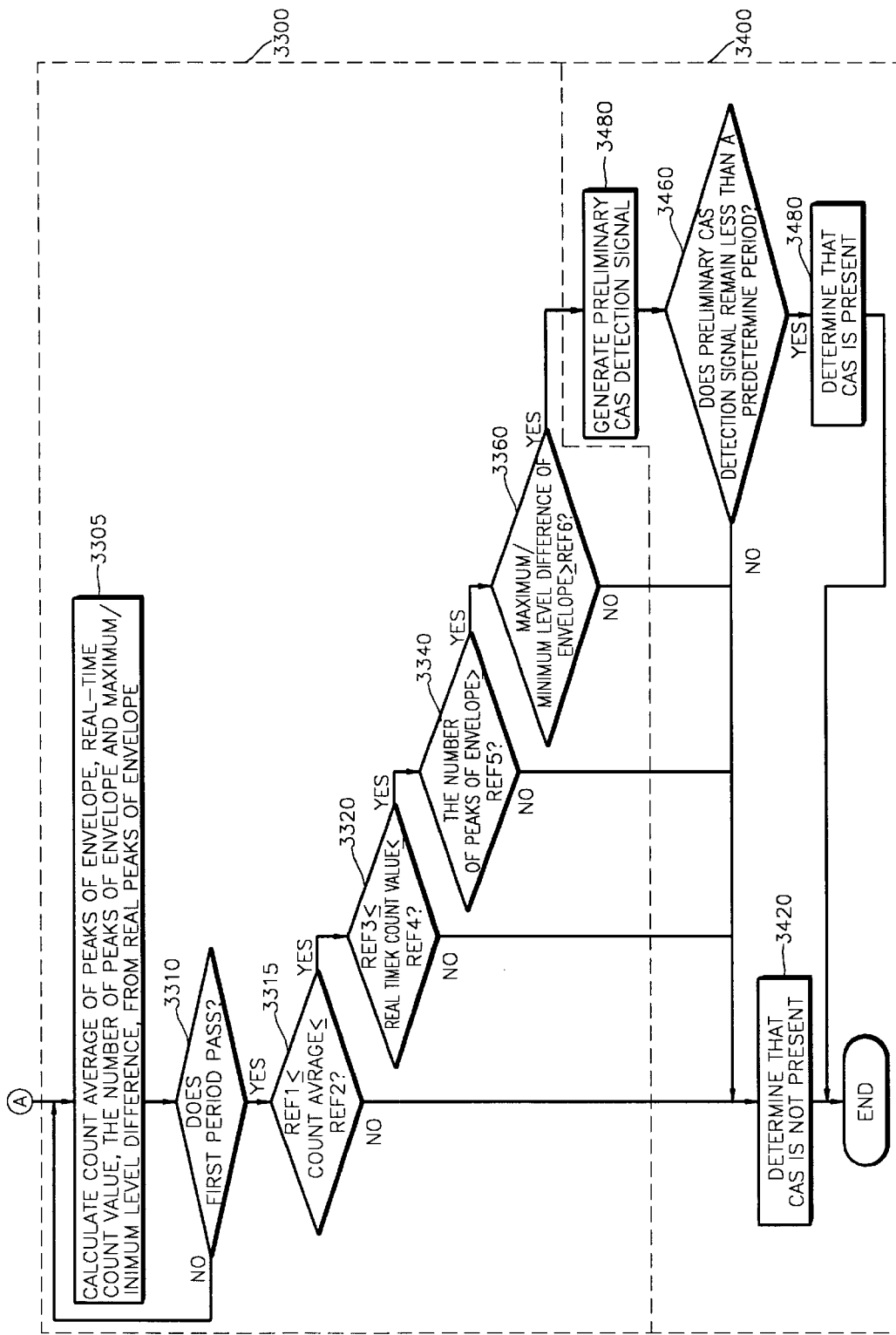

FIG. 30, which is divided into parts labeled FIG. 30A and FIG. 30B, is a flowchart illustrating a detection method for the CAS detection apparatus of FIG. 28. The method broadly includes filtering an input signal into two or more frequency components that together form an amplitude-modulated signal (step 3000); analyzing the amplitude-modulated signal by detecting the peaks of the carrier and envelope to measure the carrier and envelope (step 3100); detecting whether peaks of the carrier and the envelope, which are higher than a predetermined voltage, are applied continuously for a predetermined period, to predict whether the CAS is present (step 3200); discriminating whether the frequency and level of the envelop are in a predetermined range, from the peaks of the envelope from which the error has been removed, if it is predicted that the CAS is present (step 3300); and determining the input signal as including a CAS if the condition of step 3300 is satisfied and the duration of the CAS is shorter than a predetermined period (step 3400).

In detail, steps 3000 and 3100 are the same as in the embodiment of FIG. 27. In step 3200, CAS seeker 2340 removes error peaks using the predetermined carrier peak margin and envelope peak margin (step 3220). When step 3220 removes the error peaks, a determination is made as to whether the peaks of the carrier and the envelope, which are higher than a predetermined voltage and from which the error peaks have been removed, are applied continuously for a predetermined period (step 3240). As described above, when 8 consecutive peaks of the carrier from which errors have been removed, are applied for approximately 5 ms and three consecutive peaks of the envelope are applied, the input signal is predicted as including a CAS (step 3260).

When the CAS prediction signal CASIS is enabled as the result of step 3260, detection for a real CAS is performed. In detail, the reset signal generating portion 2420 generates the reset signal RS that initializes frequency discriminating portion 2500 and level discriminating portion 2430, in response to the CAS prediction signal CASIS. Clock generator 2520 divides the real peaks of the envelop R_PK applied from the CAS seeker 2340 to generate a first clock signal CLK1. Clock generator 2520 also divides an external clock signal by a predetermined divisor to generate a second clock CLK2. Average comparator 2540, real-time counter 2560, peak comparator 2580 and the level discriminating portion of the frequency discriminating portion 2500 reset by the reset signal RS, and the count average AV of the peaks of the envelope for a predetermined period, from which error peaks have been removed, the real-time count value R_CNT, and the number of peaks of the envelops P_COM, and the level difference between the maximum and minimum peaks of the envelope L_DET are calculated (Step 3305). A relative frequency of the CAS is discriminated by the count average AV of the envelope and the absolute frequency of the CAS is discriminated by the real-time count value R_CNT. Also, tolerance due to noises is calculated by the number of peaks P_COM. Real-time counter 2560 determines whether or not approximately 58 ms of time passes for real CAS detection (step 3310). When 58 ms of time passes, a determination is made as to whether the conditions for discriminating the frequency and the level are satisfied. For example, after 58 ms of time passes, average comparator 2540 determines whether the count average AV is between first and second reference values REF1 and REF2 (step 3315). When the count average AV is not between the first and second reference values REF1 and REF2, it is determined that the CAS is not present (step 3420). Meanwhile, when the count average AV is between the first and second reference values REF1 and REF2, a determination is made as to whether the real count value R_CNT is between third and fourth reference values REF3 and REF4 (step 3320).

When the real count value R_CNT is between the third and fourth reference values REF3 and REF4, step 3340 determines whether the number of real peaks R_PK of the envelope P_COM, which is counted by the peak comparator 2580 and from which errors have been removed, is equal to or greater than a fifth reference value REF5. When the condition of step 3340 is satisfied, step 3360 determines whether the level difference between the maximum and minimum peaks of the envelope is equal to or greater than a sixth reference value REF6. When the above determinations as to the count average AV of the envelope, the real-time count value R_CNT, the number of the peaks of the envelope P_COM, and the level difference between the maximum and minimum peaks L_DET are completed, the CAS discrimination unit 2600 generates a preliminary CAS detection signal PRE_CAS (step 3440). Then, step 3460 determines whether the preliminary CAS detection signal PRE_CAS remains for a predetermined period while being enabled. That is, at the point in time at which the CAS prediction signal CASIS is disabled to logic "low", a determination is made as to whether the interval during which the preliminary CAS detection signal PRE_CAS remains high is shorter than a predetermined duration, preferably 22.5 ms. Because total transmission time of the CAS is in the range of 75~85 ms, the duration of the CAS detection signal reaches approximately 22 ms, by subtracting 5 ms for CAS prediction and 58 ms for the detection of real CAS. However, the reference duration for the preliminary CAS detection signal PRE_CAS may be set to 22.5 ms by taking the features of the band pass filter and other circuits into account. Thus, when the duration of the preliminary CAS detection signal PRE_CAS after the CAS prediction signal CASIS is disabled, is less than 22.5 ms, the input signal is considered as including a CAS, thereby generating the real CAS detection signal CAS_DET (step 3480). When at least one condition for each step is not satisfied during step 3300 for signal detection, the input signal is determined as not including a CAS (step 3420).

Thus, in the apparatus and method for detecting a CAS according to the present invention, the CAS can be accurately detected without the effect of talk-off or talk-down due to voice noises.

The CAS detection apparatuses according to the embodiments of the present invention detect a dual tone CAS through the peak detection. In a caller ID system, the peak detection method can be applied to a caller information detection apparatus for detecting a frequency shift keyed (FSK) signal applied as the actual caller information following the CAS. For the caller identification service, a central office transfers a CAS in an ON-HOOK state or OFF-HOOK state, and then a CID/CIDCW (Calling Identity Delivery/Calling Identity Delivery on Call Waiting) receiver of a CPE transmits to the central office a CAS acknowledgment signal CAS_ACK to acknowledge the CAS. The central office outputs FSK modulated data (hereinafter referred to as FSK data) representing caller information.

Figure 31:
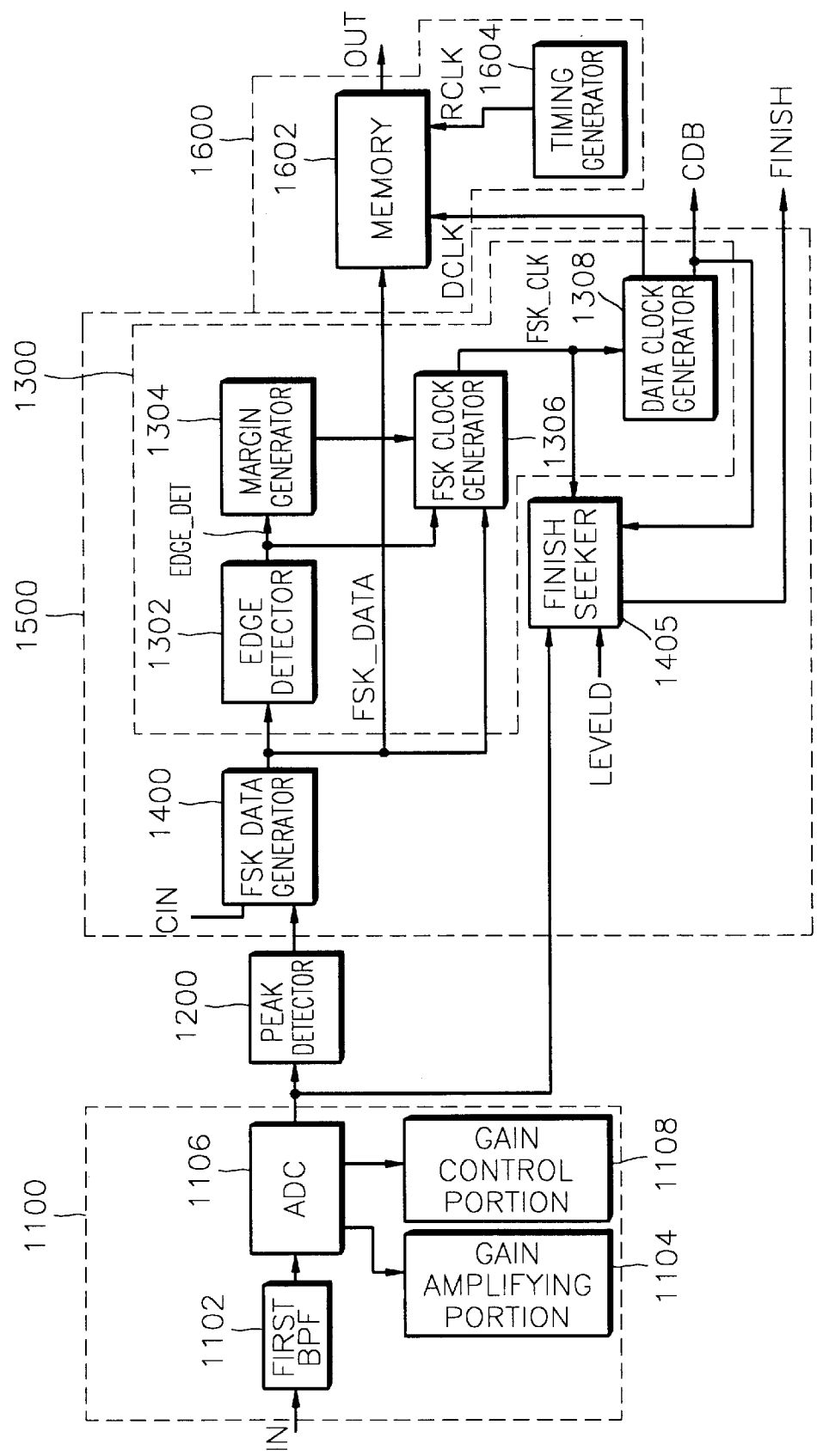
FIG. 31 is a block diagram of a caller information detection apparatus according to an embodiment of the present invention.

FIG. 31 is a block diagram of a caller information detection apparatus according to an embodiment of the present invention. The caller information detection apparatus of FIG. 31 includes a signal conversion unit 1100, a peak detector 1200, an FSK demodulation unit 1500, and a signal transfer unit 1600. Here, signal conversion unit 1100 includes a first band-pass filter 1102, an ADC 1106, a gain amplifying portion and a gain control portion 1108. FSK demodulation unit 1500 includes an FSK data generator 1400, a clock generation portion 1300, and a finish seeker 1405. Here, clock generation portion 1300 includes an edge detector 1302, a margin generator 1304, an FSK clock generator 1306, and a data clock generator 1308. Signal transfer unit 1600 includes a memory 1602 and a timing generator 1604.

The signal conversion unit 1100 filters an analog input signal IN input via a telephone line from a central office, into a predetermined frequency component including two frequency bands, and converts the filtering result into a digital signal. The signal conversion unit 1100 controls the gain of the digital signal in a similar manner to that in the CAS detection apparatus and outputs the control result. The bandpass filter 1102 filters an FSK-modulated signal and outputs a MARK ("1") frequency component or a SPACE ("0") frequency component. A gain of the signal from the band-pass filter 1102 is controlled in a similar manner to that in the CAS detection apparatus. Here, transmission frequencies of the MARK and SPACE signals vary according to type of caller identification service, e.g., whether the caller identification service adopts the British telecom standard or the Bellcore standard. For example, according to the Bellcore standard, the MARK signal has a 1200 Hz transmission frequency, and the SPACE signal has a 2200 Hz transmission frequency. On the other hand, the British telecom standard adopts a 1300 Hz transmission frequency for the MARK signal and a 2100 Hz transmission frequency for the SPACE signal.

Peak detector 1200 detects maximums and minimums of the digital signal from ADC 1106. Here, the detected maximums and minimums can be the maximum and minimum of the MARK signal (1) or the SPACE signal (0). Detecting the maximums and minimums is similar to the peak detection performed in the above-described CAS detection apparatus.

FSK demodulation unit 1500 determines the frequency or period of the maximum/minimum of the MARK or SPACE signal detected by the peak detector 1200, generates a data signal FSK_DATA, and detects the edge of the FSK data for generation of a data clock signal DCLK for transferring the FSK data.

Signal transfer unit 1600 stores the FSK data from signal FSK_DATA in memory 1602 in response to data clock signal DCLK, and transfers the stored FSK data to an external microprocessor (not shown) in response to a read clock signal RCLK from timing generator 1604.

In FSK demodulation unit 1500, FSK data generator 1400 compares the frequency of the detected maximum/minimums to a reference frequency selected according to transmission standard information signal CIN applied from the outside. FSK generator 1400 generates a logic high or a logic low for data signal FSK_DATA according to the comparison result. Here, the transmission standard information (signal CIN) indicates whether the caller identification service adopts the British telecom standard or the Bellcore standard.

Clock generation portion 1300 detects the edge of the FSK data in signal FSK_DATA from FSK data generator 1400 and generates an FSK clock signal FSK_CLK and a data clock signal DCLK. Data clock signal DCLK is enabled only in the actual data interval. That is, edge detector 1302 of the clock generation portion 1300 detects rising and falling edges of data signal FSK_DATA from FSK data generator 1400 and asserts an edge detection signal EDGE_DET to margin generator 1304. Margin generator 1304 receives edge detection signal EDGE_DET and delays an output signal according to a predetermined detection margin from the edge of the input FSK data signal FSK_DATA. The detection margin is for eliminating possible errors caused by noise. That is, only an edge detection signal generated after an interval longer than the detection margin causes assertion of clock signal FSK_CLK. FSK clock generator 1306 generates FSK clock signal FSK_CLK in response to data signal FSK_DATA from FSK data generator 1400, the edge detection signal EDGE_DET, and the detection margin from margin generator 1304.

Data clock generator 1308 generates a transmission start signal CDB that indicates the transmission of data via data signal FSK_DATA, and generates data clock DCLK from FSK clock signal FSK_CLK. Data clock DCLK is enabled only in the actual data interval of data signal FSK_DATA. Here, data signal FSK_DATA includes a start bit and a stop bit as well as the actual data bits. For example, assuming that the FSK data is implemented with 10-bit units, FSK data includes a start bit (1 bit), an actual data byte of 8 bits, and a stop bit (1 bit).

Finish seeker 1405 detects whether the digital signal output from ADC 1106 is lower than a level LEVELD in response to FSK clock signal FSK_CLK and transmission start signal CDB, and generates an end signal FINISH in response to the detection result. Here, level LEVELD is for detecting the signals considered to be the real signal. That is, when the magnitude of the frequency component being received is less than level LEVELD, the input signal is determined as not the real data and data signal FSK_DATA does not represent data to be stored in memory 1602.

The caller information detection apparatus of FIG. 31 uses a frequency shift keying demodulator and peak detection. Also, since the caller information detection apparatus can share the internal peak detector of the AM detection unit of a CAS detection apparatus, the overall size of the circuit can be reduced. Also, the caller information detection apparatus works with both the Bellcore standard and the British standard as selected by the transmission standard information signal CIN.

Figure 32A:
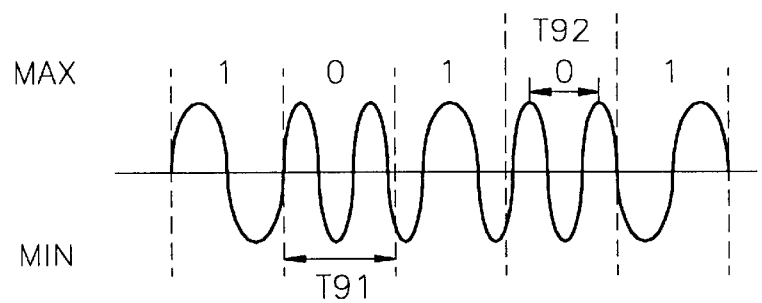
Figure 32C:
Figure 32E:
Figure 32G:

FIGS. 32A through 32G show waveforms illustrating signals in the caller information detection apparatus shown in FIG. 31. FIG. 32A represents the FSK demodulated signal including MARK (1) and SPACE (0) frequency components. FIG. 32B represents an example of the caller information, and FIG. 32C represents a tip/ring signal applied through a telephone line. FIG. 32D represents transmission start signal CDB in a caller information reception mode. FIG. 32E represents the data signal FSK_DATA generated by FSK data generator 1400. FIG. 32F represents FSK clock signal FSK_CLK, and FIG. 32G represents data clock signal DCLK.

Referring to FIG. 32A, the input signal represents MARK signal (1) during an interval T91 and represents SPACE signal (0) during an interval T92. According to the Bellcore standard, the period of the MARK signal is about 1/(1.2 KHz) or 833.33 $\mu$s, and the period of the SPACE is 1/(2.2 KHz) or 454.54 $\mu$s. Assuming that the actual caller information is 101010 . . . as shown in FIG. 32B, the interval between the maximums or minimums (collectively referred to as maximum/minimum peaks) is half of the period of 1/(1200 Hz) during transmission of a "1" (the MARK signal), and is half of the period of 1/(2200 Hz) during transmission of a "0" (the SPACE signal). The interval between the detected maximum/minimum peaks is a reference for discriminating between bit values 0 and 1. The median frequency 1700 Hz of frequencies 1200 Hz and 2200 Hz is a good reference frequency for discriminating between bit values 0 and 1. For example, if the detected interval separating peaks is large compared to a reference period corresponding to 1700 Hz, the input bit value is identified as 1. Otherwise, if interval between two peaks is smaller than the reference period, the input bit value is identified as 0.

Figure 33A:
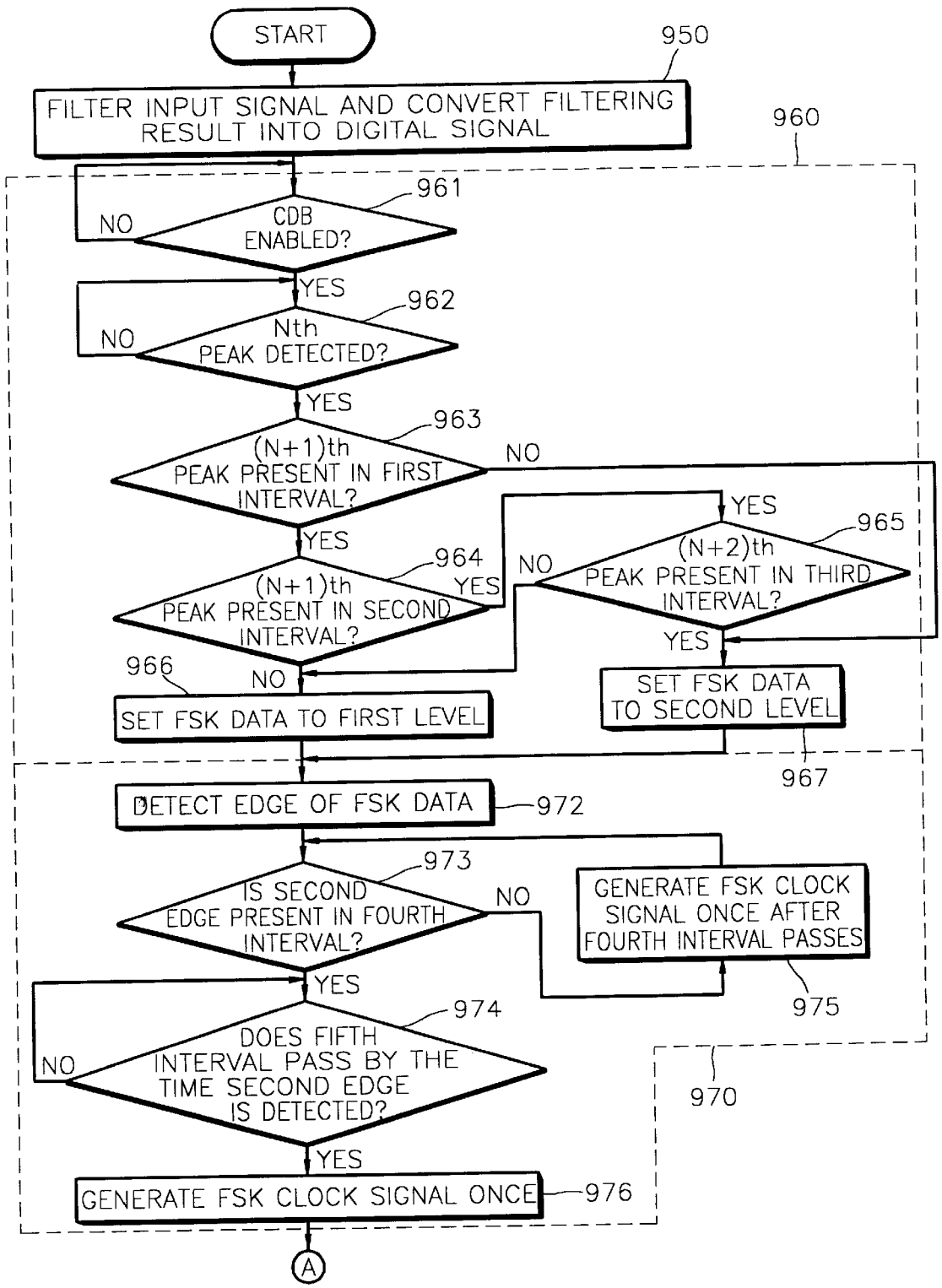
FIG. 33A and FIG. 33B, is a flowchart illustrating a caller information detection method for the apparatus of FIG. 31.
Figure 33B:
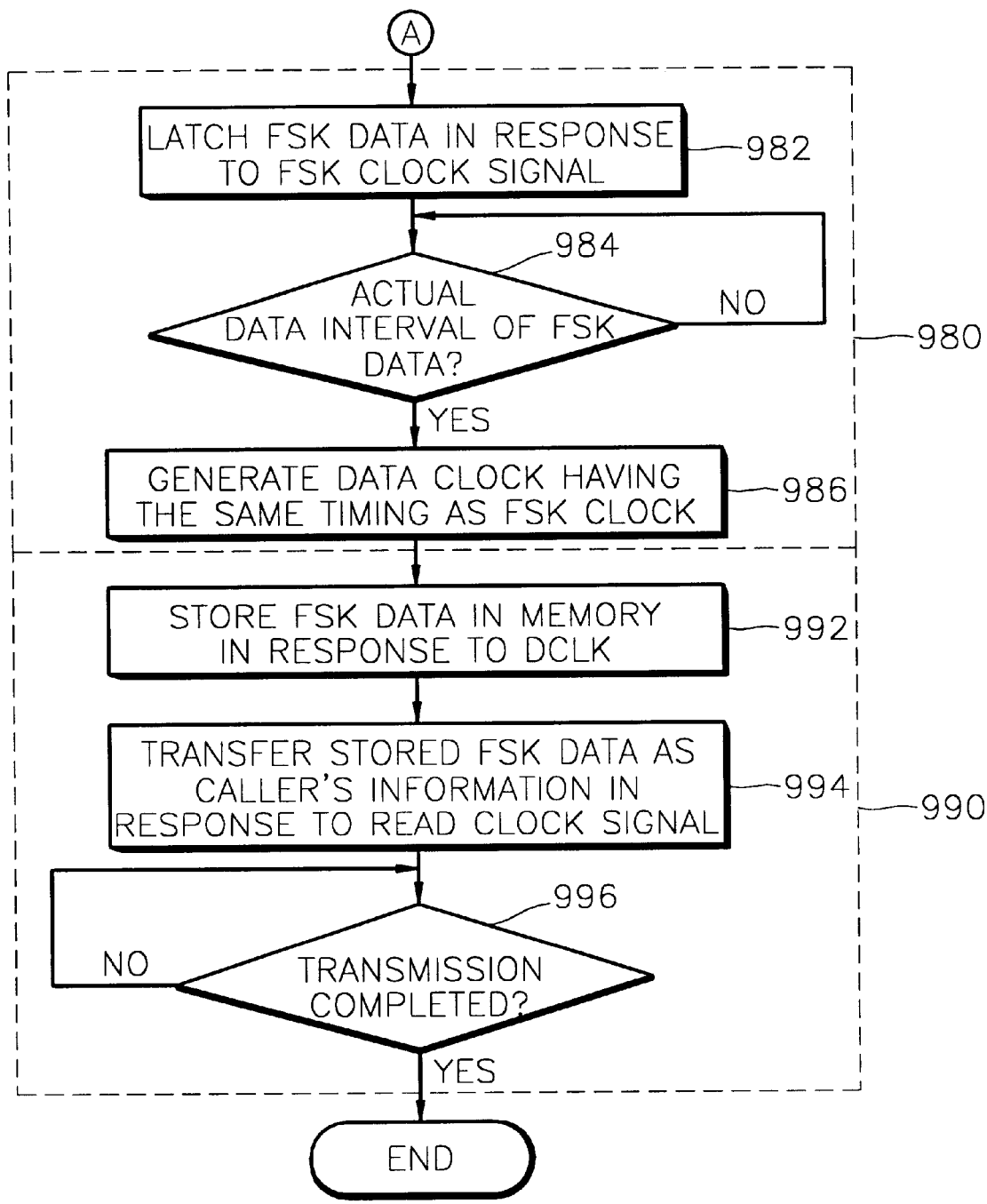

FIG. 33, which includes parts labeled 33A and 33B, is a flowchart illustrating a caller information detection method for the apparatus of FIG. 31. The caller information detection method illustrated in FIG. 33 broadly includes the steps of filtering an input signal IN to separate two frequency components and converting a filtering result into a digital signal (step 950); detecting maximum/minimum peaks of the digital signal, and discriminating the occurrence period and interval of the detected maximum/minimum peaks to identify a bit value and generate a data signal FSK_DATA representing the identified bit value (step 960); detecting the edge of data signal FSK_DATA to generate an FSK clock signal FSK_CLK (step 970); generating a data clock signal DCLK from the FSK clock signal FSK_CLK, the data clock signal DCLK being enabled only in the actual data interval of the FSK data (step 980); and transferring the FSK data in response to the data clock signal DCLK (step 990).

In more detail, signal conversion unit 1100 filters an input signal IN applied through a telephone line from a central office into MARK and SPACE frequency components and converts one or the other filtering result into a digital signal (step 950). Preferably, ADC 1106 is an 8-bit ADC with a sampling period of 30~40 $\mu$s. The occurrences of and intervals between the maximum/minimum peaks are measured and compared to a reference for determination of whether the input signal has a MARK or SPACE frequency.

When a CPE is in a standby mode, i.e., in an ON-HOOK state, a central office can repeatedly transmit bit values 1 and 0 of a channel seizure signal and then continuously transmit the MARK signal. According to the Bellcore standard, the central office transmits a train of ones for around 45 ms, and the real FSK data is sent after approximately thirty-two ones. Here, the format of the FSK data includes a start bit, an 8-bit data value, and a stop bit. Thus, detecting a "0" indicating a start bit after about thirty-two continuous ones indicates actual caller information. That is, detecting 0 following the continuous MARK signals indicates the start of a data block. Thus, data clock generator 1308 enables the transmission start signal CDB to a logic low.

Meanwhile, when the CPE is in a talk mode, the channel seizure signal is not transmitted, and the continuous MARK signal is transmitted. When step 950 converts the input signal into a digital signal, it is determined whether the transmission start signal CDB of FIG. 32D is enabled to a logic low (step 961). When the transmission start signal CDB is enabled, it is determined whether peak detector 1200 detects the peak of the Nth (N>0) MARK signal or SPACE signal (step 962). For convenience in explanation, it is assumed that step 962 detects the first peak. When the first peak is detected, step 963 determines whether the second peak following the first peak is in a first reference interval. Preferably, the first reference interval is around 860 $\mu$s. Here, the first reference interval of 860 $\mu$s is selected in consideration with a predetermined margin based on the period (833.33 $\mu$s) of the MARK signal in the Bellcore standard, but can distinguish the MARK and SPACE signals according to both the Bellcore standard and the British telecom standard. When the (N+1)th peak, i.e., the second peak, occurs within the first reference interval of 860 $\mu$s, step 964 determines whether the (N+1)th peak occurs within a second reference interval. For example, the second reference interval is about 316.66 $\mu$s. However, if step 963 determines that the (N+1)th peak did not occur in the first reference interval, step 967 sets the FSK data signal to a first level, i.e., to a logic low.

For example, when the FSK modulated signal is transmitted according to the Bellcore standard, the peak interval of the MARK is half of 416.67 $\mu$s, and the peak interval of the SPACE is half of 227.27 $\mu$s. Thus, the median value 321.97 $\mu$s of 416.67 $\mu$s and 227.27 $\mu$s is set as a reference value for the peak detection, and an interval between minima and maxima in the input signal being below or above 321.97 $\mu$s indicates 1 or 0. On the other hand, according to the British telecom standard, the peak interval of the MARK signal is half of 384.63 $\mu$s, and that of the SPACE signal is half of 238.10 $\mu$s. Thus, the median value 311.36 $\mu$s of 384.63 $\mu$s and 238.10 $\mu$s is set as a reference value for the peak detection, and an interval between minima and maxima in the input signal being below or above 311.36 $\mu$s indicates 1 or 0. Even though the period of the signal differs depending on the transmission standard, the reference interval used to discriminate values of the input signal can be set to be applicable to both the transmission standards. That is, the decision interval as a reference for discriminating the input signal can be set to 316.66 $\mu$s from the median value 321.97 $\mu$s of 416.67 $\mu$s and 227.27 $\mu$s and the median value 311.36 $\mu$s between 384.62 $\mu$s and 238.10 $\mu$s, such that both the British telecom standard and the Bellcore standard can be applicable. If step 964 determines that the second peak is not present in the second interval of 316.66 $\mu$s, data signal FSK_DATA of FIG. 32E is set to a second level, i.e., to a logic high. Here, that the second peak being present in the interval of 860 $\mu$s but not in the interval of 316.66 $\mu$s indicates the receipt of the MARK signal, so the FSK data is set to a logic high.

In the actual situation, it is not easy to predict the peak interval when 1200-Hz and 2200-Hz frequency components are intermingled. Due to the reason, the widths of 1 or 0 of the FSK data generated by the FSK data generator 1400 may not match. That is, since the FSK data transmitted in the present invention is a continuous phase frequency shift keyed (CPFSK) modulated signal, its waveform is continuous even if the logic of the signal 0 or 1 transits to other state 1 or 0. Thus, such different widths of 1 or 0 can be compensated for by generating clock signals in the FSK clock generator 1306 and the data clock generator 1308 to accurately latch the FSK data of 0 and 1.

If step 964 determines that the (N+1)th peak is present in the second interval of 316.66 $\mu$s, step 965 determines whether an (N+2)th peak, i.e., a third peak, is present in a third interval. If the third peak is present in the third interval of 316.66 $\mu$s after the second peak, the FSK data is set to a logic low (step 967). That is, that the (N+2)th peak is in the third interval of 316.66 $\mu$s means that the detected signal is the SPACE, so the data signal FSK_DATA is set to a logic low.

As above, the FSK data generator 1400 can detect whether the input signal is 0 or 1 by discriminating the number of and interval between of the peaks. For example, a signal with the long peak interval indicates the MARK signal (1), and two consecutive peaks with the short peak interval indicate as the SPACE signal (0). Assuming that the input data is applied in sequence as 101010 . . . as shown in FIG. 32B, each bit occupies a period of 833.33 $\mu$s as shown in FIG. 32E. However, the FSK data in the actual waveform is the CPFSK modulated signal, so that the bit period of the signal may not be exactly 833.33 $\mu$s.

When the FSK data is generated through the above steps, an FSK clock signal FSK_CLK is generated from the FSK data. When data signal FSK_DATA is generated in step 960, edge detector 1302 detects the rising and falling edges of data signal FSK_DATA (step 972), and FSK clock signal FSK_CLK is generated according to the detected edge information. Then, it is determined whether the edge following the edge detected in the step 972 is present within a fourth interval (step 973). Preferably, the fourth interval is set to 833.33 μs when the FSK data is transmitted at a rate of 1200 baud. That is, FSK clock generator 1306 detects the time that passes from the edge detection in order to generate a latch clock signal FSK_CLK for accurate latching of the FSK data. If the edge is detected in the fourth interval in step 973, which means the input of the MARK or SPACE signal, step 974 determines whether a fifth interval passes from the first edge until the second edge is detected. Preferably, the fifth interval is set to 416.67 μs when the FSK data is transmitted at a rate of 1200 baud. If the fifth interval of 416.67 μs goes by, step 976 asserts FSK clock signal FSK_CLK once.

However, if it is determined in the step 973 that there is no edge detection in the fourth interval of 833.33 μs, step 975 asserts FSK clock signal FSK_CLK once after the interval of 833.33 μs passes since the detected first edge of data signal FSK_DATA. That is, when the FSK data remain at a constant level without edge detection, the clock signal is continuously generated at a rate of 1200 baud. On the other hand, when the edge detection signal EDGE_DET of the FSK data is generated within 416.67 μs, the margin generator 1304 regards the such edge detection as a malfunction or error, so the FSK clock signal is not generated. That is, the FSK clock signal FSK_CLK is set such that the minimum margin of 416.67 μs from the previously detected edge is always maintained. Assuming that the input data is 101010 . . . , the FSK clock signal FSK_CLK has a cycle of approximately 833.33 μs as shown in FIG. 32F. Also, it is shown that FSK clock signal FSK_CLK is generated after the interval of 416.67 μs passes from the edge of data signal FSK_DATA of FIG. 32E.

When FSK clock signal FSK_CLK is generated from the edge of data signal FSK_DATA, data clock signal DCLK is generated from the FSK clock signal FSK_CLK (step 980). In detail, data clock generator 1308 generates clock signal DCLK for latching bits of the FSK data in response to the FSK clock signal FSK_CLK (step 982). Here, assuming that the input data consists of 10-bit data blocks, FSK clock signal FSK_CLK marks bits for data in units of 12 bits. That is, 12-bit data including a stop bit of the previous data block, a start bit of the current data block, 8 bits of data, the stop bit of the current data block, and a start bit of the following block. Data clock generator 1308 detects the actual data interval. Here, the latching may be performed at the falling edge or rising edge of the FSK clock signal FSK_CLK. The data clock generator 1308 determines whether the latch data is the actual data interval of data signal FSK_DATA (step 984).

If the latched data is the actual data interval, data clock generator 1308 generates data clock signal DCLK with the same timing as that of FSK clock signal FSK_CLK. As described above, during the actual data interval of 8 bits, data clock signal DCLK has the same timing as FSK clock signal FSK_CLK (step 986). As shown in FIG. 32E, data clock signal DCLK becomes enabled only in the interval corresponding to actual data (8 bits). In the actual data interval, the demodulated FSK data transmitted to a microprocessor in response to the data clock signal DCLK (step 990). In detail, memory 1602 of signal transmission unit 1600 stores the FSK data from signal FSK_DATA in response to data clock signal DCLK (step 992). The reason for storing the FSK data in memory 1602 is that the period of data clock signal DCLK varies according to types of the FSK data. Thus, the generated FSK data is stored in memory 1602 in response to data clock signal DCLK, and then the data stored in memory 1602 is read according to a read clock signal RCLK having a constant frequency and transmitted at a constant transmission rate. Here, the FSK data is stored in memory 1603 in predetermined data units, and preferably units of 4 bits, for an accurate synchronization during the read of data. Thus, even if the cycle of data clock signal DCLK is not constant, a clock signal RCLK having a constant frequency controls the data transmission to a microprocessor. The data stored in memory 1602 is transmitted as the caller information in response to read clock signal RCLK from timing generator 1604 (step 994) until step 996 decides the data transmission is complete. If the data transmission is complete, the overall process ends. Finish seeker 1405 determines whether the data transmission is complete. In particular, finish seeker 1405 receives the digital signal from ADC 1106 in response to FSK clock signal FSK_CLK and generates an end signal FINISH when the digital signal has a lower level than the reference level LEVELD.

Here, when the transmission start signal CDB becomes enabled at the early stage, the enabled transmission start signal CDB notifies the microprocessor of the transmission of FSK data. Thus, data clock DCLK becomes enabled while the transmission start signal CDB is enabled. Also, when data clock signal DCLK corresponding to the FSK data is generated from FSK clock signal FSK_CLK, the microprocessor (not shown) receives only the actual data from data signal FSK_DATA as identified by data clock signal DCLK.

As above, the caller information detection apparatus generates the FSK data and the data clock signal using a peak detection method. Thus, the peak detection block used in the CAS detection apparatus can be shared, and the size of the circuit is considerably reduced.

According to the present invention, the existence of the CAS can be detected through a single path by mixing a dual tone CAS signal, and can be accurately detected by discriminating the frequency and level of the mixed signal. Further, the incorrect CAS detection, caused by the voice signal, can be prevented.

Further, the AM detection unit capable of detecting the AM signal of the CAS can be digitally implemented, so that the CAS detection apparatus can be implemented in a single chip without external components, and the AM detection unit can be applied to all systems utilizing the amplitude modulation as well as the CAS detection apparatus.

Also, a demodulator for demodulating the FSK modulated caller information can be implemented by sharing the peak detector used in the CAS detection apparatus, so the caller information detection apparatus and the CAS detection apparatus can be implemented in a single chip, and the size of the circuit can be reduced.

Although the invention has been described with reference to particular embodiments, the description is only an example of the invention's application and should not be taken as a limitation. Various adaptations and combinations of features of the embodiments disclosed are within the scope of the invention as defined by the following claims.

What is claimed is:

1. A CAS (Customer premise equipment Alert Signal) detection apparatus for detecting a CAS from an input signal, comprising:
  a mixing unit that extracts and mixes two or more frequency components of the input signal to generate an amplitude modulated signal including a carrier and an envelope;
  an amplitude modulation detection unit that measures a frequency of the envelope; and
  a discriminating unit that detects whether the frequency of the envelope is in a predetermined range and discriminates whether or not the CAS is present.

2. The CAS detection apparatus of claim 1, wherein the mixing unit comprises:
  a first band-pass filter for filtering the input signal and outputting a first frequency component of the input signal;
  a second band-pass filter for filtering the input signal and outputting a second frequency component of the input signal; and
  a mixer for mixing the first and second frequency components from the first and second band-pass filters and outputting a mixed result as the amplitude modulated signal.

3. A CAS (Customer premise equipment Alert Signal) detection apparatus for detecting a CAS from an input signal, comprising:
  a mixing unit that extracts and mixes two or more frequency components of the input signal to generate an amplitude modulated signal including a carrier and an envelope;
  an amplitude modulation detection unit that measures a frequency of the envelop;
  a signal detection unit that compares the frequency of the envelope to the predetermined range and compares a voltage level of the envelope to a reference voltage level; and
  a CAS discriminating unit that receives results of frequency and voltage level comparisons from the signal detection unit and from the results determines whether the CAS is present.

4. The CAS detection apparatus of claim 3, wherein the mixing unit comprises:
  a first band-pass filter for filtering the input signal and outputting a first frequency component;
  a second band-pass filter for filtering the input signal and outputting a second frequency component; and
  a mixer for mixing the first and second frequency components from the first and second band-pass filters and outputting a mixed result as the amplitude modulated signal.

5. The CAS detection apparatus of claim 3, wherein the amplitude modulation detection unit comprises:
  an analog-to-digital converter (ADC) for converting the amplitude modulated signal into an N-bit (where N>0) digital signal in response to an enable signal;
  a first shifting portion having a plurality of first latches that are serially connected for shifting a series of data samples applied to the first latches in response to a clock signal;
  a peak detection portion for comparing samples output from the first latches and asserting a peak detection signal in response to comparison results;
  a second shifting portion having a plurality of second latches serially connected for shifting a series of peak samples applied to each second latch in response to a clock signal applied when the peak detection portion asserts the peak detection signal, and
  a maximum/minimum level detection portion for comparing the peak samples from the second latches and outputting a maximum/minimum level detection signal in response to comparison results,
  wherein the samples applied to a first of the first latches are from the analog-to-digital converter, and the peak samples applied to a first of the second latches are from one of the first latches.

6. The CAS detection apparatus of claim 5, wherein the signal detection unit comprises:
  a frequency discriminating portion for determining whether the frequency of the envelope is in the predetermined range; and
  a level discriminating portion for generating the reference voltage level and comparing the reference voltage level to a minimum voltage level of the envelope.

7. The CAS detection apparatus of claim 6, wherein the frequency discriminating portion comprises:
  a frequency divider that receives the maximum/minimum level detection signal and outputs a count enable signal;
  a counter for counting reference clock signals in response to the count enable signal and outputting a count value; and
  a comparator for comparing the count value and first and second reference values and outputting the comparison result as a frequency discriminating result for the CAS.

8. The CAS detection apparatus of claim 6, wherein the level discriminating portion comprises:
  a level decoder for decoding a signal corresponding to a maximum level of the envelope and generating reference data; and
  a level comparator for comparing the reference data to a minimum level of the envelope output from the amplitude modulation detection unit, and outputting the comparison result as a discriminated level for the CAS.

9. The CAS detection apparatus of claim 3, further comprising a signal prediction unit for detecting a level and an occurrence period of the carrier and outputting a prediction result to the signal detection unit to predict whether the CAS is applied.

10. A method for detecting a CAS (Customer premise equipment Alert Signal) from an input signal, the method comprising:
  filtering the input signal to extract two or more frequency components;
  mixing filtering results to generate an amplitude modulated signal;
  measuring a frequency and a level of an envelope of the amplitude modulated signal; and
  determining whether the frequency and the level of the envelope indicate that the CAS is present.

11. The method of claim 10, wherein measuring the envelope comprises:
  receiving samples of the amplitude modulated signal;
  comparing three consecutive samples of the amplitude modulated signal to detect a peak of the carrier;
  repeating the comparisons to detect a series of peaks of the carrier; and
  comparing three consecutive peaks of the carrier to detect a peak of the envelope.

12. The method of claim 10, wherein determining whether the frequency and the voltage level of the envelope indicate that the CAS is present comprises:
  determining whether a frequency of peaks in the envelope is in a predetermined range;
  determining that the CAS is not present if the frequency of the envelope peak is out of the predetermined range;
  determining whether a minimum level of the envelope peaks is smaller than a reference level if the frequency of the envelope peaks is in the predetermined range;
  determining that the CAS is present if the minimum level of envelope peak is smaller than the reference level; and determining that the CAS is not present if that the minimum level of envelope peak is not smaller than the reference level.

13. A CAS (Customer premise equipment Alert Signal) detection apparatus for detecting a CAS from an input signal, comprising:

a mixing unit for filtering the input signal into two or more frequency components and mixing filtering results to generate an amplitude modulated signal including a carrier and an envelope;

a signal conversion unit for automatically controlling a gain of an output signal from the mixing unit so that the output signal is in a first range between a first threshold voltage and a second threshold voltage;

an amplitude modulation detection unit for detecting the envelope in the output signal of the signal conversion unit;

a signal detection unit for determining whether a frequency of the envelope is in a second range corresponding to the CAS and for detecting a maximum/minimum level difference of the envelope to determine whether the level of the envelope corresponds to the CAS; and a CAS discrimination unit coupled to the signal detection unit to determine whether the CAS is present.

14. The CAS detection apparatus of claim 13, wherein the signal conversion unit comprises:

an amplifying portion for amplifying the amplitude modulated signal in response to a gain control signal and outputting an amplification result as the output signal;

an analog-to-digital converter for converting the output signal into a digital signal and outputting the digital signal to the amplitude modulation detection unit; and a gain control portion for comparing a value of the digital signal to the first threshold voltage and the second threshold voltage to generate the gain control signal such that the voltage of the output signal is in the first range.

15. The CAS detection apparatus of claim 14, wherein the gain control portion comprises:

a first comparator for comparing the digital signal from the analog-to-digital converter to the first threshold voltage to generate a gain decrease signal in response to comparison results;

a second comparator for comparing the digital signal from the analog-to-digital converter to the second threshold voltage, and outputting a result signal;

a timing window generator for detecting the result signal from the second comparison unit during a predetermined period greater than a period of the carrier to generate a gain increase signal in response to the result signal indicating that for the predetermined period, the digital signal represented voltages less than the second threshold voltage; and a shift register for outputting a register value as the gain control signal and shifting the register value in response to the gain increase signal or the gain decrease signal such that the output signal to the analog-to-digital converter increases or decreases.

16. The CAS detection apparatus of claim 13, wherein the amplitude modulation detection unit comprises:

a carrier peak detector for shifting digital samples applied in sequence from the signal conversion unit in response to a first clock signal and comparing digital samples to detect peaks of the carrier; and an envelope level detector for shifting peak samples corresponding to peaks of the carrier in response to a second clock signal and comparing the peak samples to detect a maximum/minimum level of the envelope.

17. The CAS detection apparatus of claim 13, further comprising a signal prediction unit for detecting a level of the amplitude modulated signal and an occurrence period of peaks in the carrier to predict whether the CAS is present, and outputting the prediction result to the signal detection unit.

18. The CAS detection apparatus of claim 17, wherein the signal prediction unit comprises:

a level detector for detecting whether the level of the amplitude modulated signal is greater than or equal to a predetermined level; and a CAS seeker for detecting whether the peaks of the carrier appear for a predetermined period in response to the level detector detecting the amplitude modulated signal in greater than or equal to the predetermined level.

19. The CAS detection apparatus of claim 13, wherein the signal detection unit comprises:

a frequency discriminator for determining whether the frequency of the envelope corresponds to the CAS; and a level discriminator for detecting the maximum/minimum level difference of the envelope to discriminate the level of the CAS in response to the detection result.

20. The CAS detection apparatus of claim 19, wherein the frequency discriminator comprises:

a clock generator for frequency dividing a maximum level detection result of the envelope to generate a first clock signal, the clock generator further generating a second clock signal;

an average comparator for counting the second clock signal in a plurality of intervals during which the first clock signal is enabled, each interval corresponding to a period of the envelope, wherein the average comparator calculate an average count value per interval and determines whether the average count is in a predetermined range matching the period of the envelope of the CAS; and an overflow comparator for counting the second clock signal when a count during any of the intervals is out of a predetermined range, the overflow comparator detecting an overflow beyond counts corresponding to periods of the envelope and discriminating the frequency of the CAS in response to the detection result.

21. The CAS detection apparatus of claim 19, wherein the level discriminator counts peaks that are lower than a reference level corresponding to a maximum level of the envelope and determines that the CAS is present if the count result is larger than or equal to a predetermined value.

22. A method for detecting a CAS (Customer premise equipment Alert Signal) from an input signal, comprising:

(a) filtering the input signal and mixing filtering results to generate an amplitude modulated signal;

(b) measuring an envelope and a carrier of the amplitude modulated signal;

(c) predicting that the CAS is present if peaks in the carrier remain higher than a predetermined level for a predetermined period; and (d) if it is predicted that the CAS is present, determining that the CAS is present if a frequency and a voltage level of the envelope indicate that the CAS is present.

23. The method of claim 22, wherein measuring the envelope and the carrier comprise:
controlling gain to keep the amplitude modulated signal in a predetermined voltage range;
comparing three samples of the amplitude modulated signal to detect peaks of the carrier; and
comparing three consecutive peaks of the carrier to detect a peak of the envelope.

24. The method of claim 22, wherein (d) determining that the CAS is present comprises:
(d1) determining an average of a period between the envelope peaks;
(d2) accumulating an overflow for periods between envelope peaks, the overflow being in excess of a period expected for the CAS;
(d3) determining whether the average is between a first reference value and a second reference value that correspond to the CAS;
(d4) determining that the CAS is not present if it is determined in step (d3) that the average is not between the first reference value and the second reference value;
(d5) determining whether the overflow is less than or equal to a third reference value if it is determined in step (d3) that the average is between the first reference value and the second reference value;
(d6) determining that the CAS is not present if it is determined in step (d5) that the overflow is greater than the third reference value;
(d7) determining whether the maximum/minimum peak level difference of the envelope is larger than or equal to a fourth reference value if it is determined in step (d5) that the overflow is less than or equal to the third reference value; and
(d8) determining that the CAS is present if it is determined in step (d7) that the maximum/minimum peak level difference of the envelope is larger than or equal to the fourth reference value.

25. A CAS (Customer premise equipment Alert Signal) detection apparatus for detecting a CAS from an input signal, comprising:
a mixing unit for filtering the input signal into two or more frequency components, and mixing filtering results to generate an amplitude modulated signal including a carrier and an envelope;
a signal conversion unit for automatically controlling a gain of an output signal of the mixing unit so that the output signal is in a first range between a first threshold voltage and a second threshold voltage, and converting the gain adjusted signal into a digital signal;
an amplitude modulation detection unit for detecting the peaks of the carrier and envelope from an output signal of the signal conversion unit;
a signal prediction unit for detecting a level of the amplitude modulated signal and occurrence periods and the number of peaks in the carrier and envelope to predict the presence of the CAS in the input signal, and outputting the prediction result as a CAS prediction signal;
a signal detection unit for determining whether a frequency of the envelope detected by the amplitude modulation detection unit is in a second range corresponding to the CAS, and for detecting a maximum/minimum level difference of the envelope to determine whether the maximum/minimum level corresponding to the CAS; and
a CAS discrimination unit for determining whether the detection results from the signal detection unit maintains for a predetermined period to determine whether the CAS is present.

26. The CAS detection apparatus of claim 25, wherein the signal prediction unit comprises:
a level detector for detecting whether the level of the amplitude modulated signal is greater than or equal to a predetermined level, and outputting the detection result as a level detection signal; and
a CAS seeker for detecting whether the maximum peaks of the carrier and envelope appear for a predetermined period in response to the level detector detecting the amplitude modulated in greater than or equal to the predetermined level,
wherein the CAS seeker comprises:
a CAS interval prediction portion for detecting whether the level detection signal remains for a predetermined period;
a first condition set portion for removing error peaks due to noises from the peaks of the carrier and counting real peaks to set a first condition for CAS prediction;
a second condition set portion for removing error peaks due to noises from the peaks of the envelope and counting real peaks to set a second condition for CAS detection; and
a CAS prediction signal generation portion for generating a CAS prediction signal in respond to the result of interval prediction and the results from the first and second condition set portions.

27. The CAS detection apparatus of claim 25, wherein the signal detection unit comprises:
a reset signal generating portion for generating a reset signal in response to the CAS prediction signal;
a frequency discriminating portion which resets in response to the reset signal, for determining relative and absolute frequencies and tolerance due to noises, from the peaks of the envelope from which the error peaks have been removed, to discriminate a frequency of the CAS signal; and
a level discriminating portion for detecting a maximum/minimum level difference of the envelope, to discriminate a level of the CAS signal in response to the detection result.

28. The CAS detection apparatus of claim 25, wherein the frequency discriminating portion comprises:
a clock generator for dividing the detection result on the maximum peak of the envelope in a predetermined divisor to generate a first clock signal, and dividing an external clock signal into M (M is greater than 1) to generate a second clock signal;
an average comparator for counting the second clock signal in a plurality of intervals during which the first clock signal is enabled, each interval corresponding to a period of the envelope, wherein the average comparator calculates an average count per intervals, and determines whether the average count is in a predetermined range matching the period of the envelope of the CAS;
a real-time counter for counting the second clock signal in an interval in which the first clock signal is enabled, for a predetermined period required for detecting the CAS signal from a point in time where the CAS prediction signal is enabled, and determining whether a total count value is in a second range; and a peak comparator for counting the number of real peaks of the envelope, from which the error peaks have been removed, for a predetermined period, and determining whether the count value is in a third range.

29. The CAS detection apparatus of claim 25, wherein the CAS discrimination unit comprises:

a logic gate for performing a logic operation on the outputs from the signal detection unit and generating a preliminary CAS detection signal in response to the operation result; and a duration detector for determining whether the duration of the preliminary CAS detection signal is less than a predetermined duration, and generating a real CAS detection signal.

30. A method for detecting a CAS (Customer premise equipment Alert Signal) from an input signal, the method comprising:

(a) filtering the input signal into two or more frequency components and mixing filtering results to generate an amplitude modulated signal;

(b) measuring a carrier and an envelope of the amplitude modulated signal;

(c) removing error peaks from peaks of the carrier and envelope, and predicting that the CAS is present if peaks in the carrier and envelope remain higher than a predetermined level for a predetermined period;

(d) if it is predicted that the CAS is present, determining whether a frequency and a voltage level of the envelope is in a predetermined range using the peaks of envelope from which the error peaks have been removed; and (e) if it is determined that the frequency and the voltage level of the envelop is in the predetermined level, detecting a duration of the CAS to determine whether the CAS is present.

31. The method of claim 30, wherein measuring the carrier and the envelope comprises:

controlling gain to keep the amplitude modulate signal in a predetermined voltage range;

comparing three samples of the amplitude modulated signal to detect peaks of the carrier; and comparing three consecutive peaks of the carrier to detect a peak of the envelope.

32. The method of claim 30, wherein step (c) comprises:

(c1) setting peak detection margins for the carrier and the envelope, and removing the peaks which do not belong to the peak detection margins, as error peaks;

(c2) determining whether the peaks of the carrier and the envelope, having a level higher than a predetermined voltage, are continuously applied for a predetermined period; and (c3) if it is determined that the peaks of the carrier and the envelope are continuously applied for the predetermined period, predicting that the CAS is present.

33. The method of claim 30, wherein step (d) comprises:

(d1) calculating a count average of the peaks of the envelope, a real-time count value, the number of peaks of the envelope, and a maximum/minimum peak level difference of the envelope, using the peaks of envelope from which the error peaks have been removed;

(d2) determining whether a first period passes;

(d3) if the first period passes, determining whether the count average of the peaks of the envelope, the real-time count value and the number of peaks of the envelope are in predetermined ranges, respectively; and (d4) if the count average of the peaks of the envelope, the real-time count value and the number of peaks of the envelope are in the predetermined ranges, respectively, determining whether the maximum/minimum peak level difference of the envelope in a predetermined range.

34. The method of claim 30, wherein step (e) comprises:

generating a preliminary CAS detection signal if all of the conditions of step (d) are satisfied; and determining whether a duration of the preliminary CAS detection signal is shorter than a second period, and if the duration of the preliminary CAS detection signal is shorter than the second period, determining that the CAS is present.

35. A caller information detection apparatus comprising:

a signal conversion unit for filtering an input signal into predetermined frequency components and converting the filtering results into a digital signal, and automatically controlling a gain of the digital signal so that the digital signal is in a first range between a first threshold voltage and a second threshold voltage;

a peak detector for detecting peaks of the digital signal and outputting maximum/minimum peak detection signals upon detecting the maximums and minimums of the digital signal; and a frequency shift keying (FSK) demodulation unit that determines a number of and an interval between the maximums and minimums of the digitals signal to discriminate between a MARK signal and a SPACE signal and generate an FSK data and a data clock signal, the FSK demodulation unit detecting an edge in the FSK data and generating the data clock signal for transfer of FSK data according to the detected edge.

36. The caller information detection apparatus of claim 35, wherein the FSK demodulation unit comprises:

an FSK data generator for comparing the maximum and minimum peaks of the digital signal to a reference frequency and generating the FSK data in response to comparison results; and a clock generation portion for detecting the edge of the FSK data, generating the data clock signal for transferring the FSK data according to the detected edge information, and outputting the FSK data in response to the data clock signal.

37. The caller information detection apparatus of claim 36, wherein the clock generation portion comprises:

an edge detector for detecting a rising/falling edge of the FSK data and outputting an edge detection signal;

a margin generator for generating a margin signal according to a delay from the edge detection signal;

an FSK clock generator for generating an FSK clock signal in response to the FSK data, the edge detection signal, and the margin signal; and a data clock generator for generating a transmission start signal indicating a start of the FSK data transfer, and generating the data clock signal in response to the FSK clock signal, the data clock signal being enabled only in actual data intervals of the FSK data.

38. The caller information detection apparatus of claim 35, wherein the FSK demodulation unit further comprises a finish seeker for generating a finish signal for detecting an end of the FSK data.

39. The caller information detection apparatus of claim 35, further comprising a signal transfer unit including a memory for storing FSK data in response to the data clock signal, the signal transfer unit outputting as the caller information the FSK data stored in the memory in response to a read clock signal having a predetermined frequency.

40. A method for detecting caller information, comprising:
   (a) filtering an input signal and converting filtering results into a digital signal;
   (b) detecting extremes of the digital signal to detect frequencies corresponding to a MARK signal and a SPACE signal indicating bit values in FSK data;
   (c) detecting the edge of the FSK data to generate an FSK clock signal;
   (d) generating a data clock signal in response to the FSK clock signal and the FSK data, the data clock signal being enabled in only an actual data interval of the FSK data; and
   (e) transferring the FSK data in response to the data clock signal.

41. The method of claim 40, wherein step (b) comprises:
   (b1) determining whether a transmission start signal becomes enabled;
   (b2) determining whether an Nth (where N>0) peak is detected from the filtered signal if the transmission start signal becomes enabled;
   (b3) determining whether the (N+1)th peak is present in a first interval if the Nth peak is detected in step (b2), and setting the FSK data to a first level if the (N+1)th peak is not present in the first interval;
   (b4) determining whether the (N+1)th peak is present in a second interval if the (N+1)th peak is present in the first interval;
   (b5) setting the FSK data to a second level if it is determined in step (b4) that the (N+1)th peak is not present in the second interval;
   (b6) determining whether the (N+2)th peak is present in a third interval if it is determined in step (b4) that the (N+1)th peak is present in the second interval;
   (b7) setting the FSK data to the first level if it is determined in step (b6) that the (N+2)th peak is present in the third interval; and
   (b8) setting the FSK data to the second level if it is determined in step (b6) that the (N+2)th peak is not present in the third interval.

42. The method of claim 40, wherein step (c) comprises:
   (c1) detecting the edge of the FSK data generated in step (b);
   (c2) determining whether the second edge detected after the detection of step (c1) is in a fourth interval;
   (c3) generating the FSK clock signal once after the fourth interval if the second edge is not present in the fourth interval, and returning to step (c2);
   (c4) determining whether the detection of the second edge passes by a fifth interval after the first edge detection of step (c1) if the second edge is present in the fourth interval; and
   (c5) generating the FSK clock signal once if it is determined in step (c4) that the second edge is detected after the fifth interval goes by.

43. The method of claim 40, wherein step (d) comprises:
   (d1) latching the FSK data in response to the edge of the FSK clock signal;
   (d2) detecting only actual data bits from the latched FSK data; and
   (d3) generating the data clock signal if the actual data bits are detected in step (d2), the data clock signal being enabled only in the interval of the actual data bit and having the same timing as the FSK clock signal.

44. The method of claim 40, wherein step (e) comprises:
   (e1) storing the FSK data by a K (where K>0) bit in a memory in response to the data clock signal; and
   (e2) transferring as the caller information the FSK data stored in the memory in response to a read clock signal.

* * * * *